(12) United States Patent
Stauth et al.

(10) Patent No.: US 8,384,245 B2
(45) Date of Patent: Feb. 26, 2013

(54) METHODS AND APPARATUSES FOR PHOTOVOLTAIC POWER MANAGEMENT

(75) Inventors: Jason T. Stauth, San Francisco, CA (US); Michael D. Seeman, Mountain View, CA (US); Sonesh Surana, Berkeley, CA (US)

(73) Assignee: Solar Semiconductor, Inc., Sunnyvale, CA (US)

( * ) Notice: Subject to any disclaimer, the term of this patent is extended or adjusted under 35 U.S.C. 154(b) by 303 days.

(21) Appl. No.: 12/778,819

(22) Filed: May 12, 2010

(65) Prior Publication Data

US 2010/0289338 A1 Nov. 18, 2010

Related U.S. Application Data

(63) Continuation-in-part of application No. 12/704,300, filed on Feb. 11, 2010.

(60) Provisional application No. 61/216,101, filed on May 13, 2009.

(51) Int. Cl.
*H02J 1/00* (2006.01)
*H02J 3/00* (2006.01)
(52) U.S. Cl. ...................................................... 307/77
(58) Field of Classification Search .................. 307/77, 307/85, 86; 136/244
See application file for complete search history.

(56) References Cited

U.S. PATENT DOCUMENTS

| | | | |
|---|---|---|---|
| 7,919,953 B2 * | 4/2011 | Porter et al. | 323/222 |
| 2008/0097655 A1 | 4/2008 | Hadar | |
| 2008/0143188 A1 | 6/2008 | Adest | |
| 2008/0150366 A1 | 6/2008 | Adest | |
| 2008/0169883 A1 * | 7/2008 | Hsu et al. | 333/185 |
| 2008/0210286 A1 * | 9/2008 | Ball | 136/244 |
| 2009/0120485 A1 | 5/2009 | Kikinis | |
| 2009/0160258 A1 | 6/2009 | Allen | |
| 2011/0062784 A1 * | 3/2011 | Wolfs | 307/77 |

OTHER PUBLICATIONS

G.R. Walker et al., Cascaded DC-DC Converter Connection of Photovoltaic Modules, IEEE Transactions on Power Electronics, vol. 19, No. 4, Jul. 2004, pp. 1130-1139.
S.B. Kjaer et al., A Review of Single-Phase Grid-Connected Inverters for Photovoltaic Modules, IEEE Transactions on Industry Applications, vol. 41, No. 5, Sep.-Oct. 2005, pp. 1292-1306.
L. Linares et al., Improved Energy Capture in Series String Photovoltaics via Smart Distributed Power Electronics, Applied Power Electronics Conference and Exposition, 2009. APEC 2009. Twenty-Fourth Annual IEEE Feb. 15-19, 2009, pp. 904-910.
T. Shimizu et al., Generation Control Circuit for Photovoltaic Modules, IEEE Transactions on Power Electronics, vol. 16, No. 3, May 2001, pp. 293-300.
C. Pascual et al., Switched Capacitor System for Automatic Series Battery Equalization, Applied Power Electronics Conference and Exposition, Feb. 1997. APEC '97 Conference Proceedings 1997, pp. 848-854.
G.R. Walker et al., Cascaded DC-DC Converter Connection of Photovoltaic Modules, Power Electronics Specialists Conference, 2002, IEEE 33$^{rd}$ Annual, vol. 1, Jun. 23-27, 2002, pp. 24-29.

* cited by examiner

*Primary Examiner* — Carlos Amaya
(74) *Attorney, Agent, or Firm* — Crowell & Moring LLP

(57) ABSTRACT

Methods and apparatuses for equalizing voltages across a plurality of photovoltaic units connected in series are provided. The apparatus may include a plurality of energy storage devices. In a first configuration, each of the energy storage devices is configured to be connected in parallel with one of a first set of the photovoltaic units, and a voltage across a first one of the energy storage devices has a first polarity. In a second configuration, each of the energy storage devices is configured to be connected in parallel with one of a second set of the photovoltaic units, and the voltage across the first one of the energy storage devices has a second polarity that is different from the first polarity. The apparatus may also include a plurality of switches configured to switch between the first configuration and the second configuration, to equalize the voltages across the photovoltaic units.

36 Claims, 45 Drawing Sheets

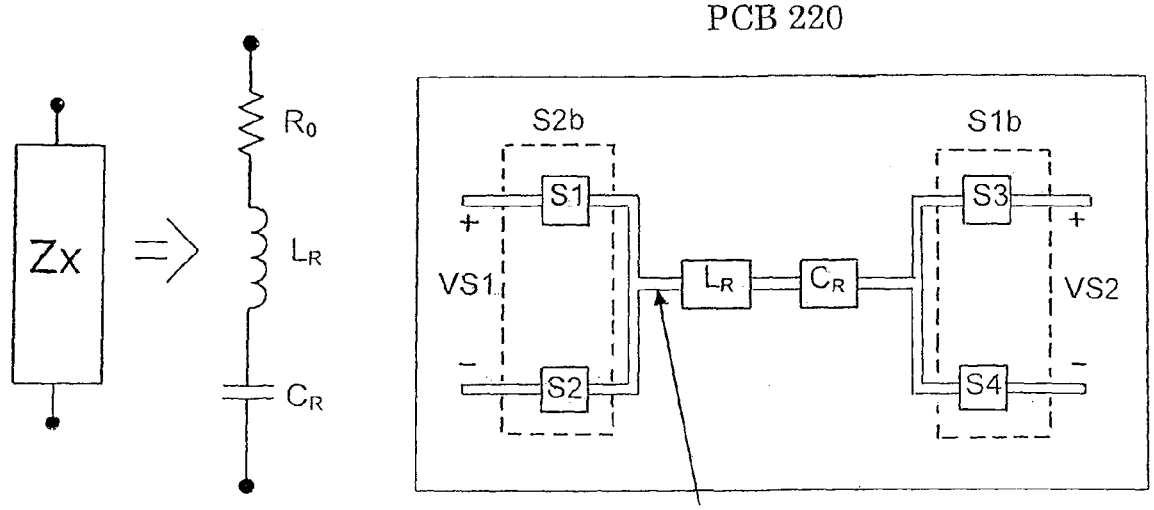
FIG. 13A
FIG. 13B
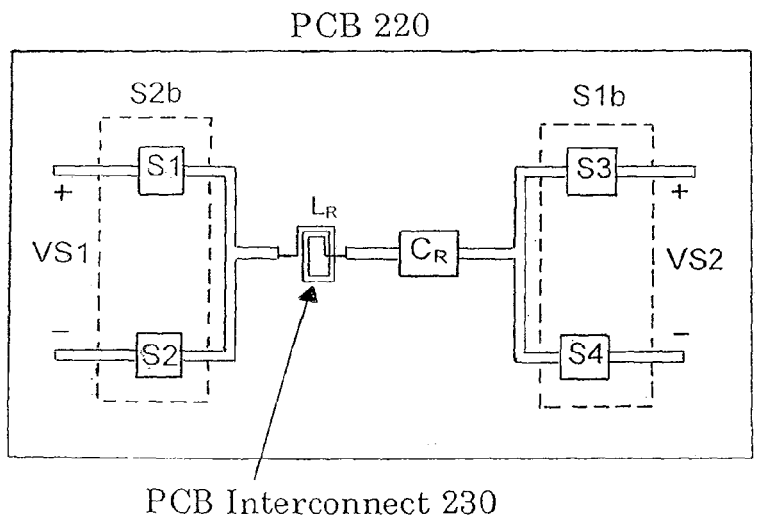
FIG. 13C
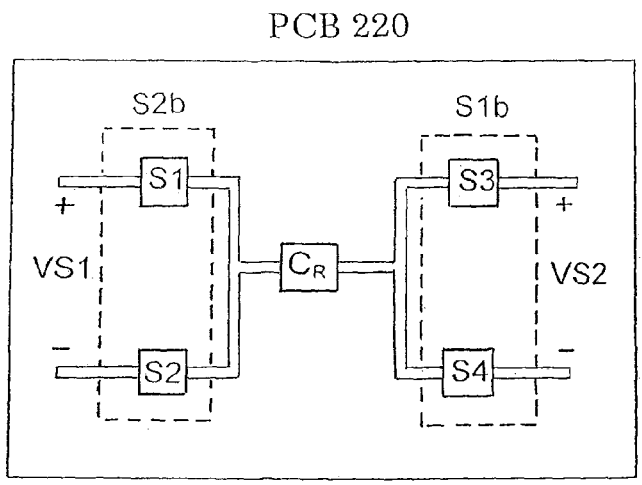
FIG. 13D

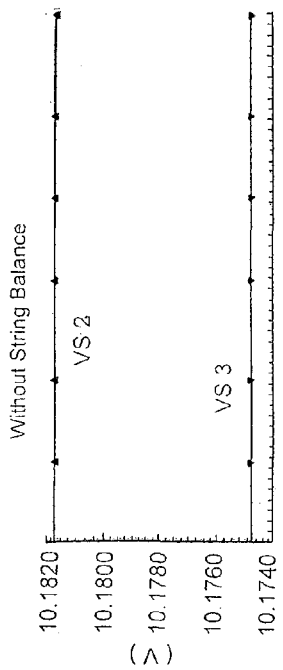
FIG. 23B
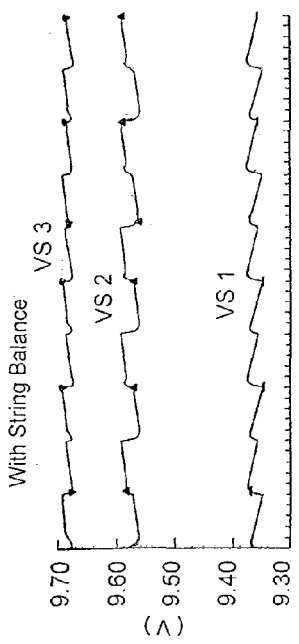
FIG. 23A
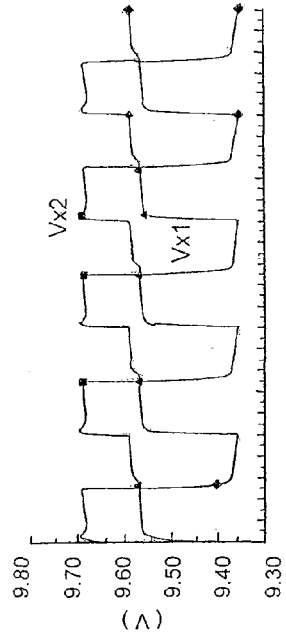
FIG. 23C
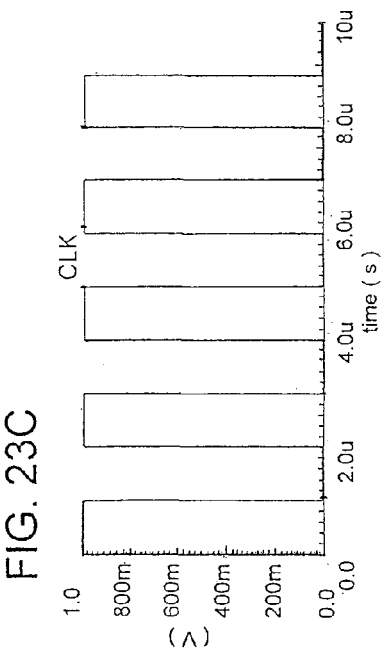
FIG. 23D
FIG. 23E

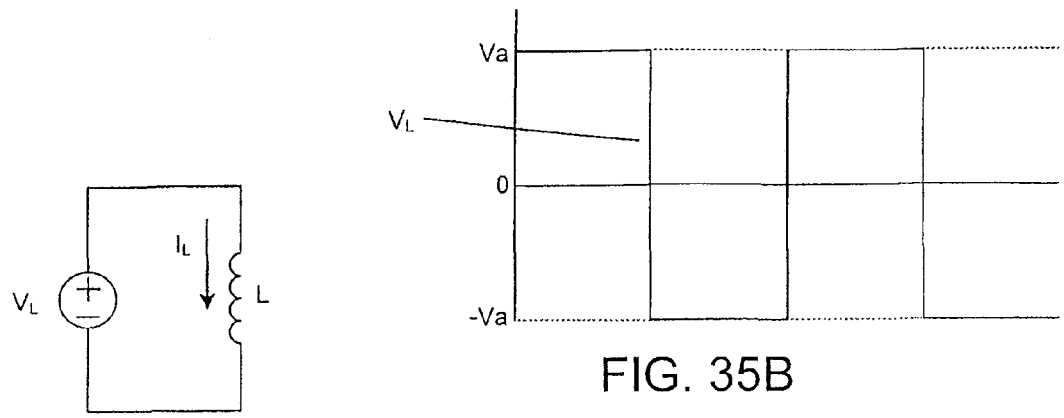
FIG. 35A
FIG. 35B
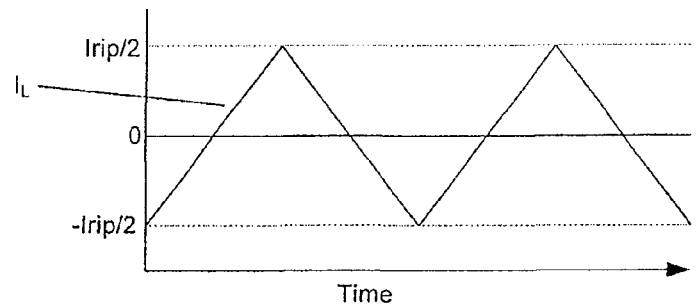
FIG. 35C
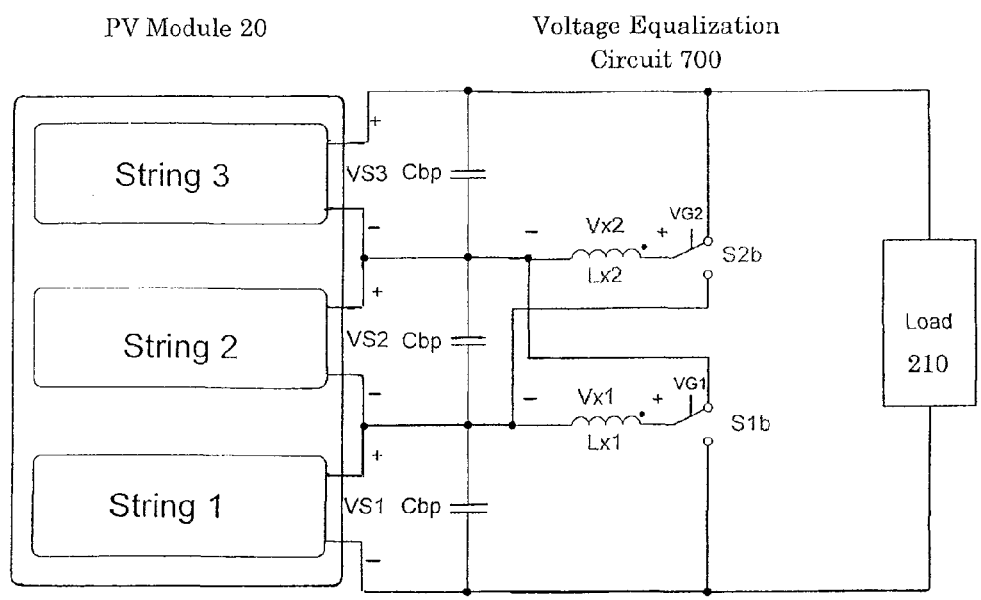
FIG. 36

METHODS AND APPARATUSES FOR PHOTOVOLTAIC POWER MANAGEMENT

CROSS-REFERENCE TO RELATED APPLICATIONS

This application is a continuation-in-part application of U.S. patent application Ser. No. 12/704,300, filed on Feb. 11, 2010, which claims priority under 35 U.S.C. §119 to U.S. Provisional Patent Application No. 61/216,101, filed on May 13, 2009. The entire contents of the previous applications are hereby incorporated by reference in their entireties.

BACKGROUND OF THE INVENTION

The present invention relates to methods and apparatuses for power management in photovoltaic (PV) installations. FIG. 1 is a high-level circuit diagram of a typical related-art PV installation 10. As shown in FIG. 1, the PV installation 10 includes a plurality of PV modules 20 connected in series and in parallel. The PV modules 20 in each column are connected in series, and the columns of PV modules 20 are connected in parallel to form the PV installation 10. For example, a column may include approximately 20 PV modules 20, and the PV installation 10 may include approximately 250 columns. As shown in FIG. 1, typical PV installations use a single centralized inverter 30 to convert the DC output of the PV installation 10 to AC power to be provided to the grid 40. A large-scale grid-connected PV installation 10 may generate anywhere between 500 W and 5 kW for residential systems to over 1 MW for PV power plant applications.

For PV power plant applications, the input DC voltage of the centralized inverter 30 is typically around 500 V, and the output AC voltage may be on the order of 120 V up to 100 kV. The centralized inverter 30 shapes the AC output voltage or current to obtain a clean 60 Hz sinusoidal waveform with strictly regulated noise and distortion limits. The centralized inverter 30 also manages the DC voltage across the PV installation 10. There is typically an optimum DC voltage for the PV installation 10 known as the maximum power voltage (MPV). This is the DC voltage that coincides with the maximum power point (MPP) of the PV installation 10, which is the operating point where the PV installation 10 produces the maximum power. The MPV also coincides with a maximum power current (MPC), which is the current that coincides with the MPP. The centralized inverter 30 can typically regulate the power flowing out of the PV installation 10 to drive the PV installation 10 to the MPP with a maximum power point tracking (MPPT) algorithm.

With a single centralized inverter 30 managing the entire PV installation 10, all of the columns of PV modules 20 within the PV installation 10 operate with the same voltage, because they are connected in parallel. This can be a problem if the MPVs of the PV modules 20 are different. Additionally, within the columns, each of the PV modules 20 operates with the same series current, because they are connected in series. This can be a problem if the MPCs of the PV modules 20 are different. Although each PV module 20 is designed to have the same characteristics, the MPP, MPV, and MPC of a PV module 20 can change if the PV module 20 encounters local shading, dirt, or debris. Further, there can be a factory mismatch between two PV modules 20, in which the characteristics of the two PV modules 20 are slightly different as manufactured.

The PV module 20 in the lower left-hand corner of the PV installation 10 is shown in FIG. 1 as being partially shaded. This shading causes shifts in the MPV and MPC of the shaded PV module 20 such that the PV module 20 may be forced to a sub-optimal operating point. In some cases, the PV module 20 may contribute nearly zero power, even with only small amounts of partial shading. For example, if only 20% of the incident light is blocked from reaching the PV module 20, the characteristics of the shaded PV module can change substantially relative to the un-shaded PV modules 20.

Because the PV modules 20 are connected in series, they must have the same operating current. If the shaded PV module 20 is forced to the MPC of the un-shaded PV modules but the shaded PV module 20 does not have sufficient current available to support that MPC, then the voltage of the shaded PV module 20 will collapse and the shaded PV module 20 will contribute zero power. Alternatively, if the unshaded PV modules 20 are forced to the MPC of the shaded PV module 20, the unshaded PV modules 20 will operate at a current below their optimal MPC, and contribute less than the maximum power available. In this case, many of the unshaded PV modules 20 may operate sub-optimally because of the shading of one PV module 20. In both cases, the PV installation 10 operates sub-optimally because the centralized inverter 30 regulates many PV modules in aggregate, although the individual PV modules 20 may have varied characteristics. Accordingly, an apparatus and method are needed to address the problems caused by shading of PV modules 20 in the PV installation 10.

SUMMARY OF THE INVENTION

Apparatuses and methods consistent with the present invention equalize voltages across a plurality of photovoltaic units connected in series. According to an aspect of the invention, there is provided an apparatus that includes a plurality of energy storage devices. In a first configuration, each of the energy storage devices is configured to be connected in parallel with one of a first set of the photovoltaic units, and a voltage across a first one of the energy storage devices has a first polarity. In a second configuration, each of the energy storage devices is configured to be connected in parallel with one of a second set of the photovoltaic units, and the voltage across the first one of the energy storage devices has a second polarity that is different from the first polarity. The apparatus also includes a plurality of switches configured to switch between the first configuration and the second configuration, to equalize the voltages across the photovoltaic units.

In the first configuration, a voltage across a second one of the energy storage devices may have a third polarity; and in the second configuration, the voltage across the second one of the energy storage devices may have a fourth polarity that is different from the third polarity. The first polarity may be the same as the third polarity. Alternatively, the first polarity may be different from the third polarity.

The apparatus may also include a controller configured to output a drive signal to the switches at a switching frequency to control switching of the switches. The controller may control a first percentage of time during which the energy storage devices are in the first configuration and a second percentage of time during which the energy storage devices are in the second configuration. Each of the first percentage of time and the second percentage of time may be substantially 50% to force the voltages across the strings of photovoltaic cells substantially equal. Alternatively, each of the first percentage of time and the second percentage of time may be different from 50%.

Each of the energy storage devices may have an impedance that is relatively low at a low frequency and is relatively high at the switching frequency and harmonics of the switching frequency. Each of the energy storage devices may include an inductor. Each of the energy storage devices may include an inductor that is coupled electromagnetically to another inductor to reduce AC current in the inductors. Each of the energy storage devices may have an impedance that is resonant at one or more frequencies. Each of the energy storage devices may include an inductor and a capacitor that are connected in parallel. The switching frequency or a harmonic of the switching frequency may equal a resonant frequency of at least one of the energy storage devices.

Each of the photovoltaic units may include a photovoltaic cell. Alternatively, each of the photovoltaic units may include a string of photovoltaic cells that are connected in series. Alternatively, each of the photovoltaic units may include a module that includes at least one string of photovoltaic cells that are connected in series.

The apparatus may also include a plurality of bypass energy storage devices, each of which is configured in parallel with one of the photovoltaic units. The bypass energy storage devices may be capacitors. Each of the switches may include a single-pole, double-throw switch that includes at least one MOSFET.

The apparatus may also include a power point tracking converter that identifies an aggregate maximum power point for the plurality of photovoltaic units. The voltages across the photovoltaic units may be determined based on the aggregate maximum power point. The power point tracking converter may also identify an individual maximum power point for each of the plurality of photovoltaic units, in which case the voltages across the photovoltaic units are determined based on the aggregate maximum power point and the individual maximum power points. The power point tracking converter may identify the aggregate maximum power point for the plurality of photovoltaic units and another set of photovoltaic units that is connected in parallel with the plurality of photovoltaic units.

The apparatus may also include a connecting circuit configured to provide a connection to an external apparatus. The connecting circuit may include a connecting energy storage device and a connecting switch connected to the connecting energy storage device. In the first configuration, the connecting energy storage device is configured to be connected in parallel with a photovoltaic unit of the external apparatus via the connecting switch. In the second configuration, the connecting energy storage device is configured to be connected in parallel with one of the photovoltaic units of the apparatus via the connecting switch. The connecting circuit may also include a connecting bypass energy storage device, which is configured to filter the voltage across the photovoltaic unit of the apparatus that is connected in parallel with the connecting energy storage device in the second configuration.

According to another aspect of the invention, there is provided a multi-stage apparatus for equalizing voltages across a plurality of photovoltaic modules connected in series. Each of the photovoltaic modules includes a plurality of photovoltaic units connected in series. The multi-stage apparatus includes a plurality of apparatuses, each of which includes a plurality of energy storage devices. In a first configuration, each of the energy storage devices is configured to be connected in parallel with one of a first set of the photovoltaic units, and a voltage across a first one of the energy storage devices has a first polarity. In a second configuration, each of the energy storage devices is configured to be connected in parallel with one of a second set of the photovoltaic units, and the voltage across the first one of the energy storage devices has a second polarity that is different from the first polarity. The multi-stage apparatus also includes a plurality of switches configured to switch between the first configuration and the second configuration, and a connecting circuit configured to provide a connection between the apparatus and an adjacent apparatus among the plurality of apparatuses. The connecting circuit includes a connecting energy storage device and a connecting switch connected to the connecting energy storage device. In the first configuration, the connecting energy storage device is configured to be connected in parallel with a photovoltaic unit of the adjacent apparatus via the connecting switch. In the second configuration, the connecting energy storage device is configured to be connected in parallel with one of the photovoltaic units of the apparatus via the connecting switch. The connecting circuit also includes a plurality of connectors configured to connect each of the apparatuses to an adjacent one of the apparatuses. Switching between the first configuration and the second configuration equalizes the voltages across the photovoltaic units of all of the photovoltaic modules.

According to another aspect of the invention, there is provided a method of equalizing voltages across photovoltaic units connected in series. In a first configuration, the method includes storing a first energy from the photovoltaic units in a plurality of energy storage devices, wherein each of the energy storage devices is connected in parallel with one of a first set of the photovoltaic units, and a voltage across a first one of the energy storage devices has a first polarity. In a second configuration, the method includes storing a second energy from the photovoltaic units in the plurality of energy storage devices, wherein each of the energy storage devices is connected in parallel with one of a second set of the photovoltaic units, and the voltage across the first one of the energy storage devices has a second polarity that is different from the first polarity. The method also includes switching between the first configuration and the second configuration until the voltages across the photovoltaic units are substantially equal. A frequency of the switching between the first configuration and the second configuration may equal a resonant frequency of the energy storage devices.

After the switching between the first configuration and the second configuration, the method may also include sending an energy equal to a difference between the first energy and the second energy to a plurality of bypass energy storage devices.

The method may also include identifying an aggregate maximum power point for the plurality of photovoltaic units, and determining the voltages across the photovoltaic units based on the aggregate maximum power point. The method may also include identifying an individual maximum power point for each of the plurality of photovoltaic units, in which case the voltages across the photovoltaic units are determined based on the aggregate maximum power point and the individual maximum power points. The aggregate maximum power point may be identified for the plurality of photovoltaic units and another set of photovoltaic units that is connected in parallel with the plurality of photovoltaic units.

According to another aspect of the invention, an apparatus for equalizing voltages across a plurality of photovoltaic units connected in series is provided. The apparatus includes a plurality of energy storage devices. In a first configuration, a first energy storage device is configured to be connected in parallel with a first photovoltaic unit, a second energy storage device is configured to be connected in parallel with a second photovoltaic unit, a voltage across the first energy storage device has a first polarity, and a voltage across the second energy storage device has a second polarity. In a second configuration, the first energy storage device is configured to be connected in parallel with the second photovoltaic unit, the second energy storage device is configured to be connected in parallel with a third photovoltaic unit, the voltage across the first energy storage device has a third polarity that is different from the first polarity, and the voltage across the second energy storage device has a fourth polarity that is different from the second polarity. A plurality of switches are configured to switch between the first configuration and the second configuration, to equalize the voltages across the photovoltaic units.

According to another aspect of the invention, an apparatus for equalizing voltages across a plurality of photovoltaic units connected in series is provided. The apparatus includes a plurality of energy storage devices. In a first configuration, each of the energy storage devices is configured to be connected in parallel with one of a first set of the photovoltaic units. In a second configuration, each of the energy storage devices is configured to be connected in parallel with one of a second set of the photovoltaic units. A plurality of switches are configured to switch between the first configuration and the second configuration, to equalize the voltages across the photovoltaic units. A respective current flowing through each respective energy storage device in the first configuration flows in an opposite direction from a respective current flowing through the respective energy storage device in the second configuration.

According to another aspect of the invention, an apparatus for equalizing voltages across a plurality of photovoltaic units connected in series is provided. The apparatus includes a plurality of energy storage devices. In a first configuration, each of the energy storage devices is configured to be connected in parallel with one of a first set of the photovoltaic units, and a respective current flows through each of the respective energy storage devices. In a second configuration, each of the energy storage devices is configured to be connected in parallel with one of a second set of the photovoltaic units, and a respective current flows through each of the respective energy storage devices in a direction opposite to a direction of the respective current in the first configuration. A plurality of switches are configured to switch between the first configuration and the second configuration, to equalize the voltages across the photovoltaic units.

According to another aspect of the invention, an apparatus for equalizing voltages across a plurality of photovoltaic units connected in series is provided. The apparatus includes an energy storage device. In a first configuration, the energy storage device is configured to be connected in parallel with one of the photovoltaic units, and a voltage across the energy storage device has a first polarity. In a second configuration, the energy storage device is configured to be connected in parallel with another one of the photovoltaic units, and the voltage across the energy storage device has a second polarity that is different from the first polarity. A switch is configured to switch between the first configuration and the second configuration, to equalize the voltages across the photovoltaic units.

Other objects, advantages, and novel features of the present invention will become apparent from the following detailed description of the invention when considered in conjunction with the accompanying drawings.

BRIEF DESCRIPTION OF THE DRAWINGS

FIG. 13A shows an exemplary embodiment in which each of the energy storage devices in the voltage equalization circuit shown in FIG. 9 is a resonant device that includes a series L-C-R circuit;

FIG. 13B shows an energy storage device in which the inductor and the capacitor are implemented as discrete components on a printed circuit board;

FIG. 13C shows an energy storage device in which the inductor is implemented with a printed circuit board interconnect layer;

FIG. 13D shows an energy storage device in which only the capacitor is implemented as a discrete component on a printed circuit board;

FIG. 23A shows simulated voltages across the strings of a PV module when one string is shaded and the voltage equalization circuit shown in FIG. 21 is active;

FIG. 23B shows simulated voltages across the un-shaded strings of the PV module when one string is shaded and the voltage equalization circuit shown in FIG. 21 is disabled;

FIG. 23C shows simulated voltages across the energy storage devices in the voltage equalization circuit shown in FIG. 21 when one string is shaded and the voltage equalization circuit is active;

FIG. 23D shows simulated voltages across the shaded string of the PV module when one string is shaded and the voltage equalization circuit shown in FIG. 21 is disabled;

FIG. 23E shows the clock when the voltage equalization circuit shown in FIG. 21 is active;

FIG. 35A shows a schematic diagram of the inductance, the current, and the voltage of an inductor;

FIG. 35B shows the time-domain waveform of the voltage across the inductor shown in FIG. 35A;

FIG. 35C shows the time-domain waveform of the current through the inductor shown in FIG. 35A;

FIG. 36 shows an exemplary embodiment in which the energy storage devices of the voltage equalization circuit shown in FIG. 33 are implemented as inductors;

DETAILED DESCRIPTION OF EXEMPLARY EMBODIMENTS

To address the problems discussed above, exemplary embodiments of the present invention manage the PV modules 20 with finer granularity. The power management method regulates smaller sections of the PV installation 10 to local optimum operating points, allowing the sections to operate substantially independently. The power management may occur at different levels, such as the level of the string of modules, the single module, the string of PV cells within a single module, or the single PV cell. Finer control allows sub-sections of the PV installation 10 to be shaded or mismatched without affecting the performance of the entire PV installation 10.

Figure 2A:
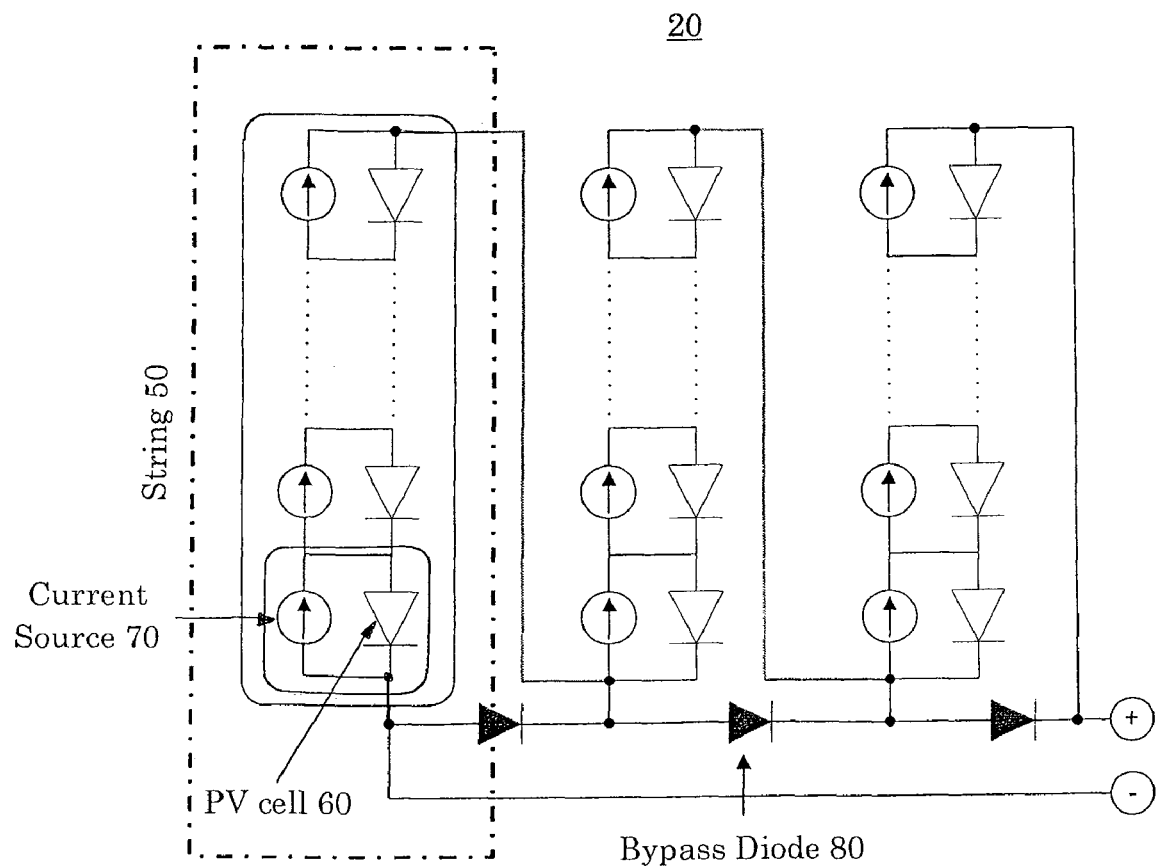
FIG. 2A shows a lumped circuit equivalent of a typical related art PV module with strings of series-connected PV cells and bypass diodes to short out strings under local shading conditions.
Figure 2B:
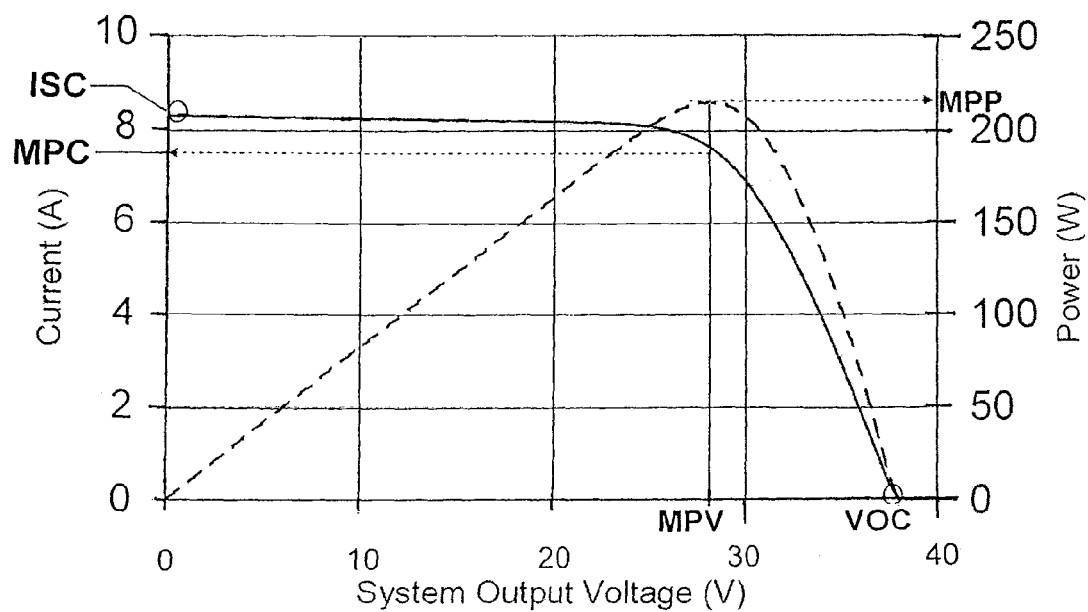
FIG. 2B is a Current-Voltage-Power curve of a PV module.

FIG. 2A shows a lumped circuit equivalent of a typical PV module 20. As shown in FIG. 2A, the PV module 20 includes strings 50 of series-connected PV cells 60. In FIG. 2A, each of the PV cells 60 is represented as a forward biased diode, and the incident photo-power is modeled as a local current source 70. FIG. 2B is a plot showing power and current as functions of voltage for a typical PV module 20. As shown in FIG. 2B, the PV module 20 has an MPP that occurs at the maximum product of voltage and current, which coincides with the product of the MPV and the MPC. Additional characteristics of the PV module 20 shown in FIG. 2B include the open circuit voltage VOC, which is the voltage across the terminals of the PV module 20 when zero current is flowing, and the short circuit current ISC, which is the current that flows out of the PV module when its output terminals are short circuited.

A PV module 20 typically has two or three strings 50 of series-connected PV cells 60. Each PV cell 60 typically provides 0.5 V to 0.9 V, so it is necessary to connect a number of PV cells 60 in series to achieve an output voltage in a range between 10 V and 50 V for the PV module 20.

As discussed above, the PV module 20 may suffer from shading. Here, shading is a general term for any effect that reduces the amount of incident photo-power reaching the PV cells 60. Such effects may result from physical shading by objects such as trees, or from debris, dust, or damage to the PV cells 60. Shading effects also result from mismatched installation of PV modules 20, such as PV modules 20 that are positioned on different sides of a roof or at different angles.

If a PV cell 60 is shaded, such as the PV cell 60 in the lower left-hand corner of FIG. 2A, the shading limits the current in the PV cell 60. The shaded PV cell 60 then limits the current available in all series-connected PV cells 60, such as the PV cells 60 within the left-most string 50 in FIG. 2A. Since many PV cells 60 may be connected in series, even small amounts of shading can significantly reduce the available power from the PV module 20.

Typically a bypass diode 80 is placed in parallel with each string 50 of PV cells 60 in the PV module 20. The bypass diode 80 provides an alternative path for current to flow if part or all of a string 50 is shaded. If a string 50 is substantially shaded, the current in the string 50 is limited, and the bypass diode 80 may turn on to short out the string 50. If the bypass diode 80 turns on, all power from the shaded string 50 is lost. Additional power is also lost in the bypass diode 80. Also, if the string 50 is bypassed, the voltage across the string 50 drops to the forward-biased diode potential.

Figure 1:
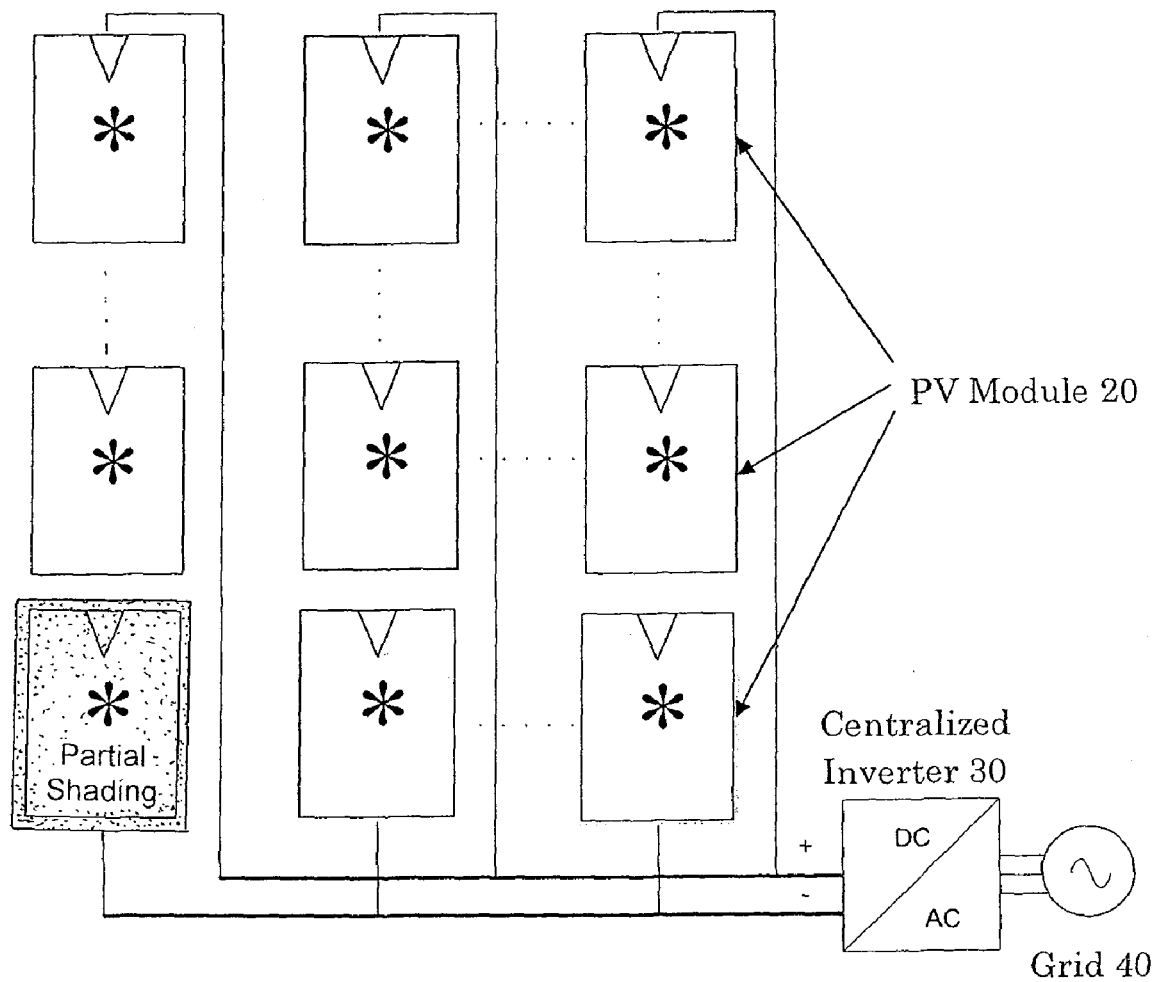
FIG. 1 is a high-level circuit diagram of a typical related art PV installation with series and parallel strings of PV modules connected to a centralized inverter.

Similarly, in a series string of PV modules 20, if one PV module 20 is shaded, such as the PV module 20 shown in the lower left-hand corner of FIG. 1, and the current in the series string of PV modules 20 is forced to the MPC, then bypass diodes 80 in the shaded PV module 20 may turn on to short out underperforming strings 50 of PV cells 60. Alternatively, the maximum current in the series string of PV modules 20 may be limited to the worst-case current in the shaded series string, significantly reducing the MPP of the series string.

Figure 2C:
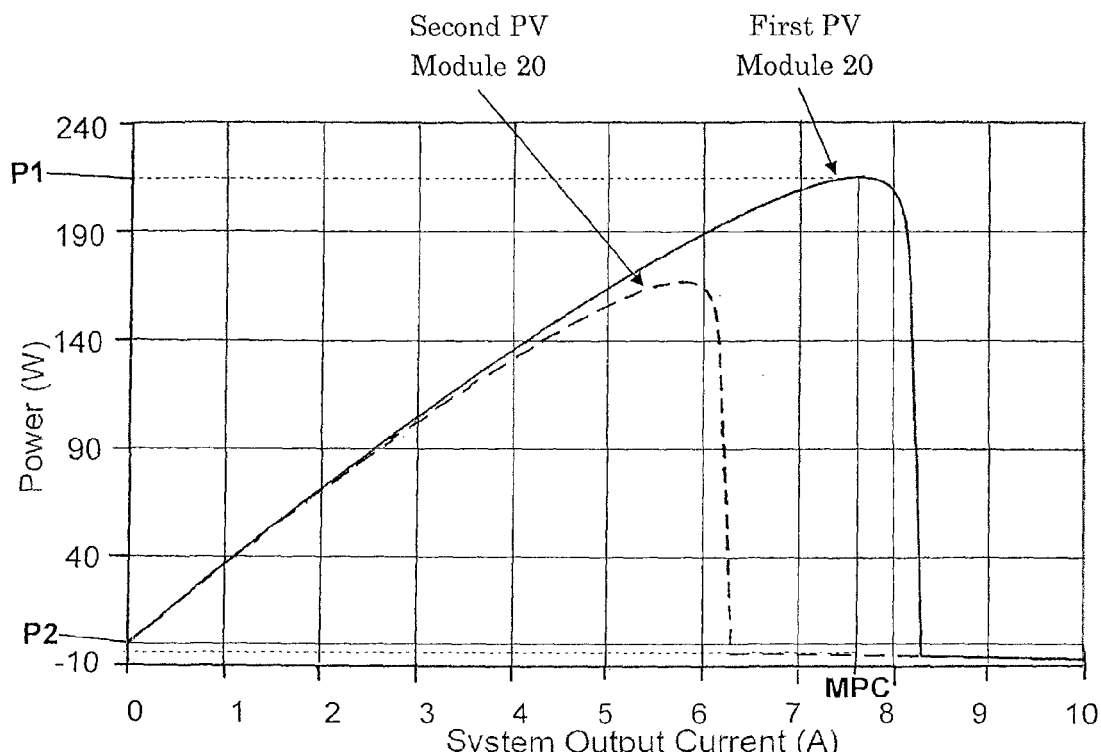
FIG. 2C shows the performance of two mismatched PV modules connected in series.

FIG. 2C is a plot of the output power as a function of the output current for two mismatched PV modules 20 that are connected in series. The PV modules 20 may be mismatched if one of the PV modules 20 is shaded as discussed above. In the example shown in FIG. 2C, the second PV module 20 is shaded. FIG. 2C could also apply to two mismatched PV cells 60 or two mismatched strings 50 of PV cells 60. As shown in FIG. 2C, if the second PV module 20 is forced to operate with the MPC of the first PV module 20, the second PV module 20 is effectively shorted out by the bypass diode 80, and provides zero or negative power. The PV module 20 can provide negative power when the bypass diode 80 is on because the bypass diode 80 will consume power. In FIG. 2C the output power of the first PV module 20 is labeled as P1, and the output power of the second PV module 20 is labeled as P2.

Figure 2D:
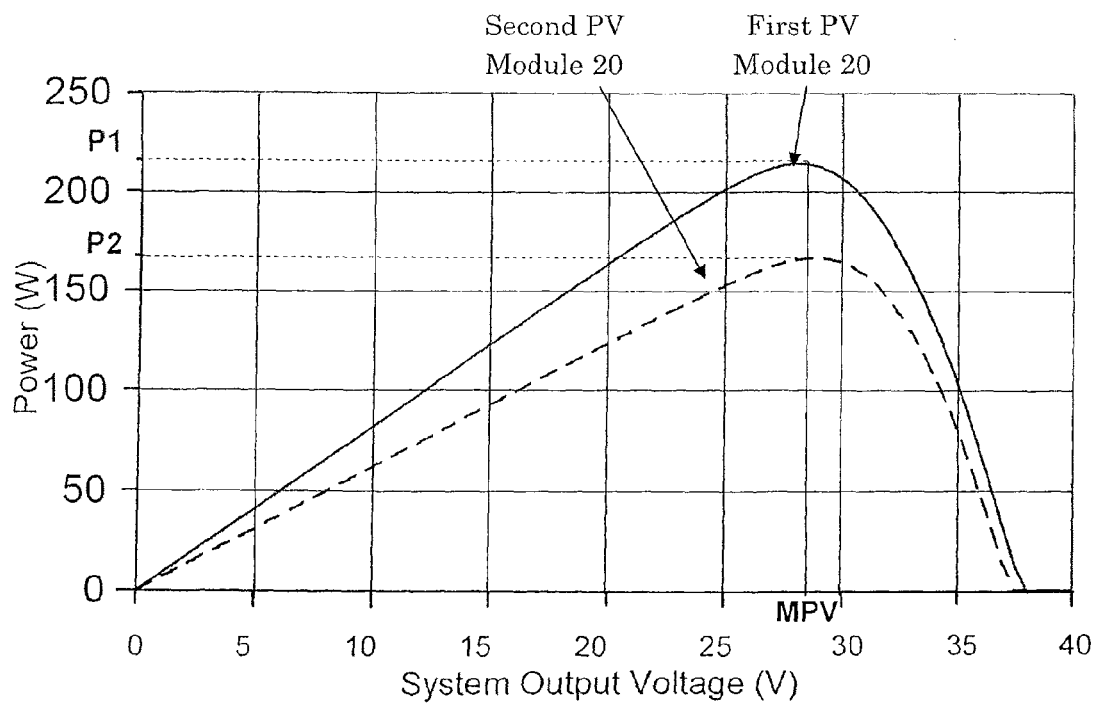
FIG. 2D shows the performance of two mismatched PV modules connected in parallel.

In contrast, if the same two mismatched PV modules 20 are connected in parallel, their MPVs are often similar enough that minimal power loss occurs relative to their MPPs. This effect is shown in FIG. 2D, which is a plot of the output power as a function of the output voltage for the first PV module 20 and the second PV module 20. Again, the output power of the first PV module 20 is labeled as P1, and the output power of the second PV module 20 is labeled as P2. Therefore, to address the problems created by localized shading, it would be advantageous to modify the PV installation 10 such that the PV modules 20 are effectively connected in parallel instead of in series.

Figure 3:
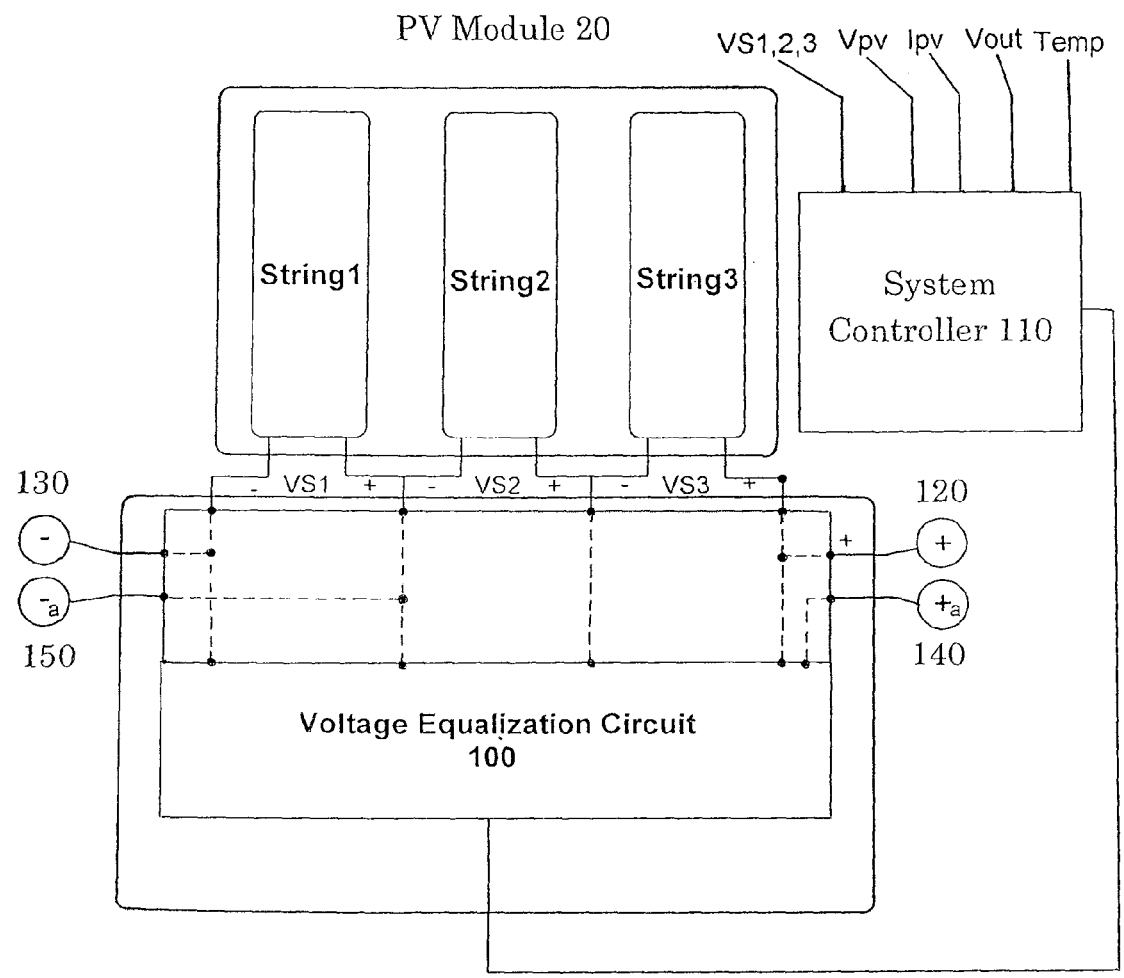
FIG. 3 shows a top-level schematic representation of a converter that includes a voltage equalization circuit adapted to be used in conjunction with a PV module in accordance with an exemplary embodiment of the invention.

FIG. 3 shows a top-level schematic representation of a converter adapted to be used in conjunction with a PV module 20 in accordance with exemplary embodiments of the invention. The converter may include a voltage equalization circuit 100 and a system controller 110. In the present exemplary embodiment, the PV module 20 includes three strings 1, 2, and 3, each of which may include a plurality of PV cells 60 connected in series (not shown). As shown in FIG. 3, positive and negative voltage taps from each string 1, 2, and 3 of the PV module 20 are connected to the voltage equalization circuit 100. Outputs from the voltage equalization circuit 100 correspond to the typical positive terminal 120 and negative terminal 130 from the PV module 20, along with an auxiliary positive terminal 140 and an auxiliary negative terminal 150.

The voltage equalization circuit 100 may be controlled by the system controller 110. The system controller 110 may enable or disable the voltage equalization circuit 100. The system controller 110 may enable the voltage equalization circuit 100 if the system controller 110 detects that the strings 50 are unbalanced. As discussed above, the strings 50 may be unbalanced due to partial shading, dirt, debris, or damage. The system controller 110 may send an activation signal to the voltage equalization circuit 100 if the system controller 110 detects that one of the string voltages is substantially less than the average string voltage. In addition, the system controller 110 may measure the temperature of the PV module 20, the junction box 240, or the voltage equalization circuit 100 and disable the voltage equalization circuit 100 if one or more of the temperatures is outside of a threshold value.

As shown in FIG. 3, the inputs to the system controller 110 are the voltages VS1, VS2, and VS3 of the strings 1, 2, and 3 in the PV module 20, the overall PV voltage Vpv, the overall PV current Ipv, and the temperature Temp of the voltage equalization circuit 100. The system controller 110 also has an output voltage Vout.

Figure 4:
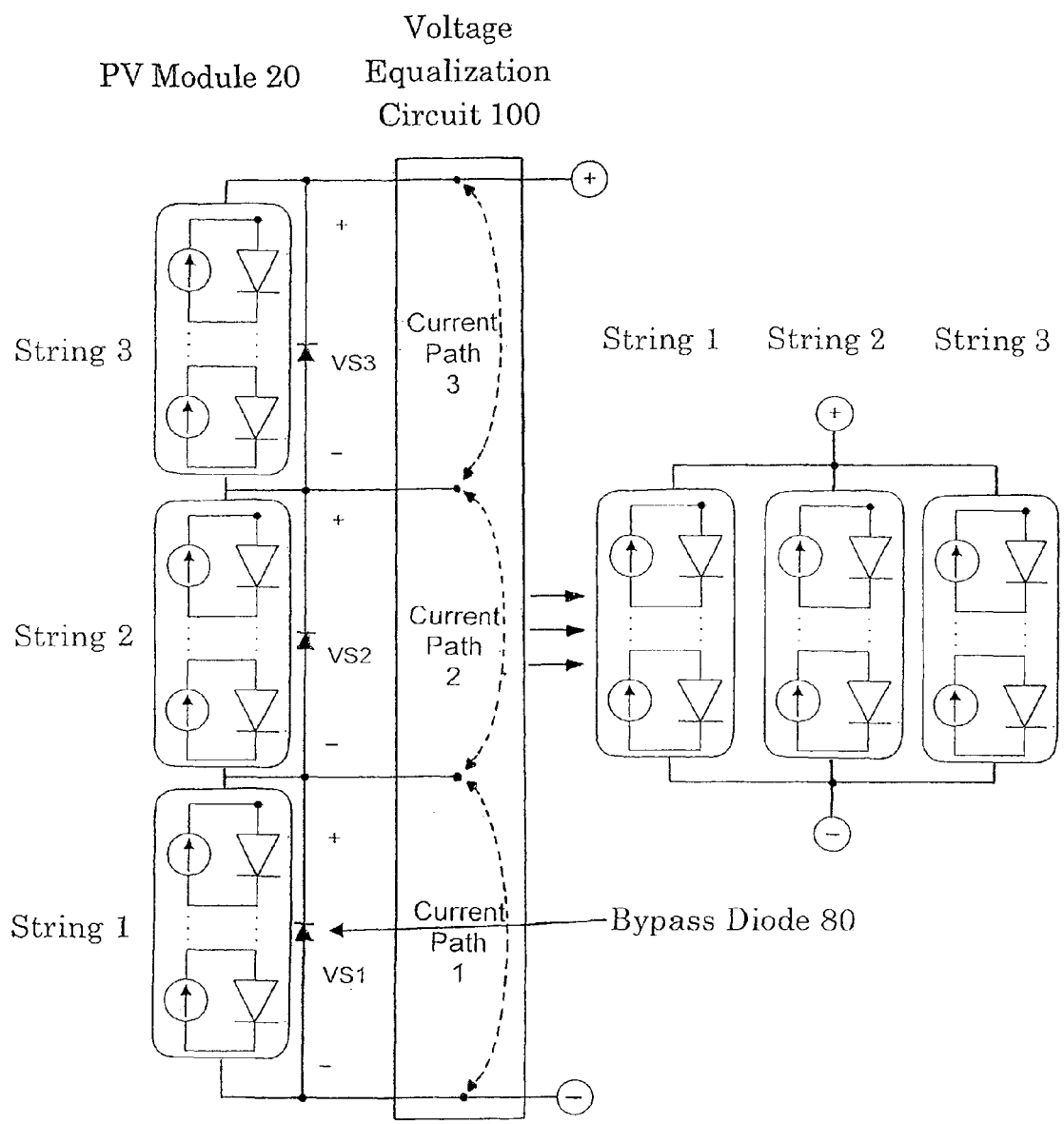
FIG. 4 shows a conceptual overview of the operation of the voltage equalization circuit shown in FIG. 3.

FIG. 4 shows a conceptual overview of the operation of the exemplary embodiment shown in FIG. 3 in which the voltage equalization circuit 100 is connected to three strings 1, 2, and 3 of series-connected PV cells 60. This is a typical configuration for a single PV module 20 with three strings 1, 2, and 3 of PV cells 60. However, the voltage equalization concept may extend to more or less than three strings of series-connected PV cells.

The voltage equalization circuit 100 operates to force the voltages VS1, VS2, and VS3 across the series-connected strings 1, 2, and 3 to be substantially equal. In other words, the voltage equalization circuit 100 enforces the condition that VS1=VS2=VS3 is substantially satisfied. For example, each voltage VS1, VS2, and VS3 may be 30 V±2 V. The voltage equalization circuit 100 provides additional paths for current to flow in the strings 1, 2, and 3, as shown in FIG. 4 by the current paths 1, 2, and 3, respectively. Since all of the string voltages VS1, VS2, and VS3 are forced to be substantially equal, each string 1, 2, and 3 operates at the same voltage on the power-voltage curve, as shown in FIG. 2D. This is similar to the scenario in which the strings 1, 2, and 3 are connected in parallel, as schematically represented on the right-hand side of FIG. 4. If one string, such as string 1, is shaded, it does not limit the performance of the other strings connected in series, such as strings 2 and 3. Also, since the MPV typically does not change substantially between strings 1, 2, and 3, the shaded string 1 can continue to contribute power near its MPP. When the string voltages VS1, VS2, and VS3 are substantially equal, the bypass diodes 80 do not turn on to short out the strings 1, 2, and 3.

Figure 5:
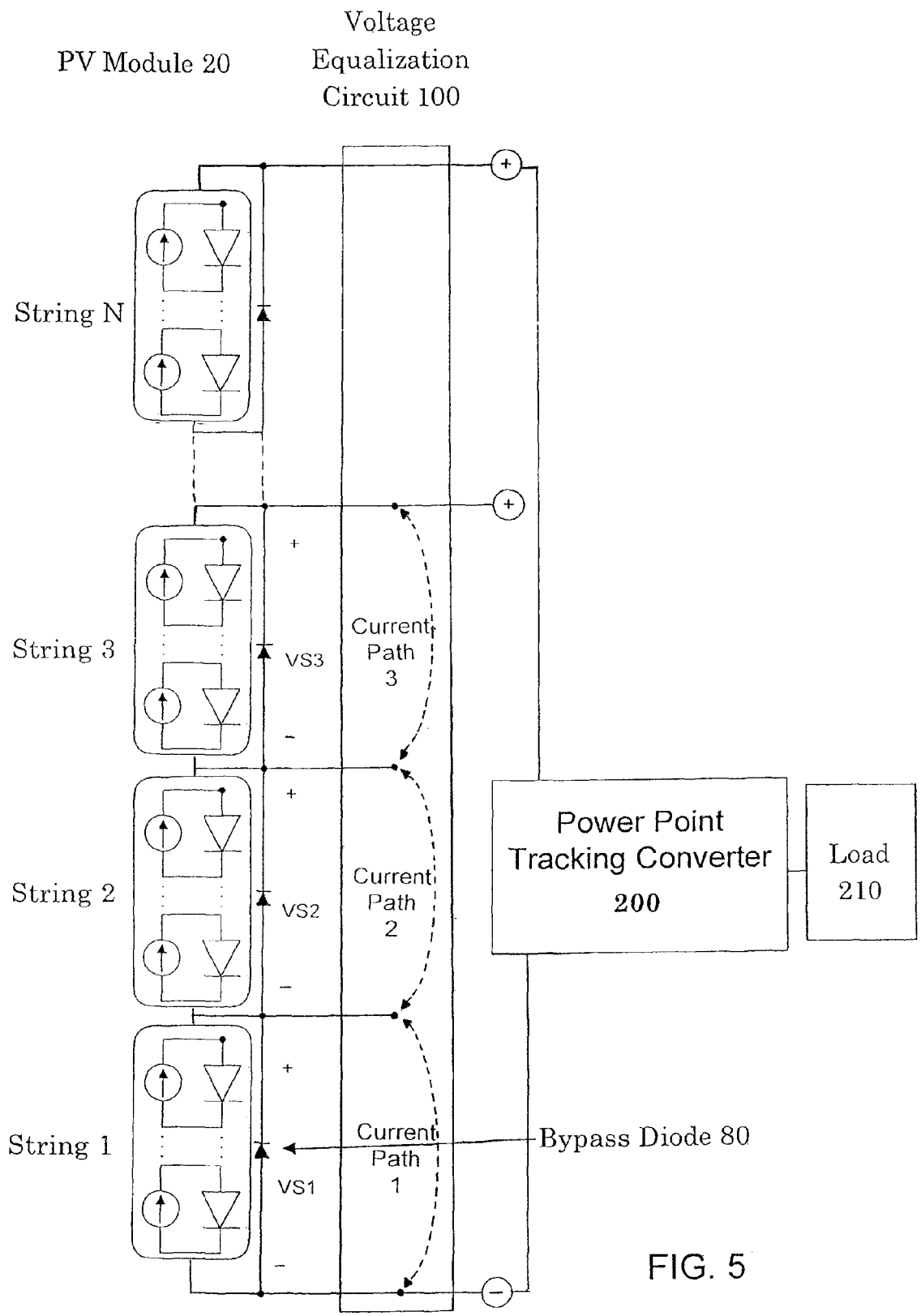
FIG. 5 shows an extension of the voltage equalization circuit shown in FIG. 4 to a PV module with a number N of series-connected strings of PV cells.

As shown in FIG. 5, the voltage equalization circuit 100 may extend to any number N of series-connected strings 1, 2, 3, . . . N of PV cells 60. Alternatively, each string could consist of a single PV cell 60, or each string could be replaced by a PV module that includes a plurality of series-connected strings. A power point tracking converter 200 with a load 210 may be used to identify the optimal MPP for the entire PV module 20 shown in FIG. 5. The power point tracking converter 200 may be an MPPT inverter or an MPPT DC-DC converter. The voltage equalization circuit 100 then enforces the correct MPP for each string 1, 2, 3, . . . N. Accordingly, each string 1, 2, 3, . . . N can operate near its MPP regardless of any shading. For example, if string 1 is shaded, it will continue to operate near its MPP without affecting the other series-connected strings 2, 3, . . . N.

An example of an MPPT algorithm is a hill-climbing algorithm, in which the power point tracking converter 200 steps a control signal in a continuous direction as long as the power continues to increase. The power point tracking converter 200 measures the PV voltage and current and calculates the PV output power. The power point tracking converter 200 steps the control signal up or down, and then measures the PV output power again. If the PV output power increases, the power point tracking converter 200 steps the control signal again in the same direction. If the PV output power decreases, the converter steps the control signal in the opposite direction. The control signal for an inverter or DC-DC converter may be a conversion ratio of the output voltage to the input voltage, the duty cycle, the PV voltage, the PV current, the output voltage, or the output current. The hill-climbing algorithm is given by:

$$Sigref(n+1)T = Sigref(n)T + Sigstep * \text{SIGN}\left[\frac{dp}{dSigref(n)}\right], \quad (1)$$

where Sigref is the control signal for the MPPT algorithm, Sigstep is the magnitude of the hill-climbing step, P is the measured power, n is an iterative index, and SIGN is the sign function returning +1 or −1.

Figure 6A:
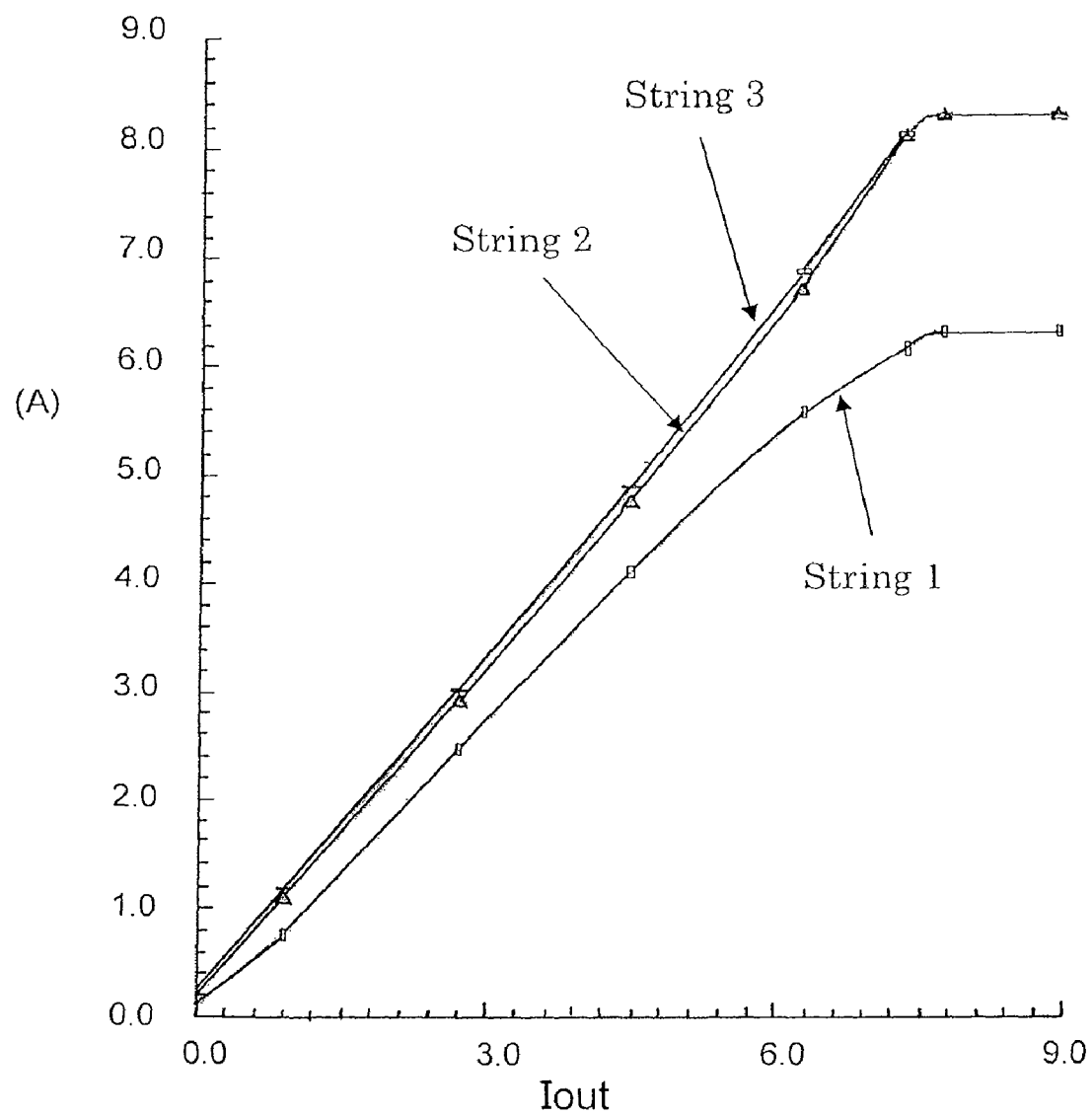
FIG. 6A shows simulation results for individual string currents as functions of the total series current through the entire PV module shown in FIG. 4 while the voltage equalization circuit is operating and String 1 is shaded relative to Strings 2 and 3.
Figure 6B:
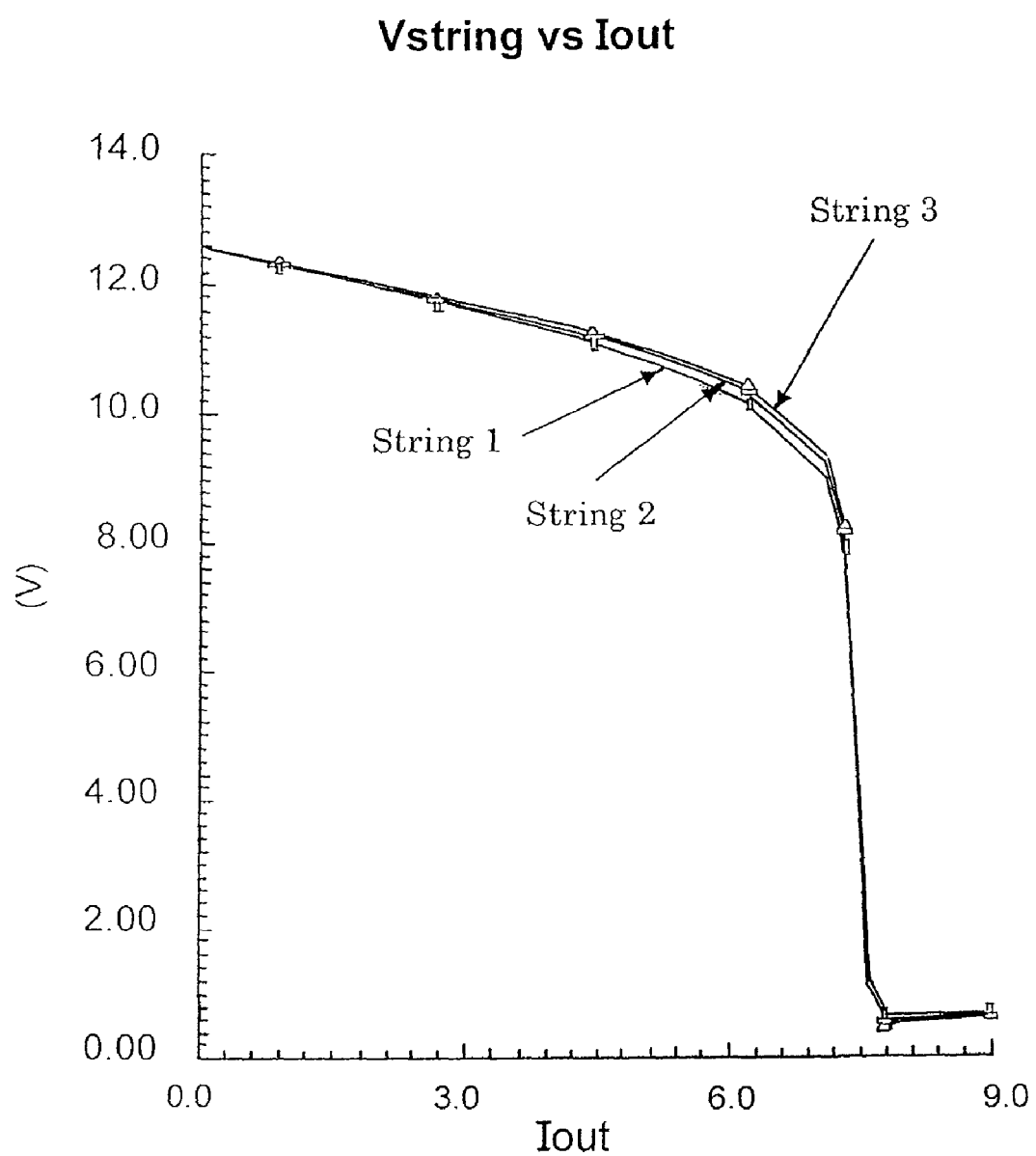
FIG. 6B shows simulation results for individual string voltages as functions of the total series current through the entire PV module shown in FIG. 4 while the voltage equalization circuit is operating and String 1 is shaded relative to Strings 2 and 3.
Figure 6C:
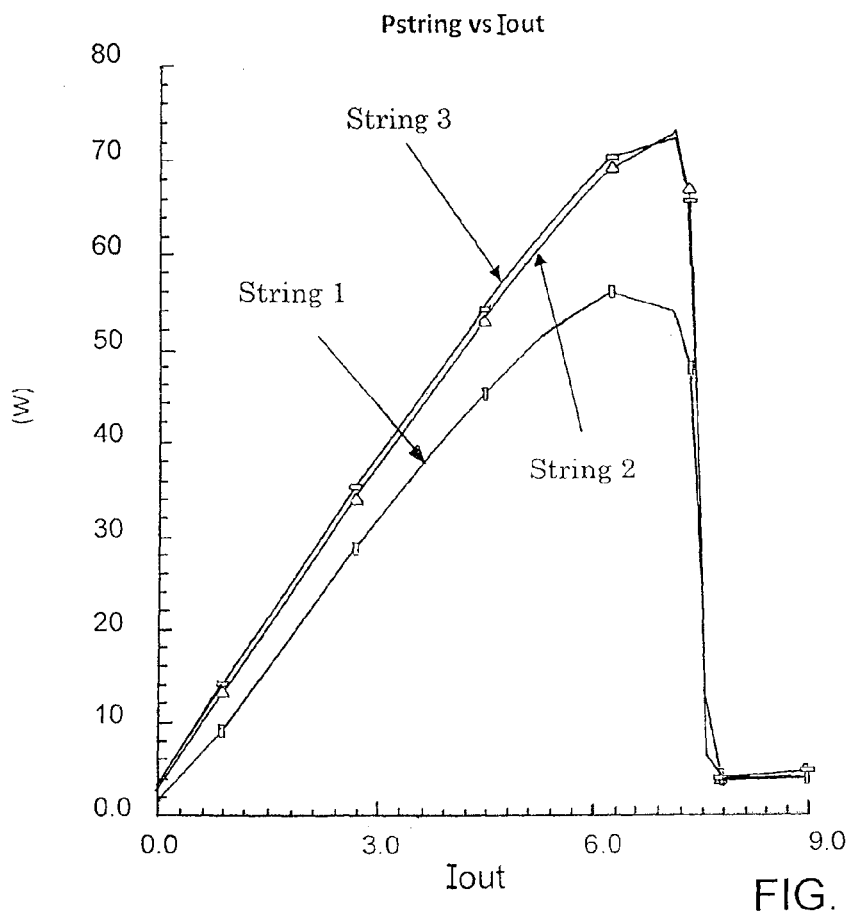
FIG. 6C shows simulation results for individual string output powers as functions of the total series current through the entire PV module shown in FIG. 4 while the voltage equalization circuit is operating and String 1 is shaded relative to Strings 2 and 3.

FIGS. 6A, 6B, and 6C show simulated current, voltage, and power curves for a PV module 20 with three series-connected strings 1, 2, and 3 and a voltage equalization circuit 100 as shown in FIG. 4. For this simulation, string 1 was shaded relative to strings 2 and 3. The x-axis is a sweep of the total series current Iout through the entire PV module 20. This could be the independent control variable of a MPP tracking load. For example, the power point tracking converter 200 shown in FIG. 5 could use Iout as the control signal to find the MPP by the method described above. In this case the power point tracking converter 200 adjusts the current Iout drawn from the entire PV module 20, while measuring both Iout and Vout of the PV module 20. The power drawn from the PV module 20 is the product of Iout and Vout. The power point tracking converter 200 modifies Iout while using an MPPT algorithm to drive the PV module 20 toward its MPP.

FIG. 6A shows the individual string currents versus Iout. As shown in FIG. 6A, the current through string 1 is lower than the current through strings 2 and 3, because string 1 is shaded. The additional current path 1 allows the current through string 1 to be lower. FIG. 6B shows the individual string voltages versus Iout. By using the voltage equalization circuit 100, the voltage across each of strings 1, 2, and 3 are forced to be substantially equal, regardless of the output current. FIG. 6C shows the individual string output powers versus Iout. Since string 1 is shaded, the peak power from string 1 is less than the peak power from the unshaded strings 2 and 3. However, the peak power point occurs at approximately the same Iout for each string 1, 2, and 3, due to the effects of the voltage equalization circuit 100. Therefore, the voltage equalization circuit 100 allows string 1 to operate with less current without affecting the conditions in strings 2 and 3.

Figure 7:
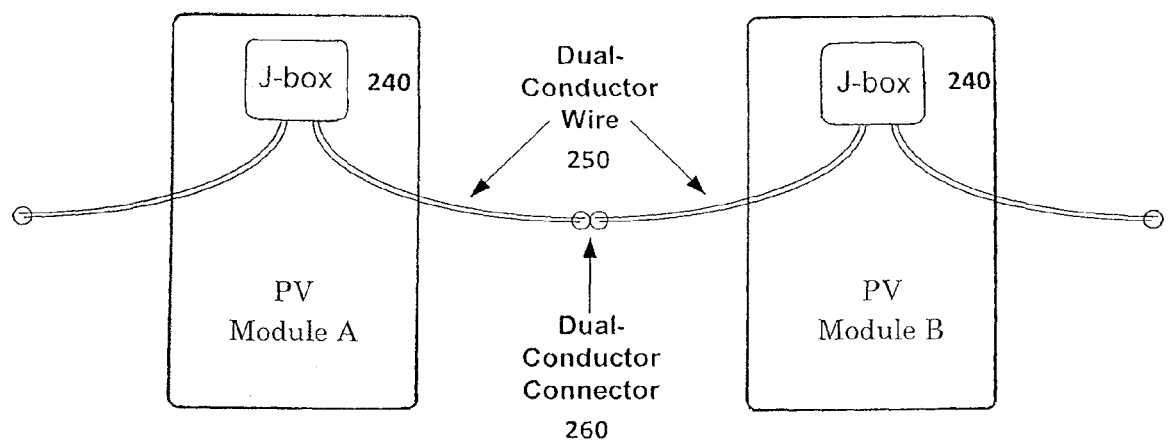
FIG. 7 shows an exemplary physical configuration in which one voltage equalization circuit is integrated in a junction box with each PV module and two conductors provide a connection between adjacent junction boxes.

As shown in FIG. 7, a typical PV module 20 may have between one and six strings 50 of PV cells 60, with parallel bypass diodes 80 integrated in a junction box (J-box) 240. According to exemplary embodiments of the present invention, the converter including the voltage equalization circuit 100 may also be integrated in the J-box 240 of the PV module 20. The connections for the converter from the J-box 240 are shown in FIGS. 3, 7, and 8.

As shown in FIGS. 3-5, the voltage equalization circuit 100 requires both positive and negative terminals of the strings 1, 2, and 3 to operate. In a single PV module 20 with three strings 1, 2, and 3, these terminals are available due to the typical wiring used to accommodate the bypass diodes 80. Therefore, to accomplish voltage equalization for strings 1, 2, and 3 in a single PV module 20, no modifications to the wiring of the PV module 20 are required.

Figure 8:
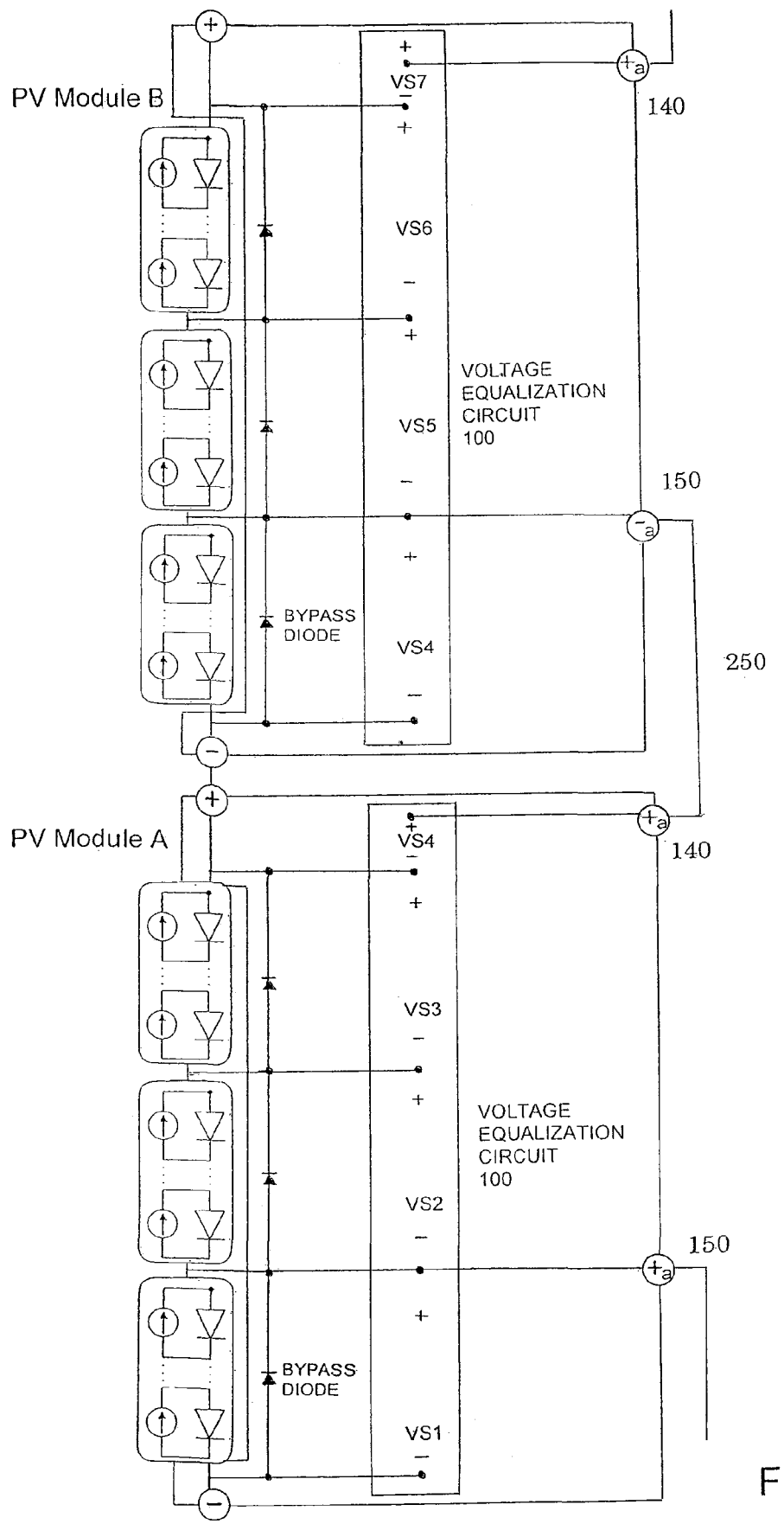
FIG. 8 shows an extended configuration of the voltage equalization circuit shown in FIG. 4 in which the voltage equalization concept extends to series connected modules.

However, to accomplish voltage equalization for a plurality of PV modules 20 connected in series, exemplary embodiments of the invention provide an auxiliary positive terminal 140 and an auxiliary negative terminal 150 for each of the PV modules 20, as shown in FIGS. 3 and 8. The auxiliary terminals 140 and 150 connect to adjacent PV modules via dual-conductor wires 250, as shown in FIGS. 7 and 8. The dual-connector wire 250 from PV module A is connected with the dual-connector wire 250 from PV module B via a dual-conductor connector 260. A voltage equalization circuit 100 is integrated with each of the PV modules A and B. As shown in FIG. 7, dual conductor wires 250 may be used to minimize the cost of the apparatus and simplify installation. Each dual conductor wire 250 includes two conductors that are co-sheathed in a single insulator. Alternatively, the J-boxes 240 could be connected with two single conductor wires.

For example, the additional dual-conductor wires 250 provide the potentials of strings 50 within PV module A to the adjacent series-connected PV module B. This allows a voltage equalization circuit 100 in PV module A to equalize all of the strings 50 in PV module A with one string 50 in PV module B. As shown in FIG. 8, the string voltages in PV module A are VS1, VS2, and VS3, and the string voltages in PV module B are VS4, VS5, and VS6. Also, PV module A receives VS4 from PV module B. The voltage equalization constraint in PV module A ensures that VS1=VS2=VS3=VS4, and the voltage equalization constraint in PV module B ensures that VS4=VS5=VS6, such that VS1=VS2=VS3=VS4=VS5=VS6.

With these constraints, the system ensures that all strings 50 within the series-connected PV modules A and B have substantially equal voltages. This concept can be extended to any number of PV modules in series that have any number of internal strings 50 of PV cells 60.

Figure 9:
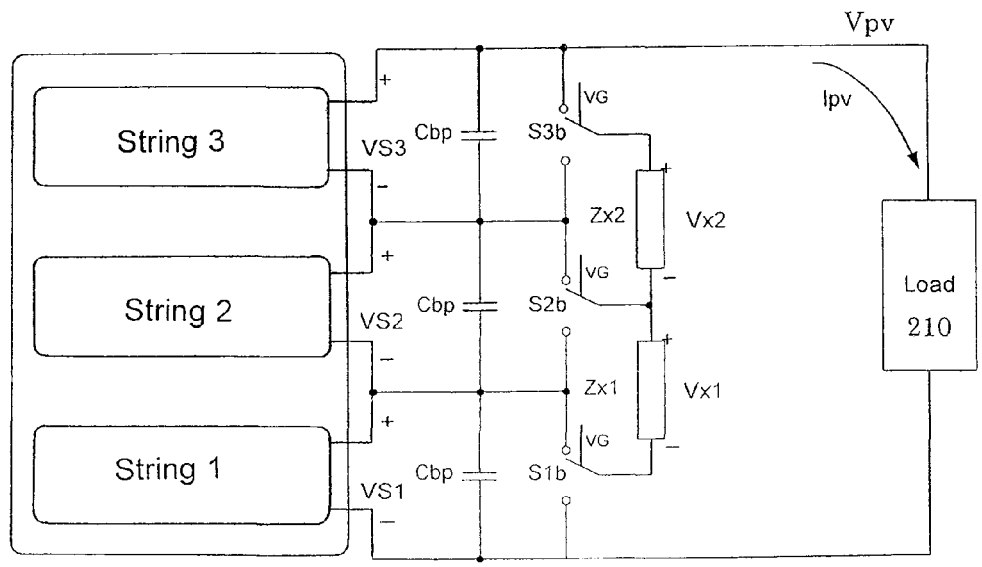
FIG. 9 shows a detailed schematic diagram of a voltage equalization circuit used in conjunction with a PV module according to an exemplary embodiment of the invention.

FIG. 9 shows a detailed schematic diagram of the voltage equalization circuit 100 in conjunction with a PV module 20 according to an exemplary embodiment of the invention. In the present embodiment, the voltage equalization circuit 100 works by dynamically modulating the configuration of energy storage devices Zx1 and Zx2 among series-connected PV strings 1, 2, and 3. The energy storage devices Zx1 and Zx2 store energy as a function of string voltage. Exemplary energy storage devices Zx1 and Zx2 include capacitors, inductors, batteries, fuel cells, piezoelectric devices, and mechanical energy storage devices including MEMS devices. Additional examples of energy storage devices Zx1 and Zx2 include networks that consist of capacitors, inductors, or other devices. Such networks may have a frequency-dependent impedance with resonant behavior. As discussed below, an example resonant network is a series-connected inductor and capacitor.

Figure 10:
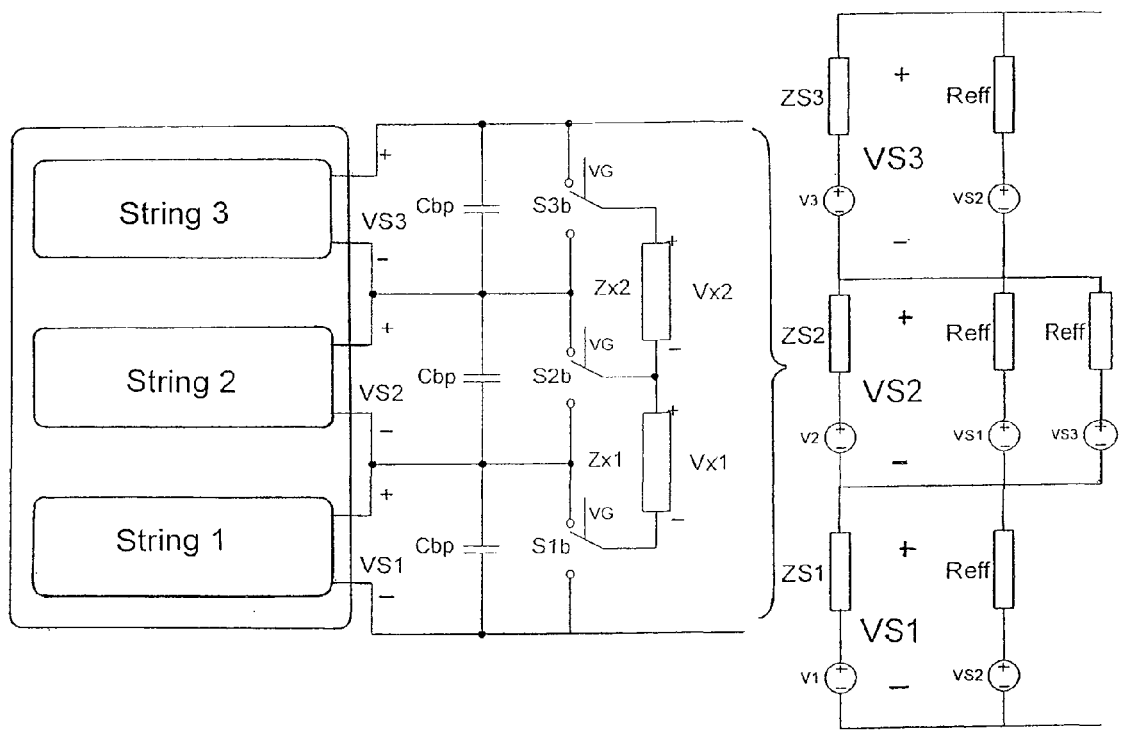
FIG. 10 shows an equivalent behavioral circuit of the voltage equalization circuit shown in FIG. 9.

An equivalent behavioral circuit 190 that represents the behavioral action of the voltage equalization circuit 100 is shown on the right-hand side of FIG. 10. Here VS1, VS2, and VS3 are the voltages across the strings 1, 2, and 3 of the PV module 20, respectively. ZS1, ZS2, and ZS3 represent the nonlinear impedance of the strings 1, 2, and 3, respectively, as could be derived from the curves shown in FIGS. 2B-2D.

The quantity Reff is an effective resistance that is created by the voltage equalization circuit 100 shown in FIGS. 9 and 10. The equivalent behavioral circuit 190 of the voltage equalization circuit 100 shown in FIG. 10 includes effective voltage sources VS1, VS2, and VS3 that are shown in series with Reff. These effective voltage sources VS1, VS2, and VS3 and Reff are modeled in parallel with terminals connecting to the strings 1, 2, and 3. For example, VS1 in string 1 is placed in parallel with VS2 from string 2 in series with Reff. If Reff is substantially small relative to impedances ZS1-ZS3, then voltages VS1-VS3 will be forced substantially equal. The equalization process happens due to the feedback inherent in the behavioral circuit of FIG. 9. In practice, Reff may be on the order of 100 mΩ, and the real part of ZS1-ZS3 may be on the order of several ohms.

To first-order, power loss in the voltage equalization circuit 100 is related to the equivalent resistance Reff. Assuming that the differences among voltages VS1, VS2, and VS3 are small, the differences in current among the strings 1, 2, and 3 will flow through the voltage equalization circuit 100. Power loss will follow according to $P_{loss-branch} = I_{Branch}^2 \cdot R_{branch}$, where $I_{Branch}$ is the current in a branch of the voltage equalization circuit 100 and $R_{Branch}$ is the equivalent resistance of that branch. Here $R_{Branch}$ may be equal to Reff. The power loss may also be expressed as $P_{loss-branch} = V_{Branch}^2 / R_{branch}$, where $V_{Branch}$ is the voltage difference between adjacent strings of PV cells 60. A smaller Reff will result in a smaller $V_{Branch}$ and a lower power loss. Therefore it may be advantageous to design the voltage equalization circuit 100 to reduce Reff as much as possible.

Figure 11A:
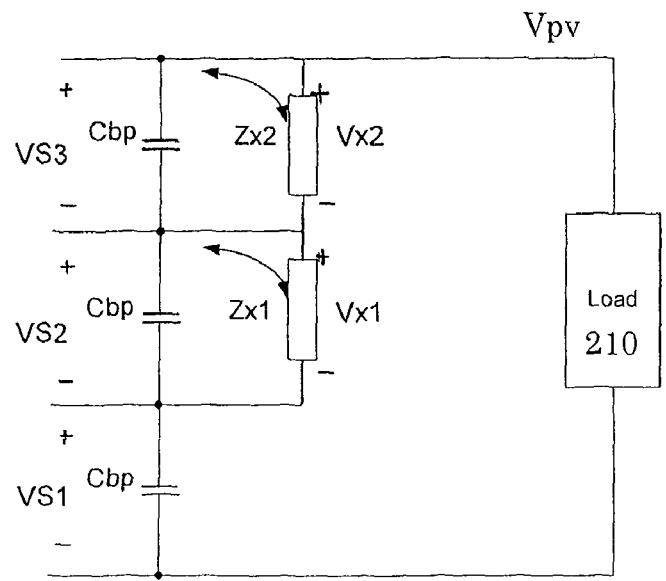
FIG. 11A shows the configuration of the voltage equalization circuit shown in FIG. 9 during Phase 1 of its operation.
Figure 11B:
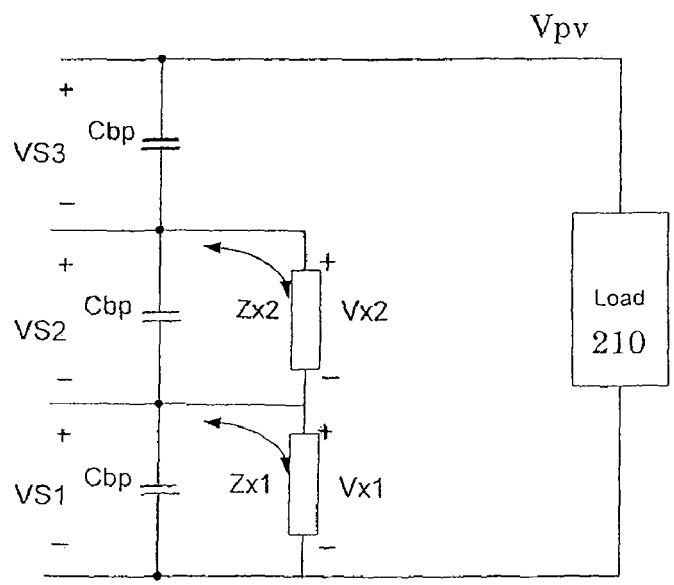
FIG. 11B shows the configuration of the voltage equalization circuit shown in FIG. 9 during Phase 2 of its operation.

As shown in FIGS. 11A and 11B, the voltage equalization circuit 100 operates in two phases controlled by a switch signal at a frequency $f_0$. Phase 1 is shown in FIG. 11A and Phase 2 is shown in FIG. 11B. The switch signal drives the control terminal, VG, of each of the single-pole, double-throw switches S1b, S2b, and S3b shown in FIGS. 9 and 10. The voltage equalization circuit 100 operates with a substantially 50% duty cycle, spending approximately half the time in Phase 1 and half the time in Phase 2.

Figure 12:
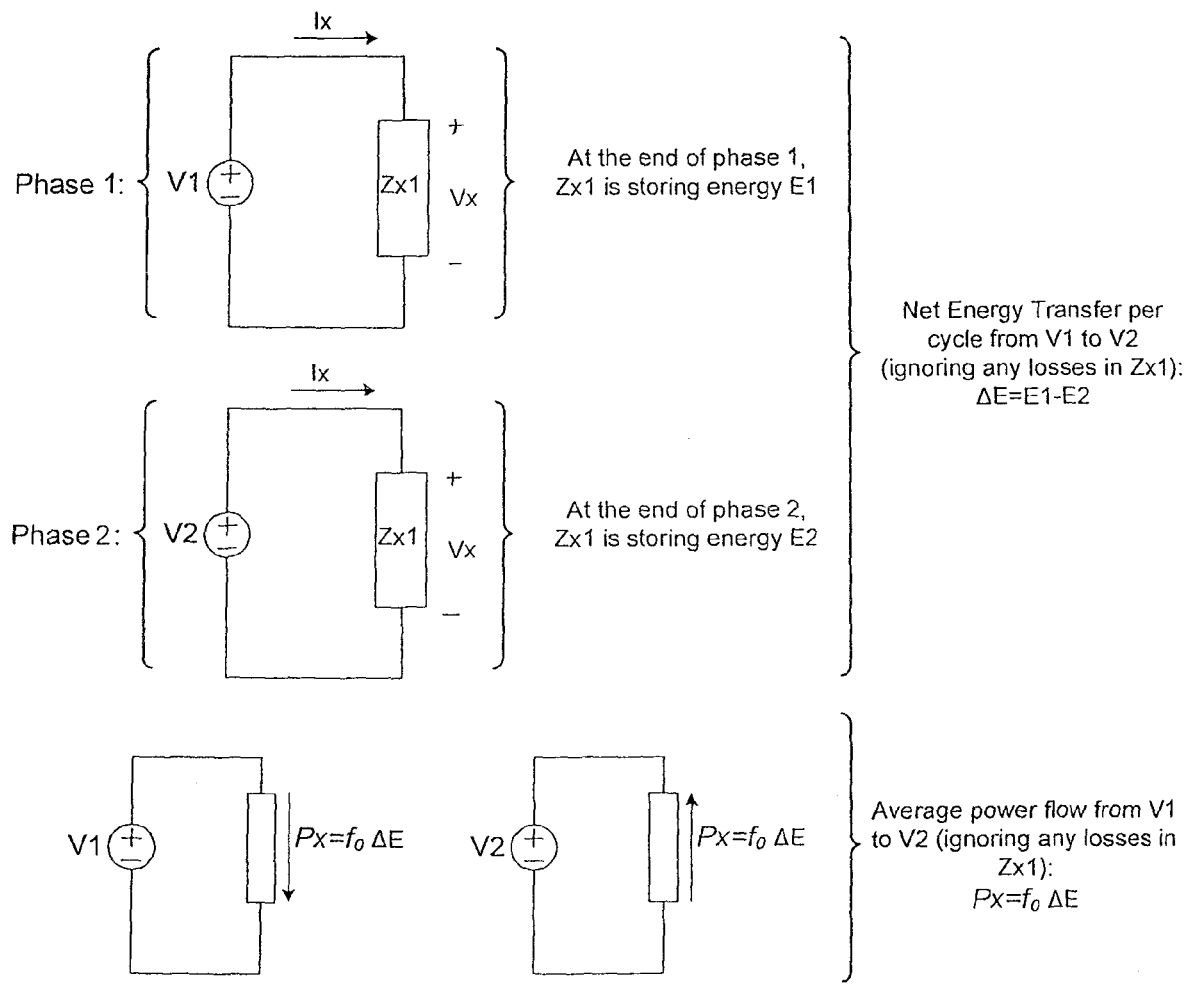
FIG. 12 is a conceptual diagram illustrating the energy transfer and power flow of the voltage equalization circuit shown in FIG. 9 during Phases 1 and 2.

In Phase 1, the first energy storage device Zx1 is configured in parallel with VS2. At the end of phase 1, the first energy storage device Zx1 is storing energy E1. In phase 2, the first energy storage device Zx1 is configured in parallel with VS1. At the end of phase 2, the second energy storage device Zx2 is storing energy E2. If E1 is greater than E2, some energy is transferred from VS2 to VS1. A corresponding process occurs for the second energy storage device Zx2 in Phases 1 and 2. Assuming that energy ΔE=E1−E2 is transferred from VS2 to VS1 in every switching cycle with a period $$T_0 = \frac{1}{f_0},$$

power $P = f_0 \Delta E$ is transferred on average from VS2 to VS1. FIG. 12 is a conceptual diagram illustrating this operation of the voltage equalization circuit 100.

Since power flows in the direction from a higher voltage to a lower voltage, current also flows from the higher voltage to the lower voltage. This current flow will act against the impedance of each voltage tap to increase the voltage of taps that are low and decrease the voltage of taps that are high. When the voltages across taps are equal, no average current flow occurs and the energy transfer approaches zero.

Although FIGS. 11A and 11B show an embodiment in which the energy storage devices Zx1 and Zx2 are reconfigured between Phases 1 and 2 to be connected in parallel with adjacent strings of the PV module 20, the energy storage devices Zx1 and Zx2 could also be reconfigured between Phases 1 and 2 to be connected in parallel with any of the strings within the PV module 20. Each energy storage device Zx1 and Zx2 merely needs to be connected across a different string within the PV module in Phases 1 and 2. The present invention is not limited by the geometry shown in FIGS. 11A and 11B.

In an exemplary embodiment of the invention, each of the energy storage devices Zx1 and Zx2 is a resonant device that includes a series resonant L-C-R circuit with an inductor $L_R$ and a capacitor $C_R$ connected in series, as shown in FIG. 13A. The L-C-R circuit also includes an effective series resistance $R_0$. The effective series resistance $R_0$ results from parasitic resistance in the inductor $L_R$ and the capacitor $C_R$. In practice the effective series resistance $R_0$ also includes any resistance in the switches S1b, S2b, and S3b and the bypass capacitors Cbp. In this embodiment, energy stored in each of the energy storage devices Zx1 and Zx2 is a function of frequency and voltage.

The inductor $L_R$ schematically depicted in FIG. 13A lumps together all inductance in series with the capacitor $C_R$ in the circuit. The inductor $L_R$ can include any inductance that is intentionally connected in series with the capacitor $C_R$, any parasitic inductance from circuit interconnect, and any parasitic inductance in the capacitor $C_R$. Inductance inherent in the capacitor $C_R$ is traditionally called the effective series inductance (ESL) of the capacitor $C_R$. The ESL of the capacitor $C_R$ results in a self-resonant frequency of the capacitor $C_R$ that occurs at a frequency $$f_{SR} = \frac{1}{2\pi\sqrt{L_{ESL}C_R}},$$

where $L_{ESL}$ is the ESL of the capacitor $C_R$.

FIG. 13B shows an embodiment of an energy storage device in which the inductor $L_R$ and the capacitor $C_R$ are implemented as discrete components on a printed circuit board (PCB) 220. The inductor $L_R$ and/or the capacitor $C_R$ may be implemented with a single device, or with multiple devices connected to the PCB 220. In FIG. 13B, the switches S1b and S2b shown in FIGS. 9 and 10 are implemented with discrete switches S1, S2, S3, and S4, respectively.

FIG. 13C shows an embodiment of an energy storage device in which the inductor $L_R$ is implemented with interconnect layers 230 of the PCB 220. Inductance can be created with interconnect layers 230, which are planar metallization layers in the PCB 220, by designing loops that link magnetic flux. The inductance of a planar circular spiral is approximately $L \approx 4\pi \times 10^{-7} n^2 r$, where L is the inductance of the spiral, n is the number of turns of the spiral, and r is the radius of the spiral in meters. In practice, the inductor $L_R$ includes any inductance from any loops in series with the capacitor $C_R$ that link magnetic flux, including any unintentional loop area from metallization that connects the capacitor $C_R$, the switches S1b and S2b, and the bypass capacitors Cbp. In the present embodiment, the inductor $L_R$ also includes the ESL of the capacitor $C_R$.

FIG. 13D shows an alternative embodiment of a conceptual PCB 220 with no inductance intentionally placed in series with the capacitor $C_R$. Here, the inductor $L_R$ of the L-C-R circuit can include the ESL of the capacitor $C_R$ and any stray inductance from the interconnect layers 230 of the PCB. The switching process in this circuit may occur at substantially the self-resonant frequency of the capacitor $C_R$. Alternatively, the inductor $L_R$ could be treated as having negligible inductance. In this case the energy storage device would consist only of the capacitor $C_R$. In FIGS. 13B-13D the PCB 220 may be connected to an integrated circuit (not shown).

Figure 14:
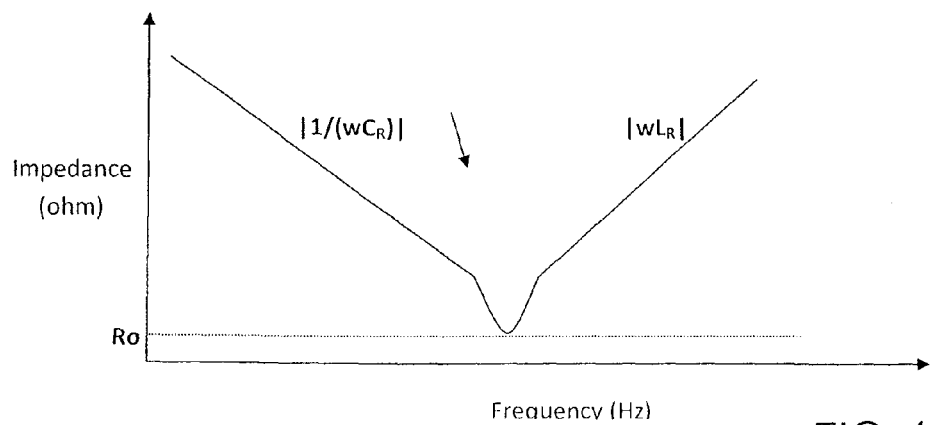
FIG. 14 is a plot of the magnitude of the impedance of the series resonant L-C-R circuit shown in FIG. 13.

FIG. 14 is a plot of the impedance of the series resonant L-C-R circuit shown in FIG. 13. As shown in FIG. 14, the impedance of the L-C-R circuit is dominated by the capacitor $C_R$ at low frequencies, and by the inductor $L_R$ at high frequencies. The resonant frequency $f_0$ occurs when the magnitudes of the impedance of the inductor $C_R$ and capacitor $L_R$ are the same, but 180° out of phase. At resonance, the impedances of the inductor $L_R$ and the capacitor $C_R$ cancel each other, and the net impedance of the network is the effective series resistance $R_0$. This occurs at frequency $$f_0 = \frac{1}{2\pi\sqrt{L_R C_R}} \quad (2)$$

which is the resonant frequency $f_0$ of the L-C-R circuit.

An important characteristic of the resonant L-C-R circuit is the quality factor Q of the circuit. The quality factor Q is defined as the ratio of energy stored to energy dissipated per cycle. The quality factor Q of the L-C-R circuit is given by:

$$Q = \frac{1}{R_0}\sqrt{\frac{L_R}{C_R}} \quad (3)$$

such that a smaller effective series resistance $R_0$ leads to a higher quality factor Q. For $Q \gg 1$, the current in the circuit is approximately sinusoidal for a voltage stimulus that is periodic at the resonant frequency $f_0$.

Figure 15:
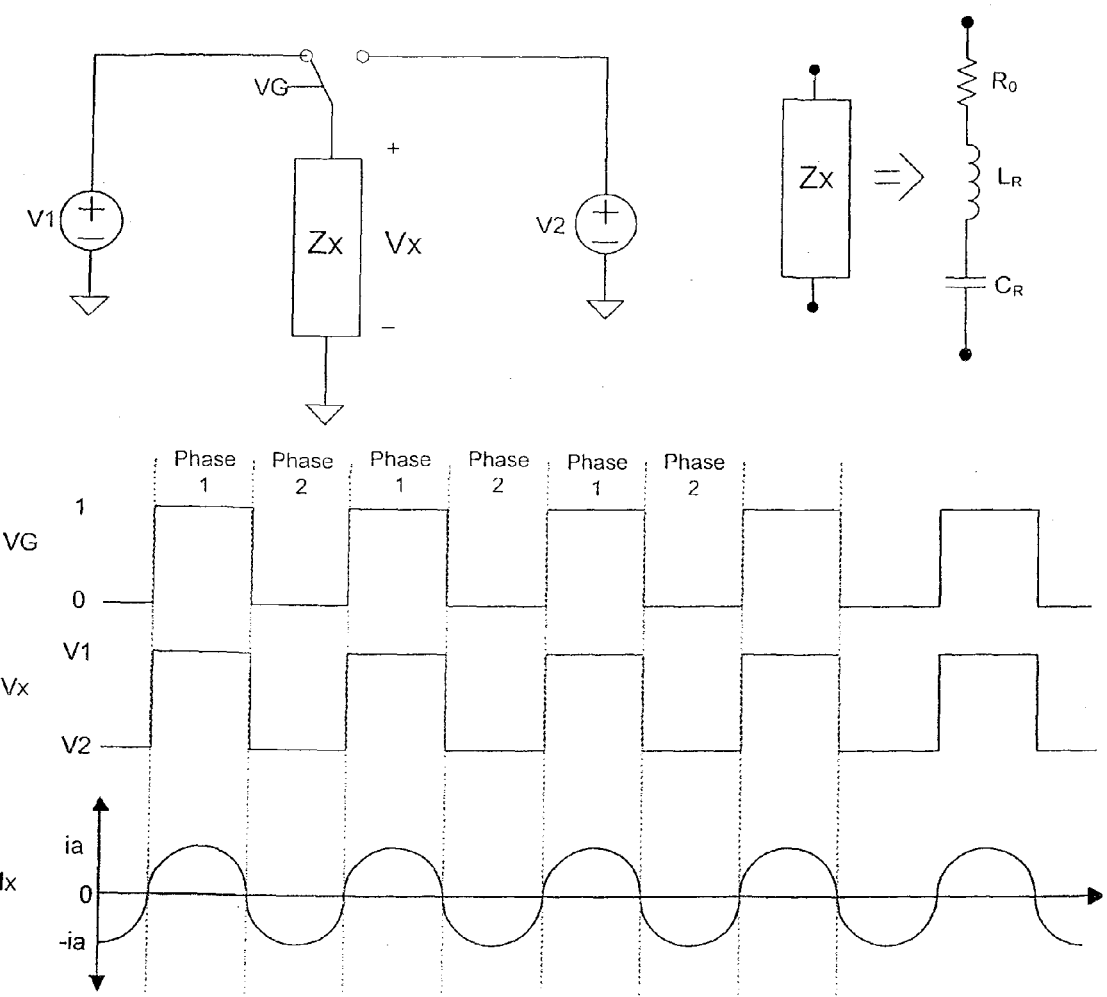
FIG. 15 shows the operation of the series resonant L-C-R circuit shown in FIG. 13.

As shown in FIG. 15, the series resonant voltage equalization circuit 100 works by transferring energy between two voltage taps V1 and V2. A control signal VG modulates the configuration of the switch such that Zx is in parallel with V1 in phase 1, and in parallel with V2 in phase 2. The control signal VG operates at the resonant frequency $f_0$ of the L-C-R circuit with a substantially 50% duty cycle. Vx is the voltage across the resonant impedance, and Ix is the current through the resonant impedance. The waveforms shown in FIG. 15 are for the steady state operation of the L-C-R circuit.

In phase 1, Zx is in parallel with V1. Since V1 is larger than V2, the current Ix in the resonant impedance follows the positive half-wave sinusoidal trajectory. The current Ix reaches a peak ia at ¼ of the total period. At the end of phase 1, the current Ix in the circuit approaches zero. The control signal VG switches at the end of phase one at ½ of the period when the current Ix is approximately zero. During phase 1, Zx draws net energy from V1.

In phase 2, Zx is in parallel with V2. Since V2 is less than V1, the current Ix in the resonant impedance follows the negative half-wave sinusoidal trajectory. The current Ix reaches a minimum −ia at ¾ of the total period. During phase 2, Zx delivers energy to V2.

Since the L-R-C circuit operates at the resonant frequency $f_0$, the current Ix in the circuit is constrained by the effective series resistance $R_0$ and the difference in voltage V1-V2. With a quality factor Q substantially larger than one, the current magnitude ia is $$ia = \frac{\frac{2}{\pi}(V1 - V2)}{R_0}. \tag{4}$$

The average current transferred between V1 and V2 is $$\overline{idc} = \frac{ia}{T_0} \int_0^{\frac{T_0}{2}} \sin\left(\frac{2\pi}{T_0}t\right) dt, \tag{5}$$

which results in $$\overline{idc} = \frac{ia}{\pi} = \frac{\frac{2}{\pi^2}(V1 - V2)}{R_0}. \tag{6}$$

With an effective resistance defined as $$R_{\mathit{eff}} = \frac{V1 - V2}{\overline{idc}},$$

it follows that $$R_{\mathit{eff}} = R_0 \frac{\pi^2}{2} \approx 5 \times R_0. \tag{7}$$

This expression for Reff is used along with FIG. 10 to determine the steady state operation of the voltage equalization circuit 100.

Although the above discussion describes a switching process that occurs at the resonant frequency $f_0$ of the L-R-C circuit with a 50% duty cycle, other switching frequencies and duty cycles are possible. The switching process can also operate at frequencies less than or greater than the resonant frequency $f_0$. The circuit may be most effective when an odd harmonic of the switching process is substantially the same as the resonant frequency $f_0$. For example, if the resonant frequency $f_0$ of the L-R-C circuit is at 1 MHz, the switching process may operate at substantially 1 MHz, 333 kHz, or 200 kHz, such that the $1^{st}$, $3^{rd}$, or $5^{th}$ harmonic, respectively, is substantially the same as the resonant frequency $f_0$.

In order to extend the voltage equalization circuit 100 to additional PV modules 20, one or more strings 50 of a PV module may be balanced with one or more strings 50 of an adjacent PV module 20. This extension of the voltage equalization circuit 100 may be achieved by adding the additional balancing stage 300 shown FIG. 16. This additional balancing stage 300 includes an additional bypass capacitor Cbp4, an additional switch S4b, and an additional balancing or flying impedance Zx3.

Figure 16:
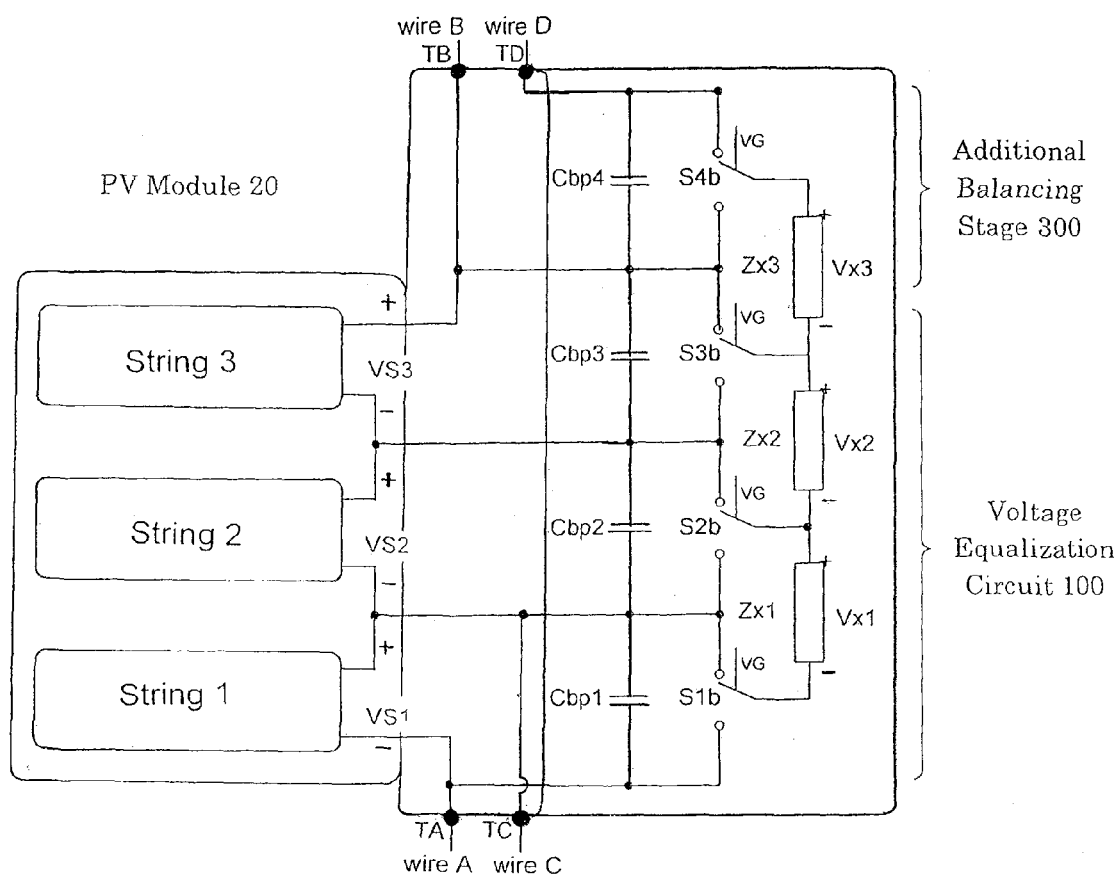
FIG. 16 shows a schematic diagram in which the voltage equalization circuit shown in FIG. 9 is extended by adding an additional balancing stage.

As shown in FIG. 16, two additional terminals are used to provide positive and negative voltages of string 1 to the adjacent PV module 20. The terminals out of the package or junction box are the typical positive terminal TB and negative terminal TA of the PV module 20, along with a positive terminal TC of string 1 of the PV module 20, and a terminal TD to accept the positive voltage of string 1 of the adjacent PV module 20. Terminals TA and TC can be housed in the same connector out of the package or junction box. Similarly, terminals TB and TD can be housed in the same connector out of the package or junction box. Wires A-D pass through terminals TA-TD to connect to adjacent PV modules 20 or DC bus connectors. Wires B and D can be housed in the same insulator or sheath and can use a single connector at each package or junction box interface terminal. This helps to minimize the cost of wiring material and total number of connectors. Wires A and C can similarly be housed in the same sheath and use single connectors at each terminal Alternatively, wires A and C can be mechanically connected in parallel to minimize the number of free wires in the system. Similarly, wires B and D can be mechanically connected in parallel to minimize the number of free wires in the system.

Figure 17:
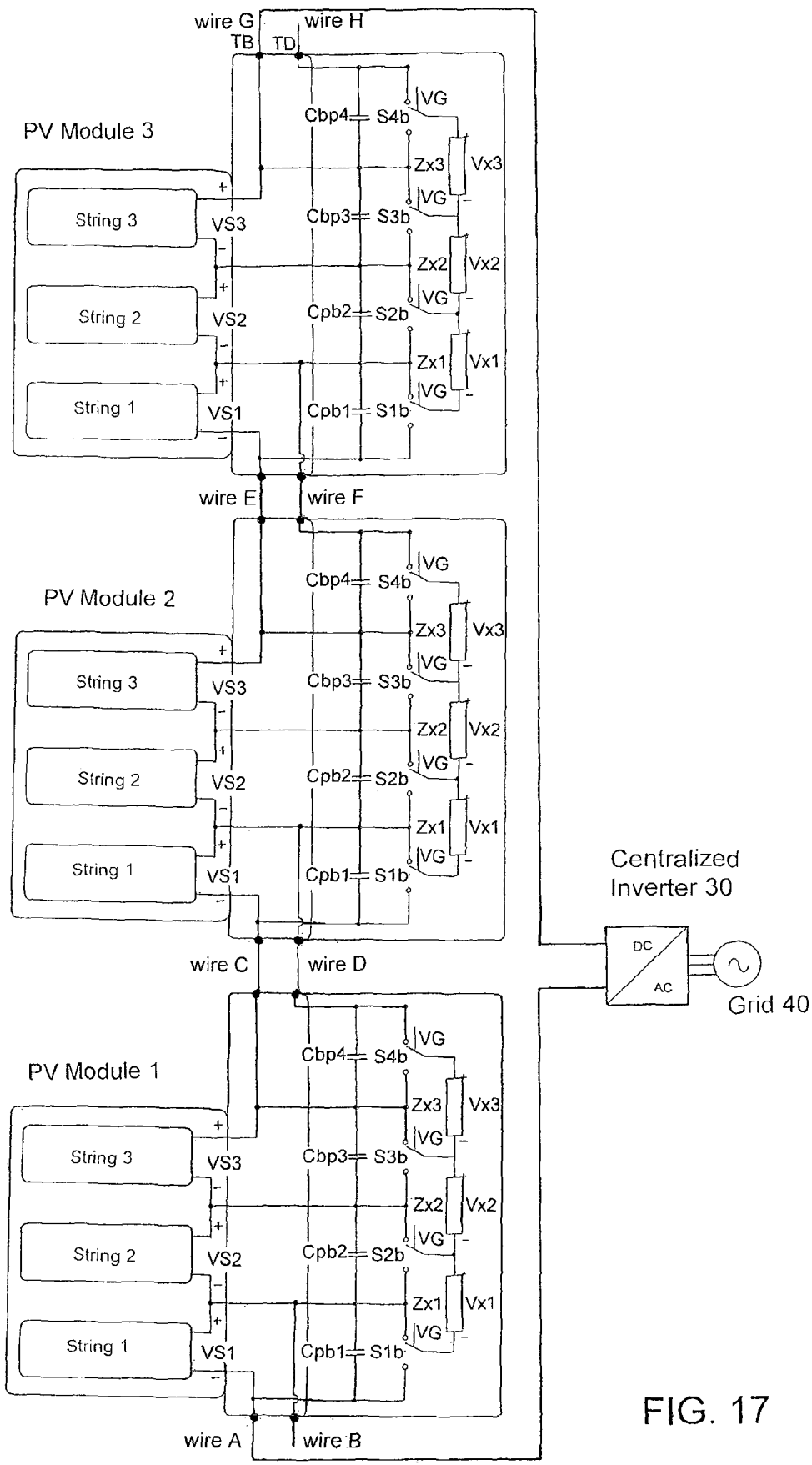
FIG. 17 shows an example in which the extended voltage equalization circuit shown in FIG. 16 is used in conjunction with three PV modules connected in series.

FIG. 17 shows an example in which three PV modules 1, 2, and 3 are connected in series with the extended circuit shown in FIG. 16. Connections between the PV modules 1, 2, and 3 are provided by wires A-H. As shown in FIG. 17, string 1 of PV module 2 is balanced with string 3 of PV module 1. Further, string 1 of PV module 3 is balanced with string 3 of PV module 2. In the present embodiment, the centralized inverter 30 may find the MPP for the entire array of PV modules 1, 2, and 3. Since all of the series-connected strings within the PV modules 1, 2, and 3 are forced to have substantially equal voltages, each string operates at substantially the MPP as determined by the centralized inverter 30.

Figure 18:
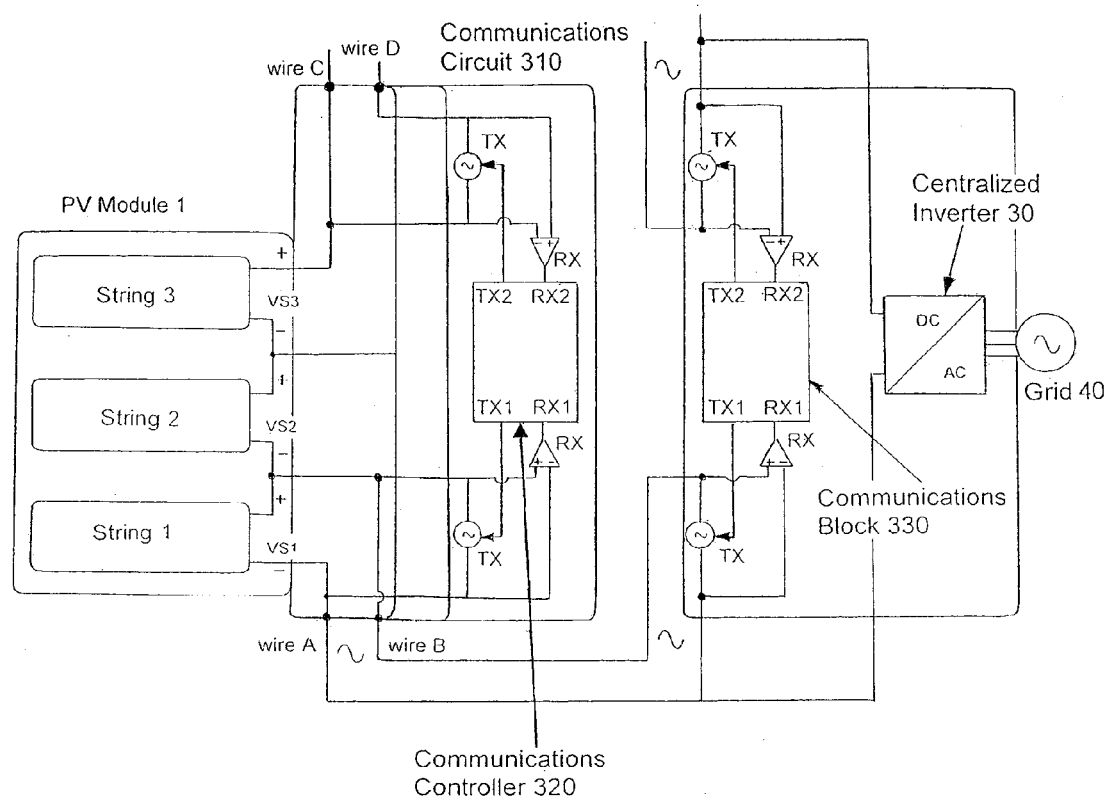
FIG. 18 is a schematic diagram of a simplified network communication system that operates in conjunction with the extended voltage equalization circuit shown in FIG. 16.

FIG. 18 shows an example of a simplified network communication system in conjunction with the extended circuit shown in FIG. 16. FIG. 18 shows that each package or junction box associated with the PV module 1 has a communications circuit 310 that communicates information to adjacent PV modules and back to the centralized inverter 30. Communications are simplified because two wires, such as wires A and B or wires C and D, are routed from each PV module to adjacent PV modules. These two wires are used to perform wireline communications based on the voltage potential difference between the two wires. Wireline communication does not interfere with power flow among the PV modules or the centralized inverter 30 because the signals have a low voltage amplitude and a high frequency relative to the DC power.

Each communications circuit 310 may have one or more transmitters TX, one or more receivers RX, and a communications controller 320 that generates modulated signals and can process received signals. The communications controller 320 can read data from adjacent PV modules over the wireline link and re-transmit the data to other adjacent PV modules, thereby forming a daisy-chain communications link. The communications block 330 at the end of the series string of PV modules can communicate directly to a wireline communications block at the centralized inverter 30 or at some other location in the system. The transmitter and receiver in this other communications block (not shown) is similar to the communications block 330 shown in FIG. 18. The other transceiver (not shown) can be associated with the centralized inverter 30, but may also be in any other location in the system as long as it has access to two wires, such as wire A and wire B.

Alternatively, the wireline communications signal may be transmitted as current instead of voltage potential. The communications signal may be a digital (binary 1 or 0) type signal (a baseband signal), or it may be a modulated carrier signal with a frequency tone that is subject to amplitude, phase, or frequency modulation.

Figure 19:
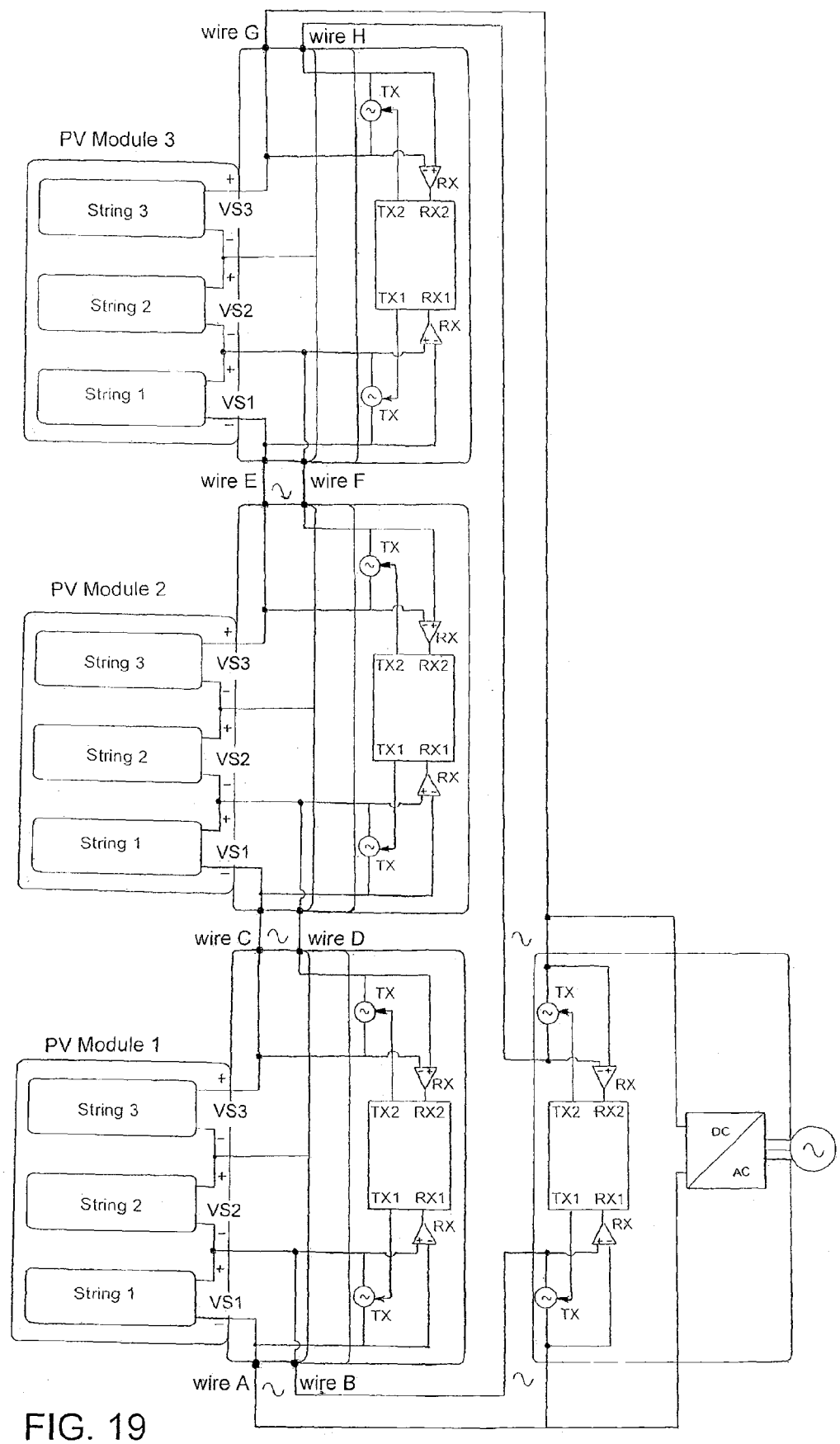
FIG. 19 shows an example of the simplified network communication system shown in FIG. 18 in conjunction with three PV modules that are connected in series.

FIG. 19 shows an example of the simplified network communication system in which three PV modules 1, 2, and 3 are connected in series. As shown in FIG. 19, PV module 1 communicates with the centralized inverter 30 and/or PV module 2. PV module 2 communicates with PV module 1 and/or PV module 3. PV module 3 communicates with PV module 2 and/or the centralized inverter 30. The centralized inverter 30 communicates with PV module 1 and/or PV module 3. However, the communication system is not necessarily associated with the centralized inverter 30. Instead, there may be a separate data logging, fault detection, or programming device.

Figure 20:
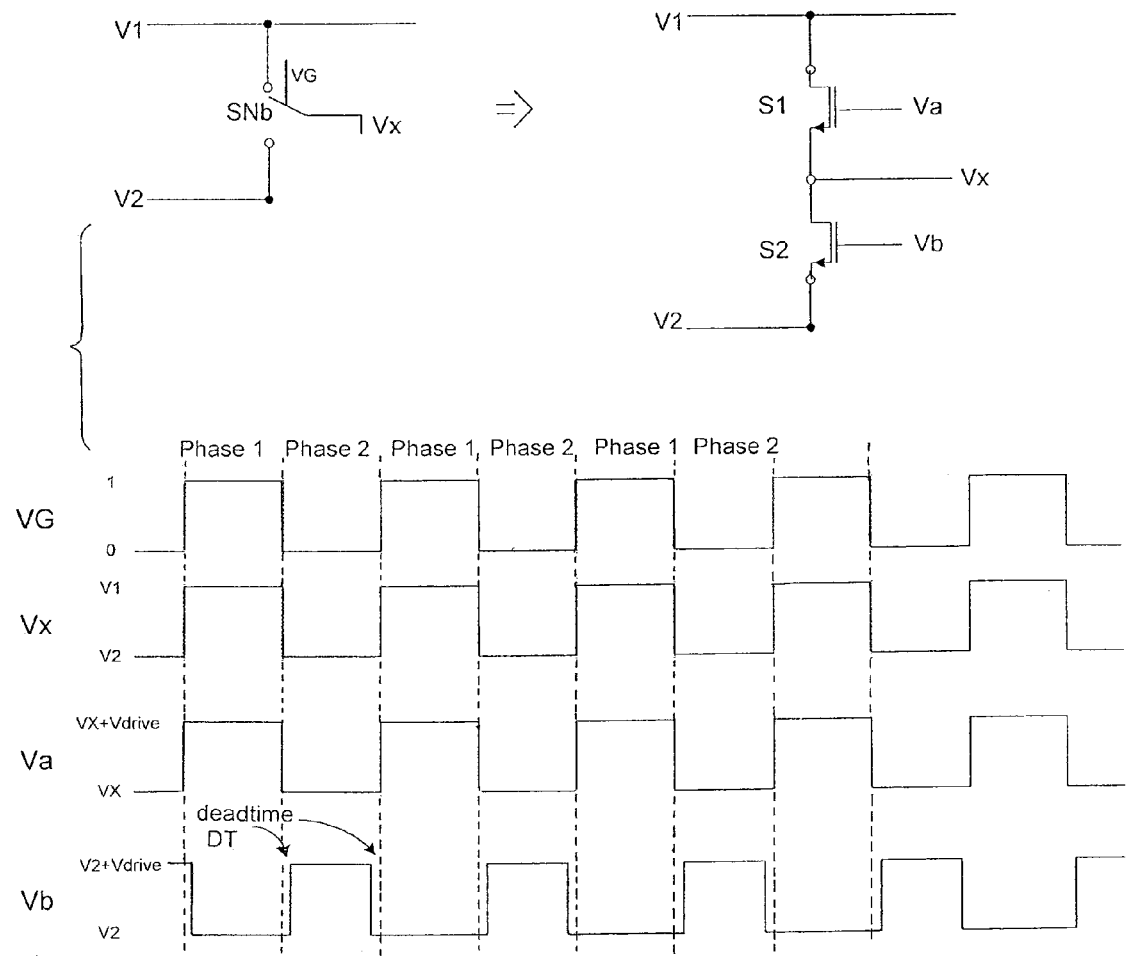
FIG. 20 shows an exemplary embodiment in which the single-pole, double-throw switches of the voltage equalization circuit are implemented with MOSFETs.

In an exemplary embodiment of the present invention, the single-pole, double-throw switches SNb may be implemented with MOSFETs, as shown in FIG. 20. For example, a switch SNb may be implemented with two MOSFETs S1 and S2. Instead of a single control signal VG, the MOSFETs S1 and S2 are controlled by voltage potentials Va and Vb, respectively. MOSFETs are typically three-terminal devices with gate, drain, and source terminals. The voltage potential across the gate-source terminal controls the current flow between the drain and the source.

As shown in FIG. 20, Va is synchronous with VG, forcing Vx substantially equal to V1 when Va=Vx+Vdrive. Vx is the source potential of S1 and Vdrive is the excess potential required to substantially turn on S1. Vdrive may exceed the threshold voltage of S1 by some amount to substantially reduce the resistance of S1 when S1 is on. When S1 is off, Va is substantially equal to Vx, forcing the gate-source voltage to substantially zero. Va may also be substantially less than Vx to ensure that S1 is off with a margin of safety.

Similarly, S2 is controlled by Vb. When S2 is off, Vb is substantially equal to V2 forcing the gate-source potential to substantially zero. S2 turns on only when S1 has turned off. To prevent S1 and S2 from turning on simultaneously, a timing delay is included between the on-off periods of the two switches S1 and S2. As shown in FIG. 20, this timing delay may be known as deadtime DT, which is the time when both S1 and S2 are off. When S2 turns on, Vb is driven to potential V2+Vdrive. Vdrive may be substantially higher than the threshold voltage of S2 to substantially reduce the resistance of S2 during the on period.

Although S1 and S2 are described here as N-channel MOSFETs, they may also be implemented with other technologies. For example, S1 and S2 could be implemented as P-channel MOSFETs by changing the polarity of the gate to source drive potential to negative. S1 and S2 could also be implemented as bipolar transistors, insulated-gate bipolar transistors (IGBTs), relays, junction field effect transistors (JFets), or other switch technologies.

Figure 21:
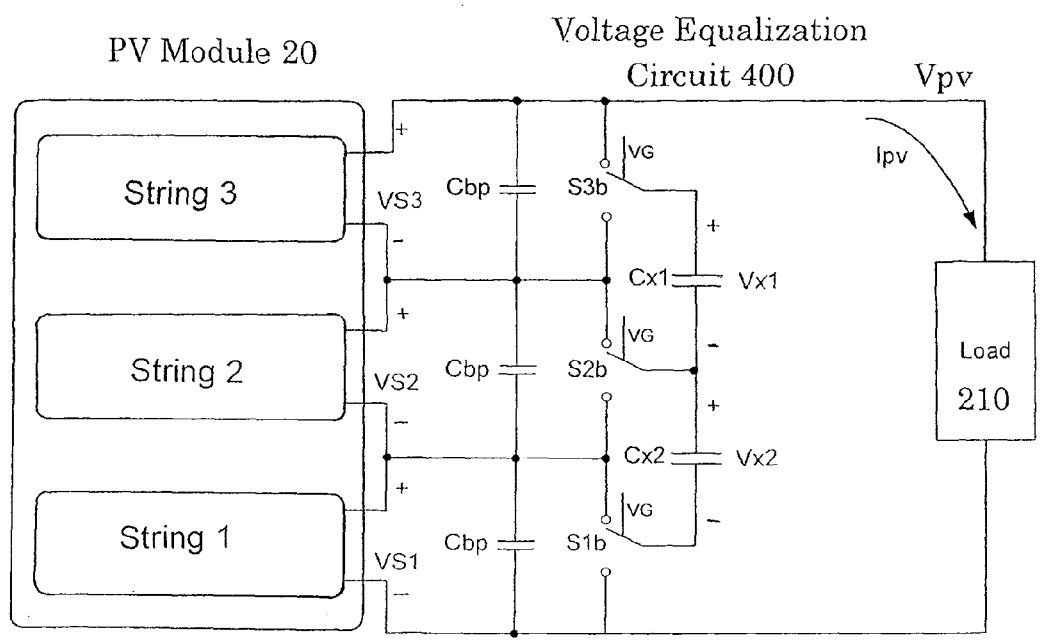
FIG. 21 shows an exemplary embodiment in which the energy storage devices of the voltage equalization circuit shown in FIG. 9 are implemented as capacitors.

As shown in FIG. 21, the energy storage devices of the voltage equalization circuit may be implemented as capacitors in another exemplary embodiment of the invention. FIG. 21 is similar to FIG. 9, but replaces the energy storage devices Zx1 and Zx2 with capacitors Cx1 and Cx2. Capacitors provide an example of a simple non-resonant energy storage device. Capacitors store energy as a function of voltage:

$$E = \frac{1}{2}CV^2 \tag{8}$$

where E is energy stored in the device, C is the capacitance, and V is the voltage across the device.

The circuit shown in FIG. 21 operates as the reverse of typical battery equalization circuits, because current flows out of PV modules 20, rather than flowing in as is the case with battery charging. Such circuits route current among differential voltage taps in a series string in order to force the voltages to be substantially equal. This is effective if the differential voltages have some positive nonzero impedance or resistance, such as the effective series resistance (ESR) of the battery.

Figure 22A:
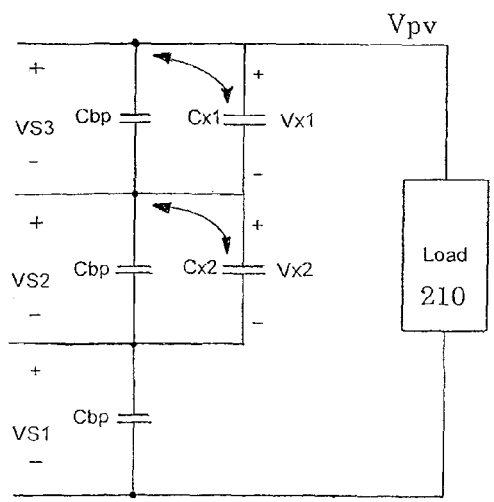
FIG. 22A shows the configuration of the voltage equalization circuit shown in FIG. 21 during Phase 1 of its operation.
Figure 22B:
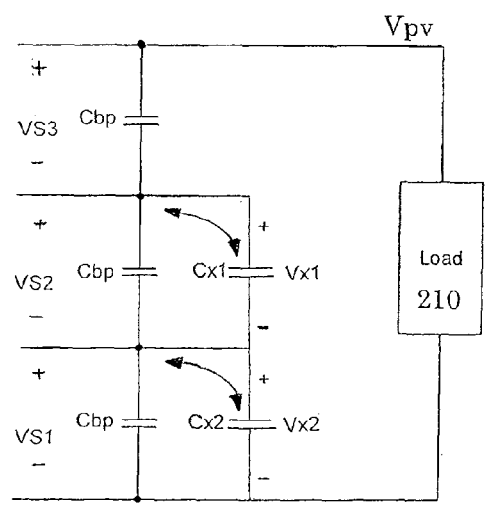
FIG. 22B shows the configuration of the voltage equalization circuit shown in FIG. 21 during Phase 2 of its operation.

The voltage equalization circuit 400 shown in FIG. 21 works by transferring charge between two differential voltage taps. As shown in FIGS. 22A and 22B, the voltage equalization circuit 400 operates in two phases controlled by a switch signal at a frequency $f_0$. Phase 1 is shown in FIG. 22A and Phase 2 is shown in FIG. 22B. In Phase 1 the capacitors Cx1 and Cx2 are initially connected across voltages VS3 and VS2, respectively. In Phase 1 the capacitors Cx1 and Cx2 hold charge equivalent to Cx1*VS3 and Cx2*VS2, respectively. In Phase 2 the capacitors Cx1 and Cx2 are connected across VS2 and VS1, respectively. Eventually the capacitors Cx1 and Cx2 hold charge Cx1*VS2 and Cx2*VS1, respectively. The difference in charge (Cx1*VS3−Cx1*VS2) will flow into or out of the respective bypass capacitor Cbp. If VS3 is larger than VS2, then charge will flow from VS3 to VS2 and vice versa. This sets up a feedback mechanism in which if any one of VS3, VS2, or VS1 is larger than the adjacent voltage, charge will flow to equalize the voltages.

Charge is transferred at a frequency fclk. Therefore the currents among the nodes will be Qi*fclk, where Qi is the charge in the node. Switched capacitor circuits are commonly analyzed with equivalent resistances Ri=1/(Ci*fclk). Similar analysis applies here where equivalent resistances are connected among the differential voltages with magnitude R2=1/(Cx2*fclk).

Figure 22C:
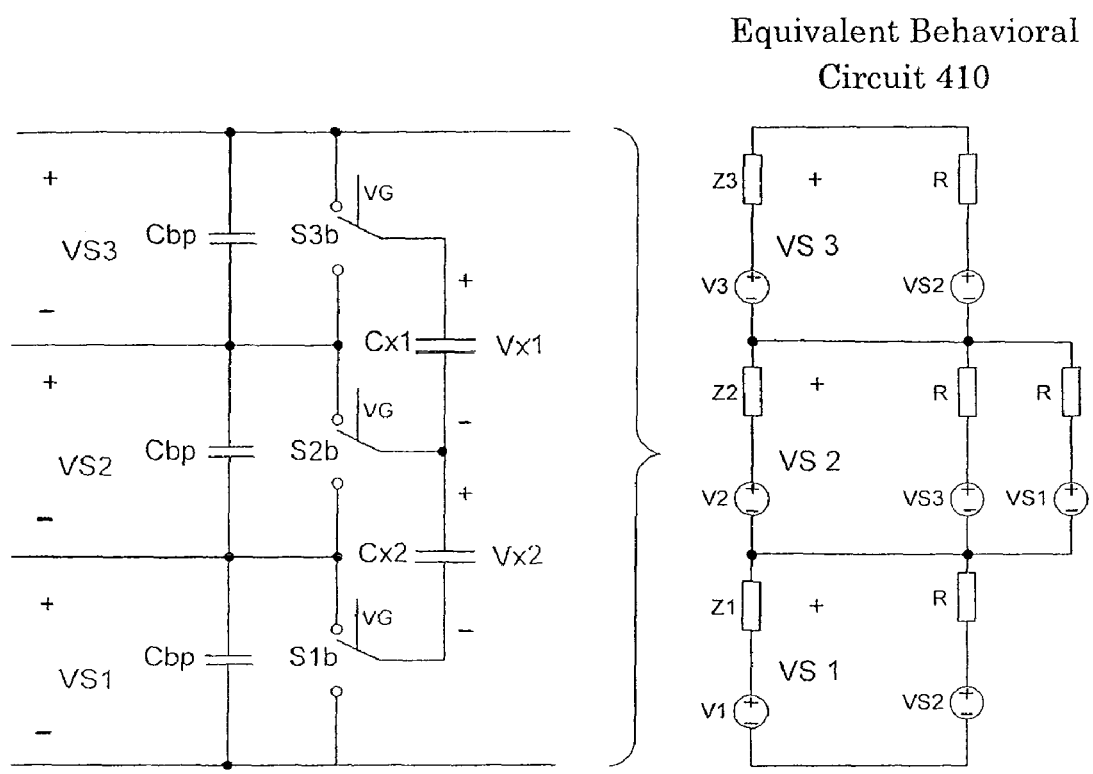
FIG. 22C shows an equivalent behavioral circuit of the voltage equalization circuit shown in FIG. 21.

FIG. 22C shows an equivalent behavioral circuit 410 of the voltage equalization circuit 400 with an effective resistance R=1/(Cx*fclk). Here voltage sources V1-V3 represent an effective voltage from the PV module 20. Z1-Z3 represent the nonlinear impedance of the PV module 20, as could be derived from the curves in FIGS. 2B-D. VS1-VS3 are the voltages across the strings 1-3 in the PV module 20. With an equivalent resistance R substantially less than Z1-Z3, the string voltages VS1-VS3 will be made to be substantially equal.

First-order power loss in the voltage equalization circuit 400 is related to the equivalent resistance R. Assuming that the differences between the voltages VS1, VS2, and VS3 are small, the differences in current among the strings 1, 2, and 3 will flow through the voltage equalization circuit 400. Power loss will follow $P_{loss\text{-}branch} = I_{Branch}^2 \cdot R_{branch}$, where $I_{Branch}$ is the current in a branch of the voltage equalization circuit 400 and $R_{Branch}$ is the equivalent resistance of that branch. Power loss is also expressed as $P_{loss\text{-}branch} = V_{Branch}^2 / R_{branch}$, where $V_{Branch}$ is the voltage difference between adjacent strings 1, 2, and 3.

In general, a smaller equivalent resistance R will result in a lower power loss. Therefore a higher switching frequency fclk and larger capacitors Cx1 and Cx2 will reduce the power loss. The capacitance of the capacitors Cx1 and Cx2 is generally limited by the physical size, cost, or increasing parasitic elements such as resistance and ground-referenced capacitance. The switching frequency fclk is limited by power losses that are proportional to the switching frequency fclk, such as the power to drive the control terminal of switches S1b-S3b and charging ground-referenced capacitance connected to the nodes of the capacitors Cx1 and Cx2. The switching frequency fclk is also limited by the time constant of the R-C circuit formed by the relevant switch and capacitor, as described in next section.

The voltage equalization circuit 400 may be designed to have an equivalent resistance R in the range of 1.0Ω to 0.1Ω with Cx1=Cx2=10 μF and fclk in the range of 100 kHz to 1 MHz. The first order power loss in the system is inversely proportional to the equivalent resistance R. In some cases the switching frequency fclk may be increased when the differences among VS1, VS2, and VS3 increase. Increasing the switching frequency fclk will reduce the equivalent resistance R and the associated power loss with the voltage equalization circuit 400.

FIGS. 23A-E show simulated results from the PV module 20 and the voltage equalization circuit 400 shown in FIG. 21 using a spice simulator. During the simulation, string 1 is intentionally mismatched by setting the short circuit current ISC of string 1 to 6.3 A. The other two strings 2 and 3 each have a short circuit current ISC of 8.3 A. The PV module 20 is then forced to its MPP by the voltage equalization circuit 400.

FIG. 23A shows the voltages VS1, VS2, and VS3 across the strings 1, 2, and 3 when the voltage equalization circuit 400 is active, while FIG. 23B shows the voltages VS2 and VS3 across the un-shaded strings 2, and 3 when the voltage equalization circuit 400 is disabled. As shown in FIG. 23B, when the voltage equalization circuit 400 is disabled, string 1 is shorted out by the bypass diode 80, such that string 1 contributes no power. However, when the voltage equalization circuit 400 is active, current is routed around the underperforming string 1, enabling string 1 to deliver power near its MPP. FIG. 23C shows voltages across the energy storage devices Vx1 and Vx2 when they are configured in parallel with the different strings in Phase 1 and Phase 2. FIG. 23D shows the voltage VS1 across the shaded string 1 of the PV module 20 when the voltage equalization circuit 400 is disabled. FIG. 23E shows the clock as the voltage equalization circuit 400 alternates between Phase 1 and Phase 2.

Figure 24A:
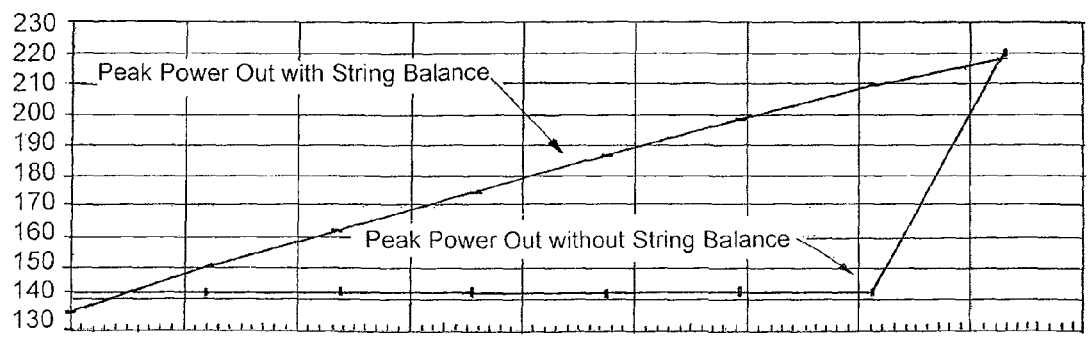
FIG. 24A is a plot that compares the peak power from the PV module with one string shaded when the voltage equalization circuit shown in FIG. 21 is active with the peak power from the PV module with one string shaded when the voltage equalization circuit is disabled.

FIG. 24A compares the peak power from the PV module 20 shown in FIG. 21 when one string is shaded and the voltage equalization circuit 400 is active with the peak power from the PV module when one string is shaded the voltage equalization circuit 400 is disabled. The x-axis is the short circuit current ISC of the shaded string, which is proportional to the amount of shading of the shaded string. As shown in FIG. 24A, when one string is shaded such that its short circuit current ISC is reduced to 6.5 A and the voltage equalization circuit 400 is active, a peak power of 205 W is produced by the PV module 20. In contrast, when one string is shaded and the voltage equalization circuit 400 is disabled, a peak power of 140 W is produced by the PV module 20.

Figure 24B:
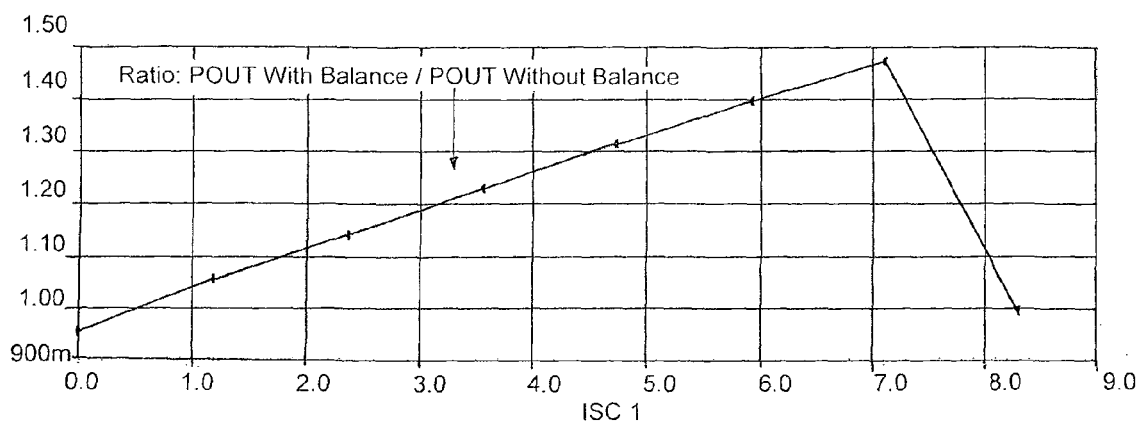
FIG. 24B is a plot of the ratio between the peak power from the PV module with one string shaded when the voltage equalization circuit 400 is active and the peak power from the PV module with one string shaded when the voltage equalization circuit 400 is disabled.

FIG. 24B plots the ratio of the peak power from a single PV module when one string is shaded and the voltage equalization circuit 400 is active with the peak power from the PV module when one string is shaded and the voltage equalization circuit 400 is disabled. Here even modest shading is shown to result in substantial power savings when the voltage equalization circuit 400 is enabled. FIG. 24B shows that the benefit ratio is substantially 1.4 in this scenario, as approximately 40% more power is available when the voltage equalization circuit 400 is activated. As shown in FIG. 24B, the beneficial effects of the voltage equalization circuit 400 are highest in modest shading scenarios when significant power can be recovered from strings that are only slightly shaded, but would otherwise be shorted out by bypass diodes 80 because their short circuit current ISC is below the MPC of the PV module 20 of series-connected strings 1, 2, and 3.

Figure 25A:
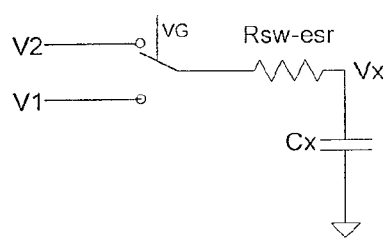
FIG. 25A shows an equivalent R-C circuit for the capacitors in the voltage equalization circuit shown in FIG. 21.
Figure 25B:
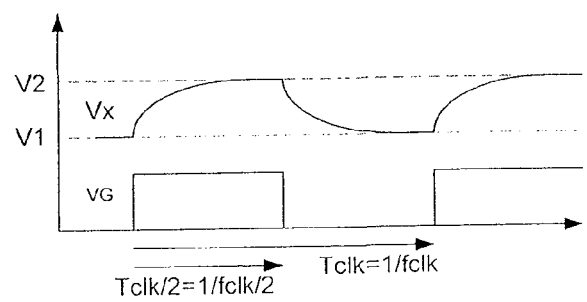
FIG. 25B shows the charge-discharge cycle of the capacitors in the voltage equalization circuit shown in FIG. 21.

The majority of power loss in the voltage equalization circuit 400 occurs when charge is transferred into and out of the capacitors Cx1 and Cx2. As is typical in switched capacitor circuits and charge pumps, the power loss is proportional to the difference in voltage before and after the capacitor Cx1 or Cx2 is charged. FIG. 25A shows an equivalent R-C circuit for the capacitors Cx1 and Cx2, each of which is represented by Cx. FIG. 25B shows the charge-discharge cycle of the capacitors Cx1 and Cx2. The effective resistance of switches S1a-S1c plus the effective series resistance (ESR) of Cx1 and Cx2 is modeled by $R_{sw\text{-}esr}$. V1 and V2 are held constant in this example. As shown in FIG. 23B, when the gate voltage VG is high, the switch connects Cx from V1 to V2. The node Vx increases with the RC time constant $\tau_{Cx}=R_{sw\text{-}esr}\cdot Cx$ from V1 to V2. The time constant $\tau_{Cx}$ sets a constraint on the switching frequency fclk. The node Vx must become substantially equal to V2 before the switch again connects Cx to V1. The timing constraint is set such that:

$$\frac{T_{clk}}{2} > n \cdot \tau_{Cx}, \quad (9)$$

where n is typically substantially larger than 3. This sets a maximum switching frequency of fclk<1/(2·n·$\tau_{Cx}$).

Energy loss in the circuit occurs during every switching transition. As is well known with R-C circuits, the energy loss is not dependent on the effective resistance R. Instead, the energy loss in the circuit of FIGS. 25A and 25B is given by $E_{lost}=Cx\cdot(V2-V1)^2$, such that power loss is $P_{lost}=E_{lost}\cdot$fclk. Referring to FIGS. 21 and 22A-22C, assuming that VS3 and VS2 are substantially constant, the power loss associated with the capacitor Cx1 is $$P_{Cx1}=Cx1*(VS3-VS2)^2*\text{fclk}, \quad (10)$$

which is commonly referred to as $CV^2$ loss. Similar loss mechanisms are associated with the capacitor Cx2. In the nominal case, the loss is not a function of the resistance of switches S1a-S1c, or the ESR of capacitors Cx1 and Cx2.

In the previous description and in FIG. 23, it is assumed that V1 and V2 (VS3 and VS2) are substantially different and constant. However, the switched capacitor circuit will operate to force these voltages substantially equal. If the voltages V1 and V2 are substantially equal, the power loss in the circuit will approach zero. Using the terminology in FIG. 22C, with a smaller effective resistance R, VS3 will be closer in magnitude to VS2. In FIGS. 23A-F, this approaches the case that V1=V2. In this case the power loss approaches zero. Therefore it is typically desirable to achieve low effective resistance R in the switched capacitor circuit to achieve high power efficiency. A low effective resistance R is achieved with a high switching frequency fclk and high capacitance of the capacitors Cx1 and Cx2. Limits on the effective resistance R are dictated by the switching frequency fclk and the size of available capacitors Cx1 and Cx2. Limits on the switching frequency fclk are dictated by the size of the capacitors Cx1 and Cx2, $R_{sw\text{-}esr}$, and the power loss associated with turning on and off the switches S1a-S1c.

For example, the resistance of the switches S1a-S1c and ESR of the capacitors Cx1 and Cx2 must permit the voltage across the capacitors Cx1 and Cx2 to substantially reach a steady state in one half of the switching period $\left(\frac{1}{2*fclk}\right)$.

This places a constraint on the time constant of the R-C circuit formed. Therefore, the switch resistance may be chosen to be substantially less than 15 mΩ, such that the circuit can switch at switch frequencies fclk as high as 1 MHz with the capacitance of the capacitor Cx1 as high as 10 µF.

Figure 26:
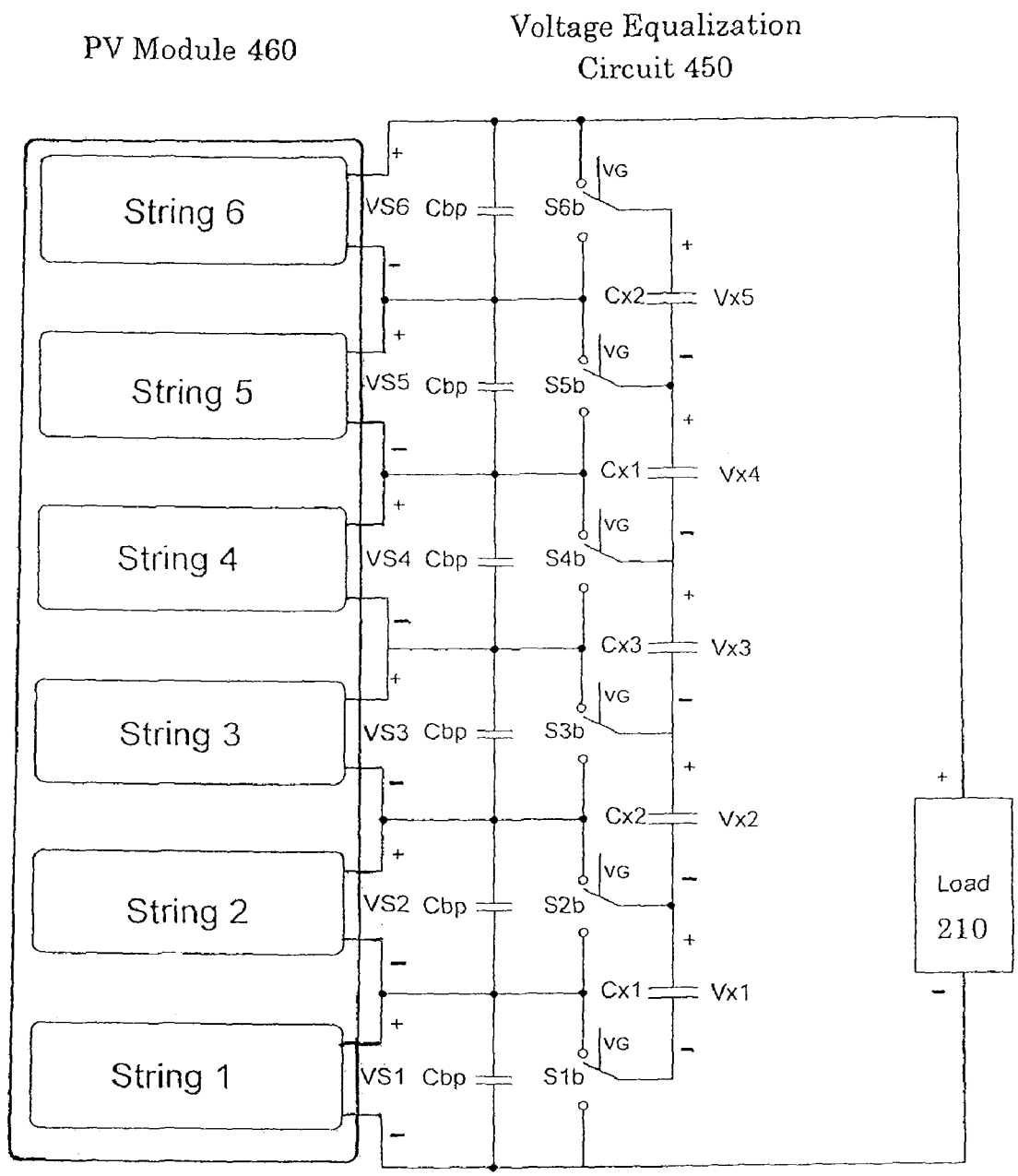
FIG. 26 shows a schematic diagram of a voltage equalization circuit used in conjunction with a PV module having six strings of PV cells according to an exemplary embodiment of the invention.

In other exemplary embodiments of the invention, voltages may be equalized for more or less than 3 strings in a PV module 20. The voltage equalization concept may extend to any number of strings 50 having any number of PV cells 60. For example, FIG. 26 shows a voltage equalization circuit 450 in conjunction with a PV module 460 having 6 strings 1-6. For N strings there will be N+1 terminals accessible from the PV module 460 (typically in the junction box connector). The circuit will require N switches S1b-SNb and N−1 capacitors Cx1-Cx(N−1). Similar to the embodiment shown in FIG. 21, the embodiment shown in FIG. 26 operates by forcing the string voltages VS1-VS6 to be substantially equal.

Figure 27:
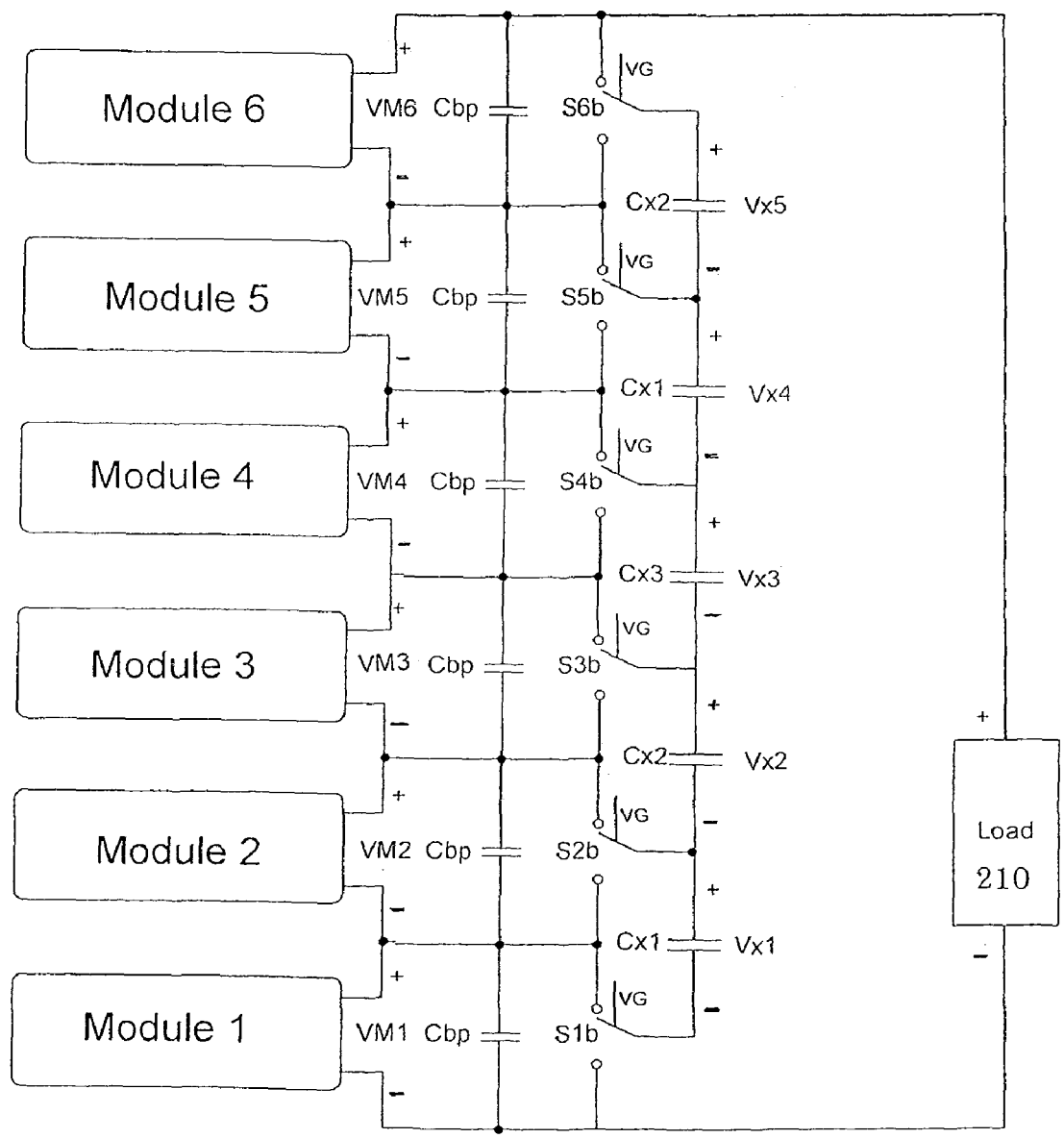
FIG. 27 shows a schematic diagram of a voltage equalization circuit used in conjunction with a string of six PV modules according to an exemplary embodiment of the invention.

Alternatively, as shown in FIG. 27, the voltage equalization concept may operate on a string 470 of PV modules 1-6 to balance the voltages at the output of each PV module 1-6. Here each PV module 1-6 includes one or more strings 50 of PV cells 60 in series and/or parallel configurations. The voltage equalization circuit 480 operates to force the voltages VM1-VM6 substantially equal. Accordingly, the string 470 of PV modules 1-6 can provide more power to a load 210 when operated at the MPP of the string 470, especially when one or more of the PV modules 1-6 is shaded, causing the local MPCs to be substantially different.

Figure 28:
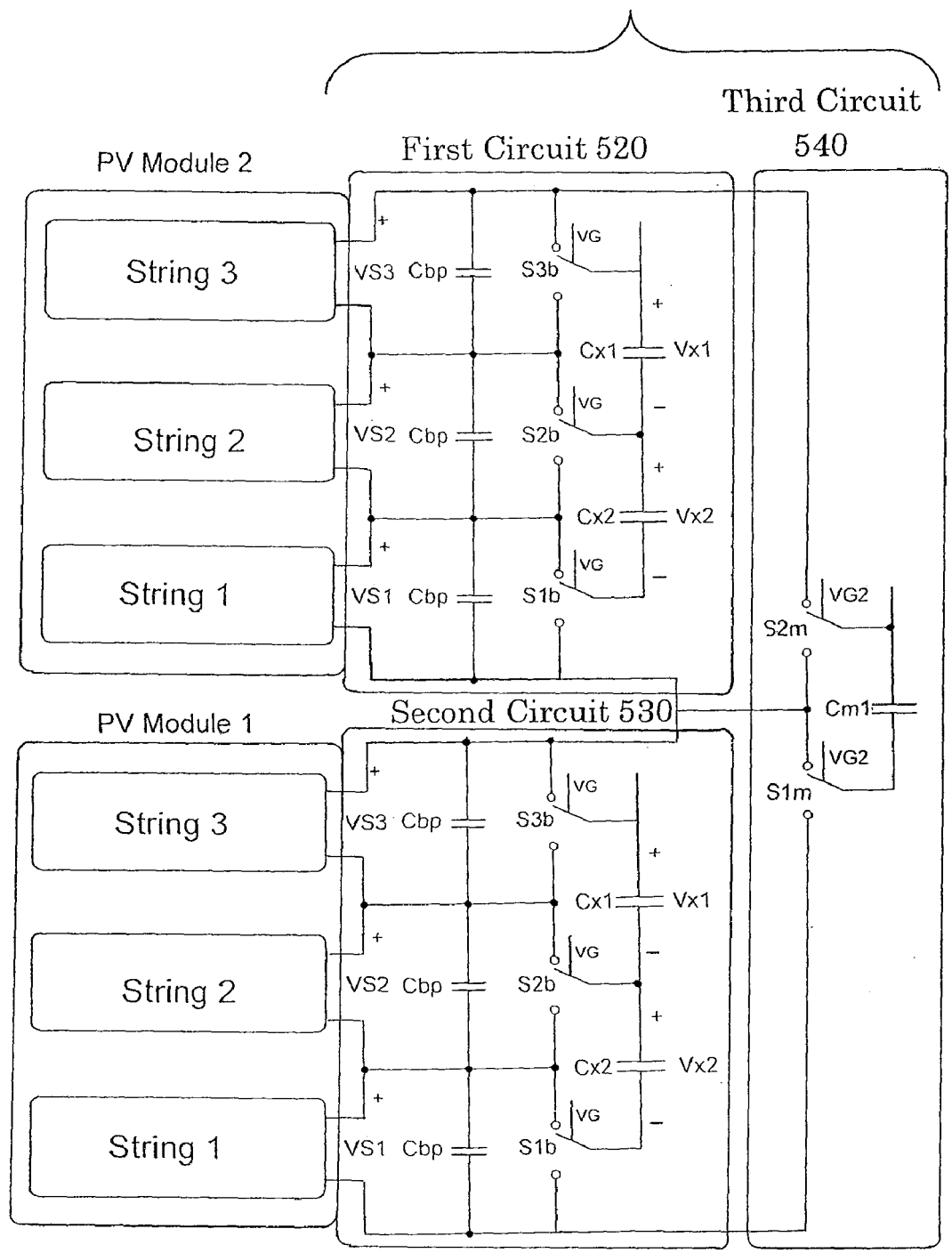
FIG. 28 shows a schematic diagram of a voltage equalization circuit having separate circuits to balance the voltages of PV modules and strings within the PV module, according to an exemplary embodiment of the invention.

Further, as shown in FIG. 28, the voltage equalization concept may be used to balance the voltages of strings 1, 2, and 3 within each PV module 1 and 2, and also to balance the voltages of the PV modules 1 and 2. Here, the voltage equalization circuit 510 includes a first circuit 520 and a second circuit 530 for separately equalizing the voltages of the strings 1, 2, and 3 within the PV modules 1 and 2, respectively. Each of the first circuit 520 and the second circuit 530 is similar to the voltage equalization circuit 400 shown in FIG. 21. The first circuit 520 and the second circuit 530 may operate independently at different switch frequencies fclk1 and fclk2. The voltage equalization circuit 510 also includes a third circuit 540 that equalizes all of the voltages within the PV modules 1 and 2. The first circuit 520 and the second circuit 530 may operate at substantially higher or lower frequencies than the third circuit 540.

It may be practical to integrate some or all of the third circuit 540 with the first circuit 520 or the second circuit 530 of any of the individual PV modules 1 and 2. In this case at least one additional wire may be necessary to connect between the PV modules 1 and 2 to provide both the positive and negative terminals of each PV module to the adjacent PV module.

Figure 29:
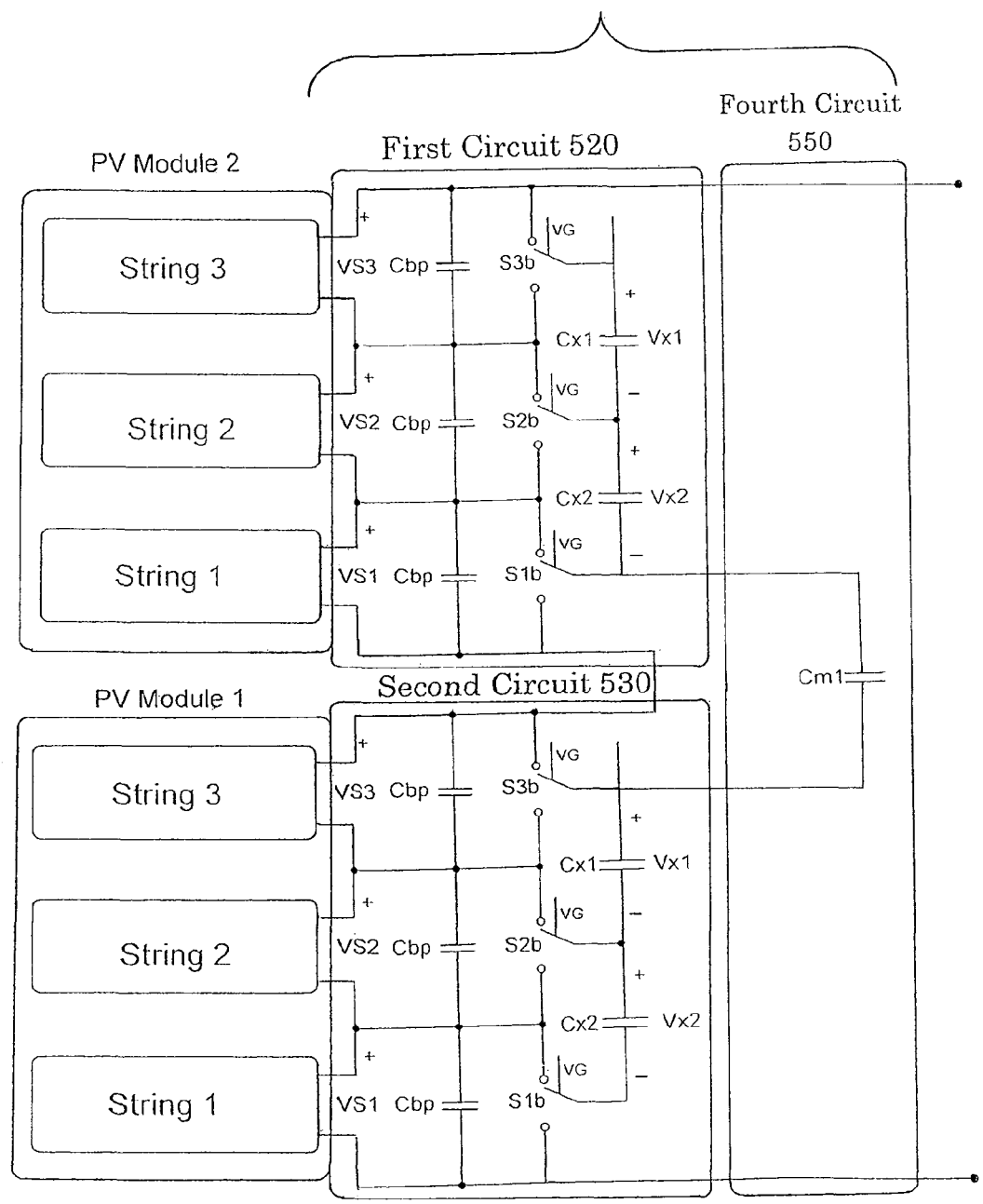
FIG. 29 shows a schematic diagram of another voltage equalization circuit having separate circuits to balance the voltages of PV modules and strings within the PV module, according to an exemplary embodiment of the invention.

FIG. 29 shows another exemplary embodiment in which the third circuit 540 of FIG. 28 is replaced with a fourth circuit 550. In FIG. 29 string 3 of PV module 1 is balanced with string 1 of PV module 2. The fourth circuit 550 requires only one additional capacitor CM1. In a practical implementation, CM1 could be integrated with the first circuit 520 or the second circuit 530. In this embodiment, an additional wire would be required to connect PV module 1 with PV module 2.

Figure 30:
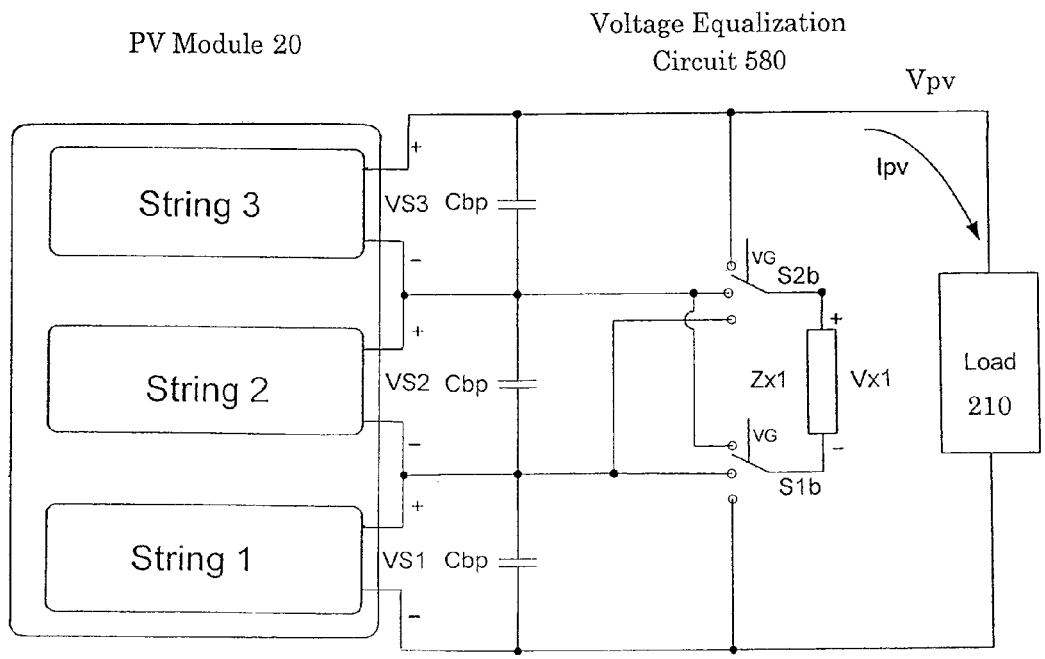
FIG. 30 shows an exemplary embodiment that uses a single energy storage device to equalize voltages among multiple PV strings.

FIG. 30 shows another exemplary embodiment in which the voltage equalization circuit 580 uses a single energy storage device Zx1. The energy storage device Zx1 is reconfigured among parallel voltage taps VS1, VS2, and VS3 to equalize the voltages VS1, VS2, and VS3 across strings 1, 2, and 3, respectively. In this embodiment, switches S1b and S2b are single pole, triple throw switches that are controlled by a signal VG. The energy storage device Zx1 may be a resonant impedance circuit, a capacitor, or any other energy storage device that stores energy as a function of voltage.

Figure 31A:
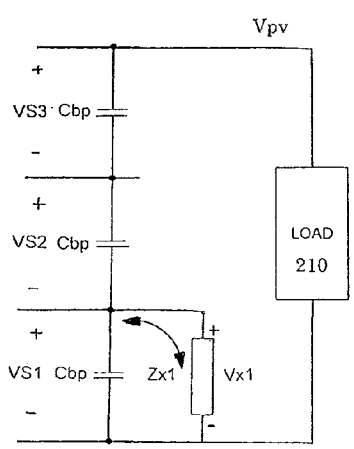
FIG. 31A shows the configuration of the voltage equalization circuit shown in FIG. 30 during Phase 1 of its operation.
Figure 31B:
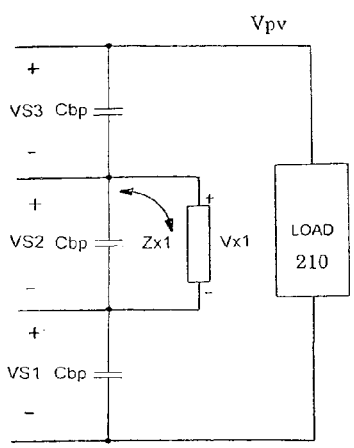
FIG. 31B shows the configuration of the voltage equalization circuit shown in FIG. 30 during Phase 2 of its operation.
Figure 31C:
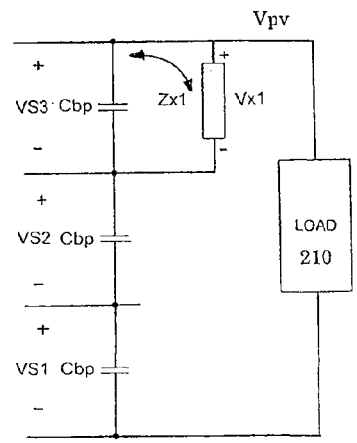
FIG. 31C shows the configuration of the voltage equalization circuit shown in FIG. 30 during Phase 3 of its operation.

As shown in FIGS. 31A-C, the voltage equalization circuit 580 operates in three phases such that the energy storage device Zx1 is configured in parallel with each of VS1, VS2, and VS3 in a single clock period. FIGS. 31A, 31B, and 31C show the configuration of the voltage equalization circuit 580 in Phase 1, Phase 2, and Phase 3, respectively. The configuration shown in FIG. 30 can be used to equalize the voltages across any number of strings. When only a single energy storage device Zx1 is used, the number of phases equals the number of strings to be equalized.

Figure 32A:
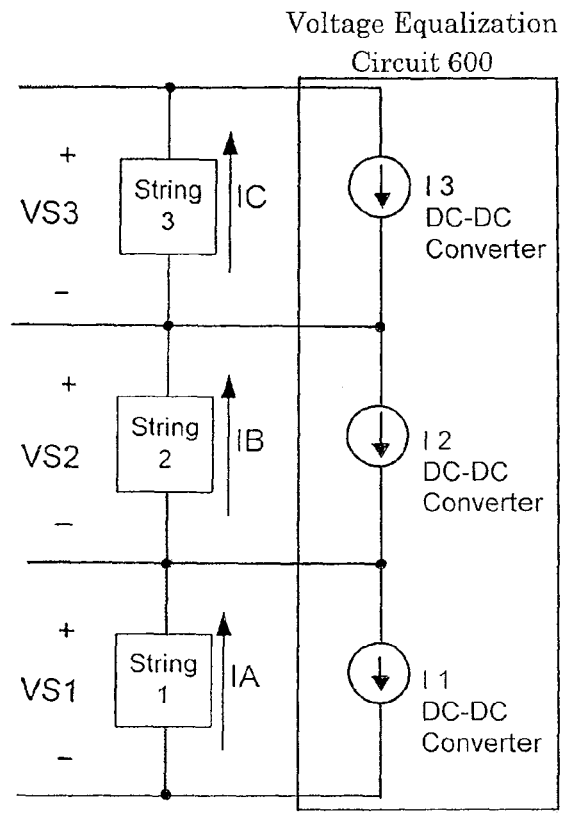
FIG. 32A shows an exemplary embodiment that uses magnetic energy storage devices within the voltage equalization circuit.

FIG. 32A shows another exemplary embodiment that uses magnetic-based DC-DC converter elements within the voltage equalization circuit 600. In the general case the DC-DC converters are represented as current sources I1, I2, and I3 in parallel with the strings 1, 2, and 3. The currents IA, IB, and IC represent the currents generated by the DC-DC converters that flow between nodes of the strings 1, 2, and 3.

Figure 32B:
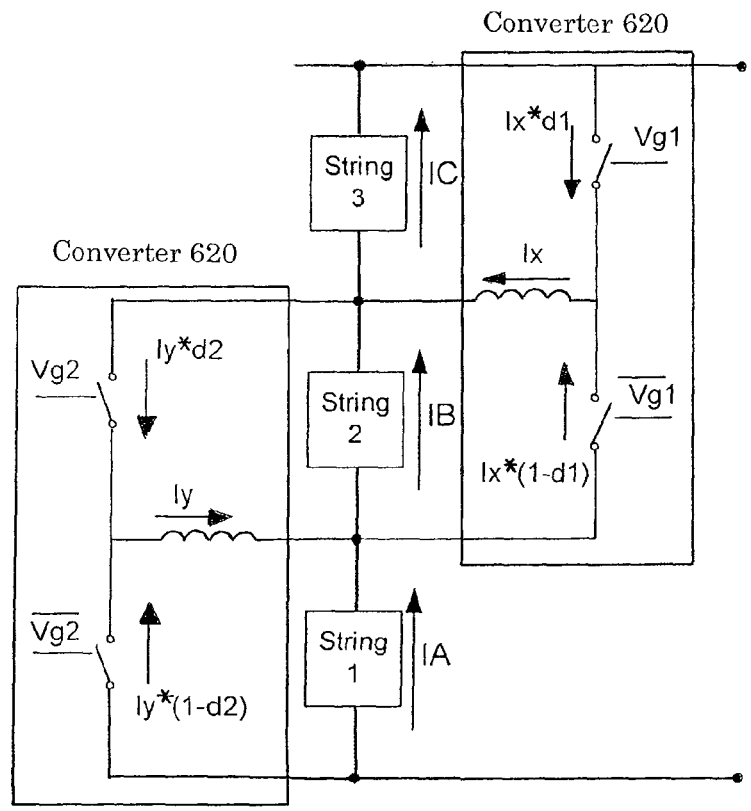
FIG. 32B shows an example of a circuit in which bi-directional (buck-boost) converters are used to create alternate current paths in parallel with the strings of a PV module.

In the example shown in FIG. 32B, bi-directional (buck-boost) converters 620 are used to create alternate current paths in parallel with the strings 1, 2, and 3. Here Ix and Iy are the currents delivered to the intermediate string nodes. Switches are controlled with signals Vg1 and Vg2 with pulse-width-modulation duty cycles d1 and d2. In steady state, the voltages across each of the strings 1, 2, and 3 are substantially equal (VS1=VS2=VS3), such that d1=d2=0.5 (the duty cycles are substantially equal to 50%). The nodal current constraints result in the following steady state equations for Ix and Iy:

$$Ix = \frac{4}{3}\left[\frac{IB+IC}{2} - IA\right] \quad (11)$$

$$Iy = \frac{4}{3}\left[-\frac{IA+IB}{2} + IC\right] \quad (12)$$

The circuit shown in FIG. 32B also has the ability to adjust any of the voltages VS1, VS2, and VS3 independently to any set of voltages within the conversion range of the DC-DC converter. Independent regulation is a function of the duty cycle of the switching waveform at Vg1 and Vg2. Unlike switched capacitor DC-DC converters, buck or boost converters can change the conversion ratio without sacrificing efficiency. This may allow the converter to force each string of cells to its individual MPV and MPP. In this case VS1, VS2, and VS3 may be substantially different if the respective MPVs are different. This ability is useful if the strings of cells are constructed from different materials, different numbers of cells, or have any other characteristic that causes differences in the MPV among strings.

Figure 33:
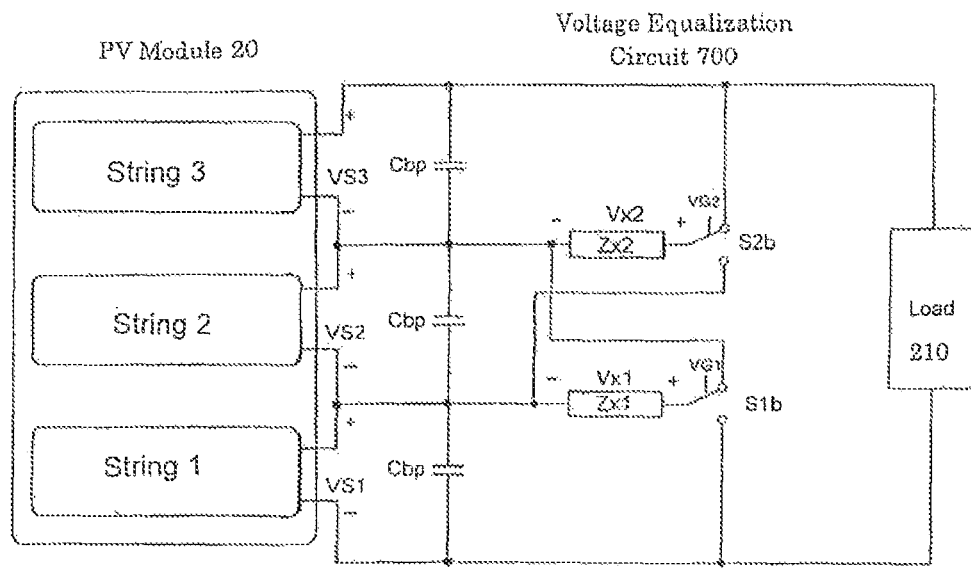
FIG. 33 shows a detailed schematic diagram of a voltage equalization circuit used in conjunction with a PV module according to another exemplary embodiment of the invention.

FIG. 33 shows a detailed schematic diagram of a voltage equalization circuit 700 in conjunction with a PV module 20 according to an exemplary embodiment of the invention. In the present embodiment, the voltage equalization circuit 700 works by dynamically modulating the configuration of energy storage devices Zx1 and Zx2 among series-connected PV strings 1, 2, and 3. The energy storage devices Zx1 and Zx2 store energy as a function of string voltage. The voltage equalization circuit 700 shown in FIG. 33 operates in the same manner and has the same characteristics as the converters 620 shown in FIG. 32B.

In some previous exemplary embodiments, exemplary energy storage devices included capacitors or series resonant networks of capacitors and inductors. Such energy storage devices block DC current and provide high impedance at low frequencies. In contrast with these previous embodiments, the energy storage devices Zx1 and Zx2 shown in FIG. 33 allow DC current to flow, and provide low impedance at low frequency. Examples of the energy storage devices Zx1 and Zx2 may include inductors, transformers, and networks consisting of inductors, capacitors, and transformers. Such networks may have a frequency-dependent impedance with resonant behavior, and may operate with parallel resonant modes, which allow DC current to flow but provide high impedance at resonant frequencies. Resonant networks may be used to provide high impedance at certain frequencies to reduce AC current flow in the energy storage devices Zx1 and Zx2. As discussed below, an example resonant network may include a parallel-connected inductor and capacitor. Additionally, the energy storage devices Zx1 and Zx2 may have mutual electromagnetic coupling, such as with primary and secondary coils on a transformer. As discussed below, magnetic coupling may be used to reduce AC current flow in the energy storage devices Zx1 and Zx2. This helps to reduce power loss in the circuit.

Figure 34A:
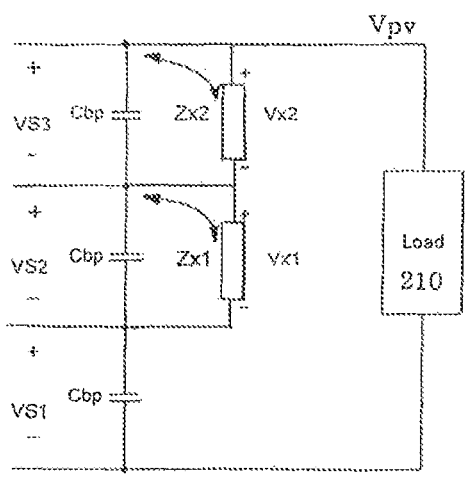
FIG. 34A shows the configuration of the voltage equalization circuit shown in FIG. 33 during Phase 1 of its operation.
Figure 34B:
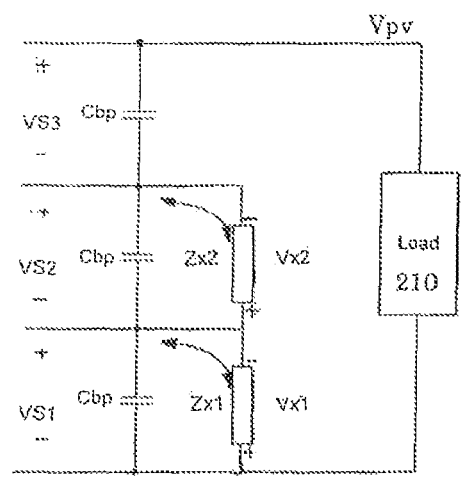
FIG. 34B shows the configuration of the voltage equalization circuit shown in FIG. 33 during Phase 2 of its operation.

As shown in FIGS. 34A and 34B, the voltage equalization circuit 700 operates in two phases controlled by a switch signal at a frequency $$f_{sw} = \frac{1}{T_{sw}},$$

where Tsw is the period of the switching signal. Phase 1 is shown in FIG. 34A and Phase 2 is shown in FIG. 34B. The switch signal drives the control signals, VG1 and VG2, for each of the single-pole, double-throw switches S1*b* and S2*b* shown in FIG. 33. The voltage equalization circuit 700 operates with a substantially 50% duty cycle, spending approximately half the time in Phase 1 and half the time in Phase 2. Voltages Vx1 and Vx2 are the differential voltages across the energy storage devices Zx1 and Zx2. In the present exemplary embodiment, the control signals VG1 and VG2 are substantially the same, although in other exemplary embodiments, the control signals VG1 and VG2 may operate independently with different frequencies, phases, duty cycles, and voltages.

In Phase 1, the first energy storage device Zx1 is configured in parallel with VS2. At the end of Phase 1, the first energy storage device Zx1 is storing energy E1. In Phase 2, the first energy storage device Zx1 is configured in parallel with VS1. At the end of Phase 2, the second energy storage device Zx2 is storing energy E2. If E1 is greater than E2, some energy is transferred from VS2 to VS1. A corresponding process occurs for the second energy storage device Zx2 in Phases 1 and 2. Assuming that energy ΔE=E1−E2 is transferred from VS2 to VS1 in every switching cycle with a period $$T_0 = \frac{1}{f_0},$$

power P=f₀ΔE is transferred on average from VS2 to VS1.

In contrast with some previous exemplary embodiments, in Phase 2, the polarity of the parallel configuration of the energy storage devices Zx1 and Zx2 changes such that the voltage across the energy storage devices Zx1 and Zx2 may be negative. In Phase 1, voltages Vx1 and Vx2 are as follows:

$$Vx1 = VS2 \quad (13)$$

$$Vx2 = VS3. \quad (14)$$

In Phase 2, voltages Vx1 and Vx2 are as follows:

$$Vx1 = -VS1 \quad (15)$$

$$Vx2 = -VS2. \quad (16)$$

If the time spent on average in Phase 1 is D·Tsw, where D is the duty cycle, and the time spent in Phase 2 is (1−D)·Tsw, then the average voltages across energy storage devices Zx1 and Zx2 are:

$$\text{average}(Vx1) = D \cdot VS2 - (1-D) \cdot VS1 \quad (17)$$

$$\text{average}(Vx2) = D \cdot VS3 - (1-D) \cdot VS2. \quad (18)$$

Here, the average is taken over a time period equal to Tsw or an integer multiple of Tsw when the circuit is in steady state. If the duty cycle D is substantially 0.5 (or 50%), and VS1, VS2, and VS3 are substantially equal, then the average voltages across the energy storage devices Zx1 and Zx2 are substantially zero. With the average voltages Vx1 and Vx2 substantially zero, no DC current is induced to flow in the energy storage devices Zx1 and Zx2. In general, no DC current may be induced to flow for conditions that result in average(Vx1)=0 or average(Vx2)=0, as governed by the equations above. However, if average(Vx1)≠0 or average(Vx2)≠0, then DC current may be induced to flow through the energy storage devices Zx1 and Zx2. Given this assumption, if D=0.5, DC current may be induced to flow if VS1≠VS2 or VS2≠VS3. DC current may also be induced to flow for combinations of D, VS1, and VS2 that result in non-zero average voltage as governed by the above equations.

In an exemplary embodiment of the invention, the energy storage devices Zx1 and Zx2 may consist of inductors. Inductors have an impedance $Z_L$ with a magnitude $|Z_L|=2\pi fL$, where L is the inductance and f is the frequency. The impedance $Z_L$ is proportional to the frequency f, but approaches zero when the frequency f is zero (DC). FIG. 35A shows a schematic diagram of the inductance L, the current $I_L$, and the voltage $V_L$ of an inductor. FIG. 35B shows the time-domain waveform of the voltage $V_L$ across an inductor, and FIG. 35C shows the corresponding current $I_L$ through the inductor. The voltage $V_L$ is a square wave with amplitude Va, period Tsw, and duty cycle D=0.5. The current $I_L$ through the inductor follows the standard time-domain relationship:

$$I_L = \frac{1}{L}\int V_L dt. \quad (19)$$

The integral of the square-wave voltage $V_L$ in FIG. 35B results in a triangle-wave current $I_L$ through the inductor, as shown in FIG. 35C. The current waveform $I_L$ is at the same frequency as the voltage $V_L$, but is shifted by 90° in phase. Because the DC voltage of $V_L$ is zero, the DC current through the inductor is zero. This assumes the initial conditions of the integral in Equation 19 above are such that the current $I_L$ at time zero is zero amps. The peak-to-peak amplitude of the current waveform is $$Irip = \frac{Va \cdot D \cdot Tsw}{L}, \quad (20)$$

which is referred to as the ripple current in the inductor.

FIG. 36 shows an exemplary embodiment in which the energy storage devices Zx1 and Zx2 consist of inductors Lx1 and Lx2, respectively. Following the description of FIG. 33, the inductors Lx1 and Lx2 are configured by switches S1$b$ and S2$b$ that are controlled by control signals VG1 and VG2, respectively. With a nominal duty cycle of D=0.5 and assuming that VS1, VS2, and VS3 are substantially equal, the average voltages Vx1 and Vx2 across the inductors Lx1 and Lx2 are substantially zero. In this case, no DC current is induced to flow in inductors Lx1 and Lx2. However, if any of VS1, VS2, and VS3 are different, the average voltage across inductors Lx1 and Lx2 will be nonzero, and a DC current will be induced to flow according to $$I_L = \frac{1}{L}\int V_L dt.$$

The current through each of the inductors Lx1 and Lx2 will increase until the voltage across the respective inductor is zero. At this point the inductor will maintain the DC current that has accumulated as long as the average voltage remains at zero volts.

Theoretically, the current in an inductor can increase without bound if the voltage across the inductor remains at a non-zero average value. In practice, the PV strings 1, 2, and 3 present a nonlinear impedance in series with the current flow through the inductors Lx1 and Lx2. As the current increases through one of the inductors Lx1 or Lx2, a voltage will build up to oppose the average voltage across the inductor. In this way, the impedance of the PV strings 1, 2, and 3 provides negative feedback to force the average voltage across the inductor to zero. Additional mechanisms that prevent the current from increasing without bound include parasitic resistance in the inductors Lx1 and Lx2 and the switches S1$b$ and S2$b$. As current builds up in one of the inductors, the voltage drop across the parasitic resistance counteracts the DC voltage across the inductor. This allows the network consisting of the inductor and its respective switch, such as inductor Lx1 and switch S1$b$, to sustain a net non-zero DC voltage. In practice, the parasitic resistance of the inductor and switch is small, on the order of 10 mΩ to 100 mΩ, such that any DC voltage drop across the inductor and switch is small relative to the string voltages VS1, VS2, and VS3.

Figure 37:
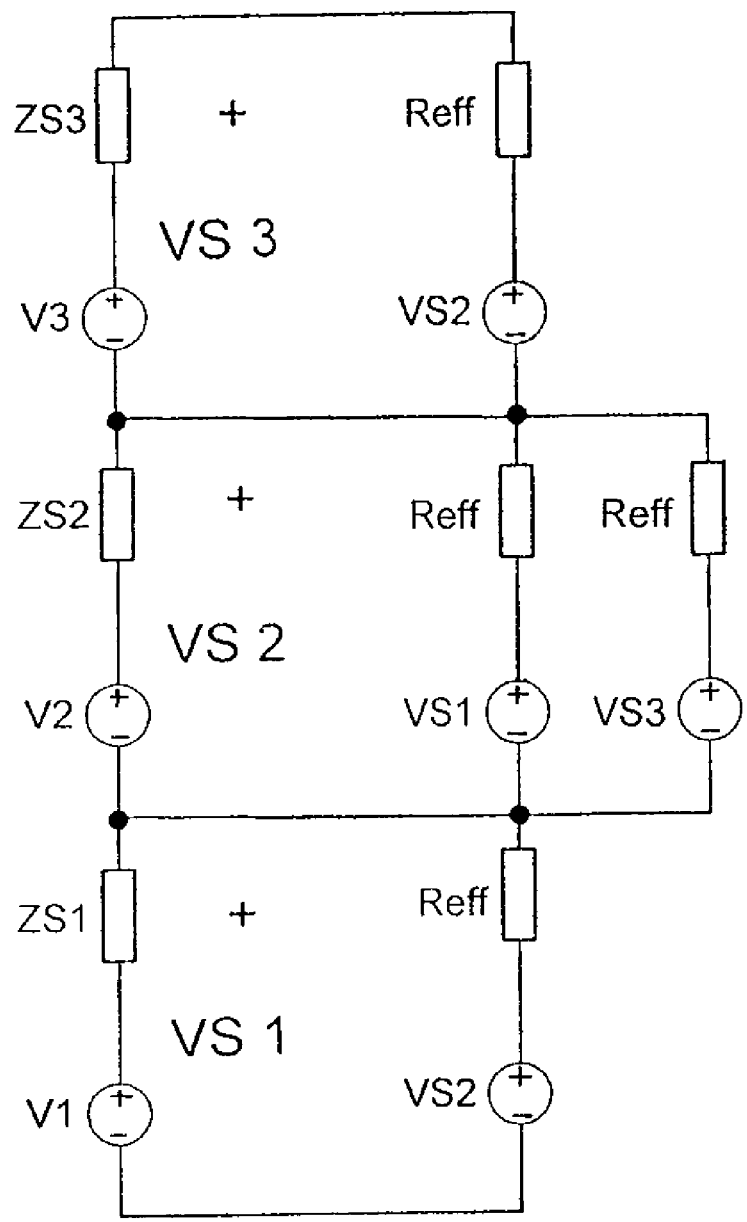
FIG. 37 shows an equivalent behavioral circuit of the voltage equalization circuit shown in FIG. 33.

An equivalent behavioral circuit 710 that represents the behavioral action of the voltage equalization circuit 700 is shown in FIG. 37. Here VS1, VS2, and VS3 are the voltages across the strings 1, 2, and 3 of the PV module 20, respectively. ZS1, ZS2, and ZS3 represent the nonlinear impedance of the strings 1, 2, and 3, respectively.

The quantity Reff is an effective resistance that is created by the voltage equalization circuit 700 shown in FIGS. 33 and 36. The equivalent behavioral circuit 710 of the voltage equalization circuit 700 shown in FIG. 37 includes effective voltage sources VS1, VS2, and VS3 that are shown in series with Reff. These effective voltage sources VS1, VS2, and VS3 and Reff are modeled in parallel with terminals connecting to the strings 1, 2, and 3. For example, VS1 in string 1 is placed in parallel with VS2 from string 2 and in series with Reff. If Reff is small relative to impedances ZS1-ZS3, then voltages VS1-VS3 will be forced substantially equal. The equalization process happens due to the feedback inherent in the circuits of FIGS. 33, 36, and 37. In practice, Reff is proportional to the parasitic resistance of the respective inductor and switch, on the order of 10 mΩ to 100 mΩ, and the real part of impedances ZS1-ZS3 may be on the order of several ohms.

To first-order, power loss in the voltage equalization circuit 700 is related to the equivalent resistance Reff. Assuming that the differences among voltages VS1, VS2, and VS3 are small, the differences in current among the strings 1, 2, and 3 will flow through the voltage equalization circuit 700. Power loss will follow according to $P_{loss-branch} = I_{Branch}^2 \cdot R_{branch}$, where $I_{Branch}$ is the current in a branch of the voltage equalization circuit 700 and $R_{Branch}$ is the equivalent resistance of that branch. Here $R_{Branch}$ may be equal to Reff. The power loss may also be expressed as $P_{loss-branch} = I_{Branch}^2/R_{branch}$, where $V_{Branch}$ is the voltage difference between adjacent strings of PV cells. A smaller Reff will result in a smaller $V_{Branch}$ and a lower power loss. Therefore it may be advantageous to design the voltage equalization circuit 700 to reduce Reff as much as possible.

For example, consider a case in which String 1 is shaded relative to String 2 and String 3 in FIG. 36. Assume that under maximum power conditions with each string operating at 10V, String 2 and String 3 each have 10 A available and produce 100 W, while String 1 has 5 A available and produces 50 W. Assume that control signals VG1 and VG2 are the same and operate with 50% duty cycle. Assume that the load 210 performs MPP tracking on the series configuration of strings 1, 2, and 3 and operates the total system voltage to 30V. In this case, the circuit of FIG. 36 will operate to force the string voltages VS1-VS3 substantially equal. Current will flow through the inductors Lx1 and Lx2 to force the string voltages VS1-VS3 substantially equal.

Consider the circuit in FIG. 36 consisting of S1$b$, Lx1, VS1, and VS2. Because the average or DC voltage across an inductor must be zero in steady-state, this implies that:

$$VS1 = \frac{D}{1-D} VS2 \quad (21)$$

With D=0.5, this means that VS1=VS2. With the same conditions and assumptions, the circuit consisting of S2$b$, Lx2, VS2, and VS3 will force VS2=VS3. Therefore, the constraint that the average voltage across the inductor must be zero implies that the circuit of FIG. 36 will force the string voltages VS1-VS3 equal.

Figure 38B:
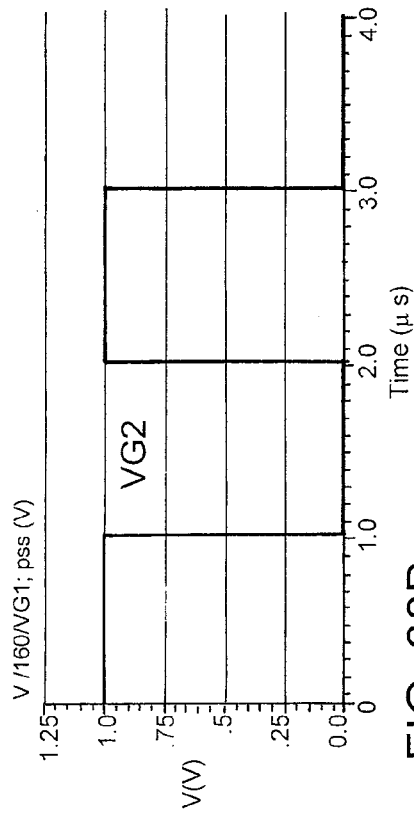
FIG. 38B shows a simulated waveform of the control signal for the second inductor in the circuit shown in FIG. 36.
Figure 38D:
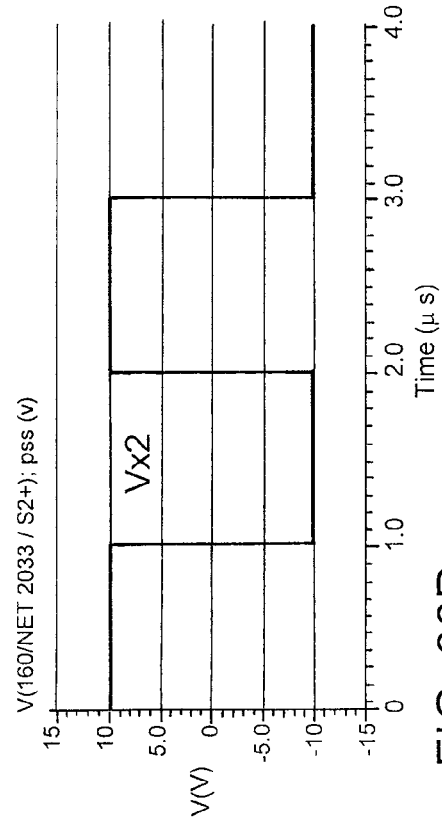
FIG. 38D shows a simulated waveform of the differential voltage across the second inductor in the circuit shown in FIG. 36.
Figure 38A:
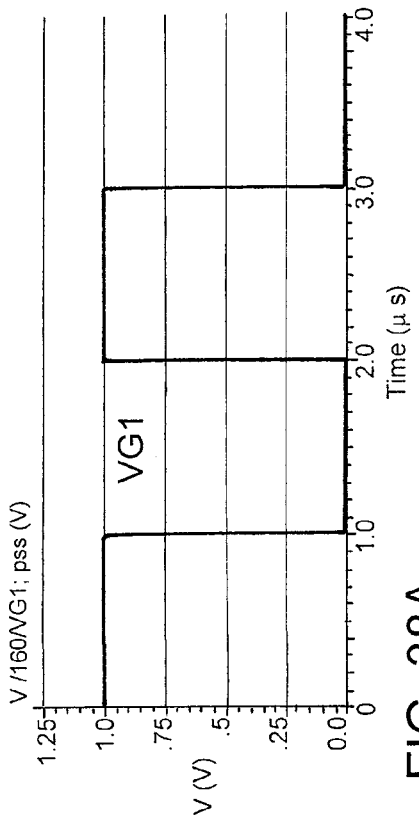
FIG. 38A shows a simulated waveform of the control signal for the first inductor in the circuit shown in FIG. 36.
Figure 38C:
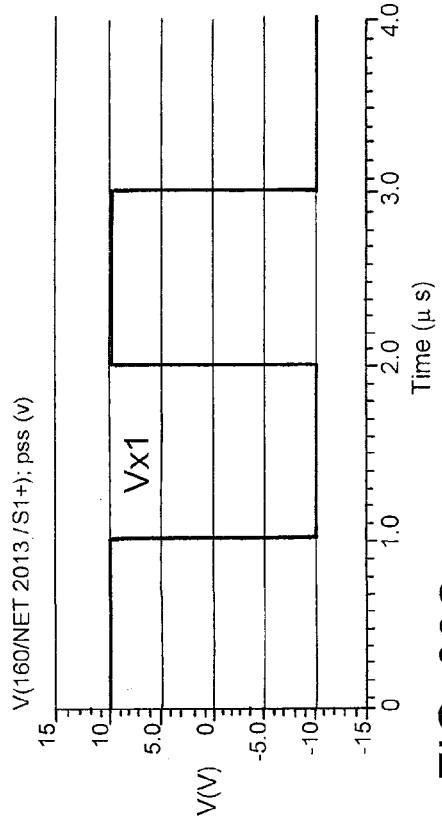
FIG. 38C shows a simulated waveform of the differential voltage across the first inductor in the circuit shown in FIG. 36.
Figure 38F:
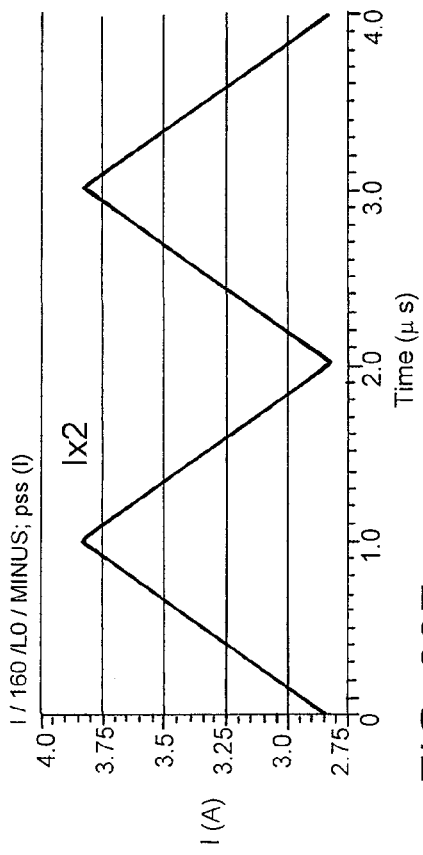
FIG. 38F shows a simulated waveform of the current through the second inductor in the circuit shown in FIG. 36.
Figure 38E:
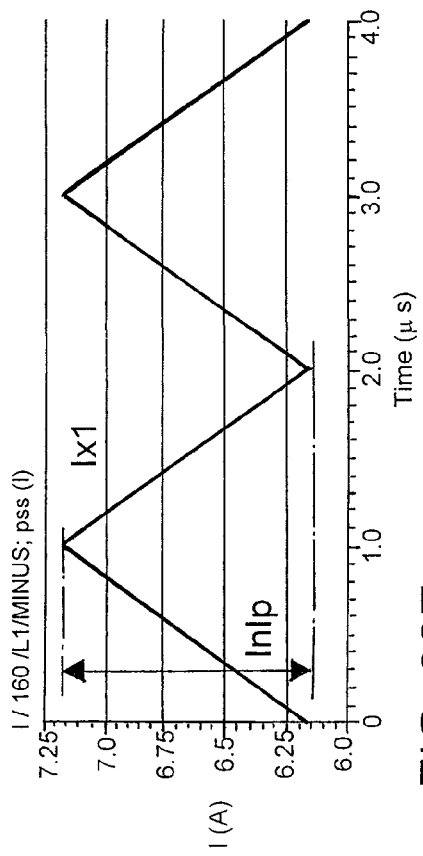
FIG. 38E shows a simulated waveform of the current through the first inductor in the circuit shown in FIG. 36.

FIGS. 38A-38F show steady-state time-domain waveforms from simulating the circuit shown in FIG. 36 with the above conditions. Here the switching period Tsw is 2 μs and the inductance L of Lx1 and Lx2 is 10 μH. In Phase 1, the inductors Lx1 and Lx2 are configured in parallel with string 2 and string 3, respectively. In Phase 2, the inductors Lx1 and Lx2 are configured in parallel with string 1 and string 2, respectively. In Phase 1 the voltages across Lx1 and Lx2 are VS2 and VS3, respectively. In Phase 2 the voltages across Lx1 and Lx2 are −VS1 and −VS2, respectively. Currents Ix1 and Ix2 are the currents through the inductors Lx1 and Lx2 flowing from positive to negative (or into the polarity dot) as indicated in FIG. 36. The DC component of currents Ix1 and Ix2 must be non-zero in steady state to force the string voltages VS1-VS3 equal. As shown in FIGS. 38E-38F, the DC component of Ix1 is 6.66 A and the DC component of Ix2 is 3.33 A. In general the currents through the inductors follow relationships:

$$Ix1 = \frac{4}{3}\left[\frac{IB + IC}{2} - IA\right] \quad (22)$$

$$Ix2 = \frac{4}{3}\left[-\frac{IA + IB}{2} + IC\right] \quad (23)$$

where IA is the current supplied from String 1, IB is the current supplied from String 2, and IC is the current supplied from String 3. Equations (22) and (23) are identical to Equations (11) and (12) discussed above with regard to FIG. 32B. The total current supplied to the load 210 in FIG. 36 is the average of the currents supplied by Strings 1-3:

$$IPV = \frac{IA + IB + IC}{3}. \quad (24)$$

Non-idealities result from series resistance in the inductor and its respective switch. Series resistance results in a voltage drop across the switch and inductor when current flows in the inductor. The voltage drop results in a deviation of actual performance from the expressions above. In practice the series resistance is small such that voltage drops are negligible compared to the string voltages VS1-VS3. For example, with a series resistance of the inductors of 5 nm, a switch resistance of 5 mΩ, and a current Ix1 of 10 A, the voltage deviation at VS1 is 100 mV, which is 1% of the nominal string voltage VS1 of 10V. Series resistance also results in power loss in the circuit. With the values above, the power loss is 1 W in the inductor and its respective switch. This power loss is small compared to a nominal string power of 50 W to 100 W.

Figure 39A:
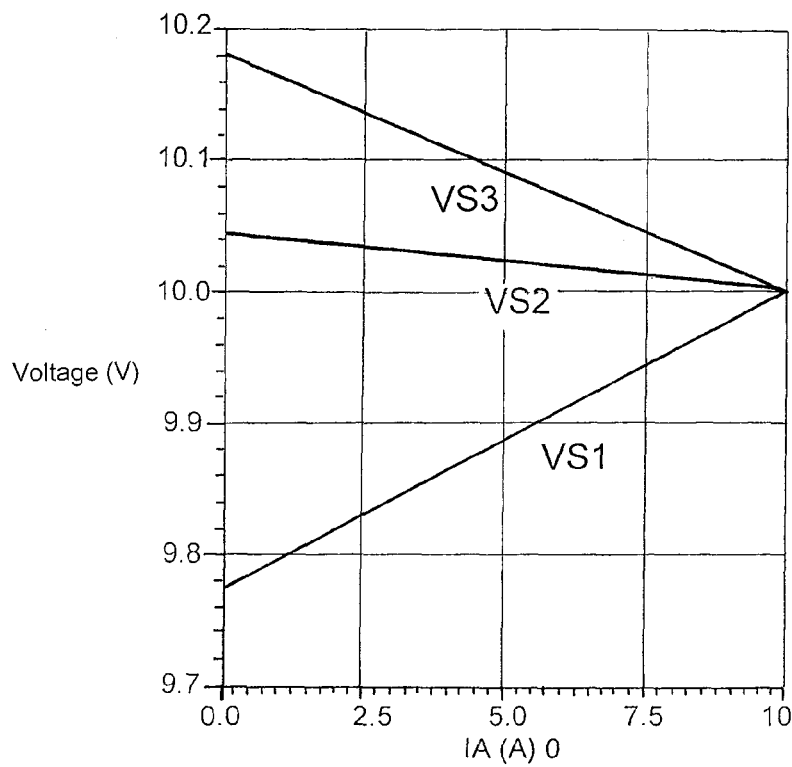
FIG. 39A shows simulated waveforms for the string voltages of the circuit shown in FIG. 36 when string 1 is shaded and strings 2 and 3 are unshaded.
Figure 39B:
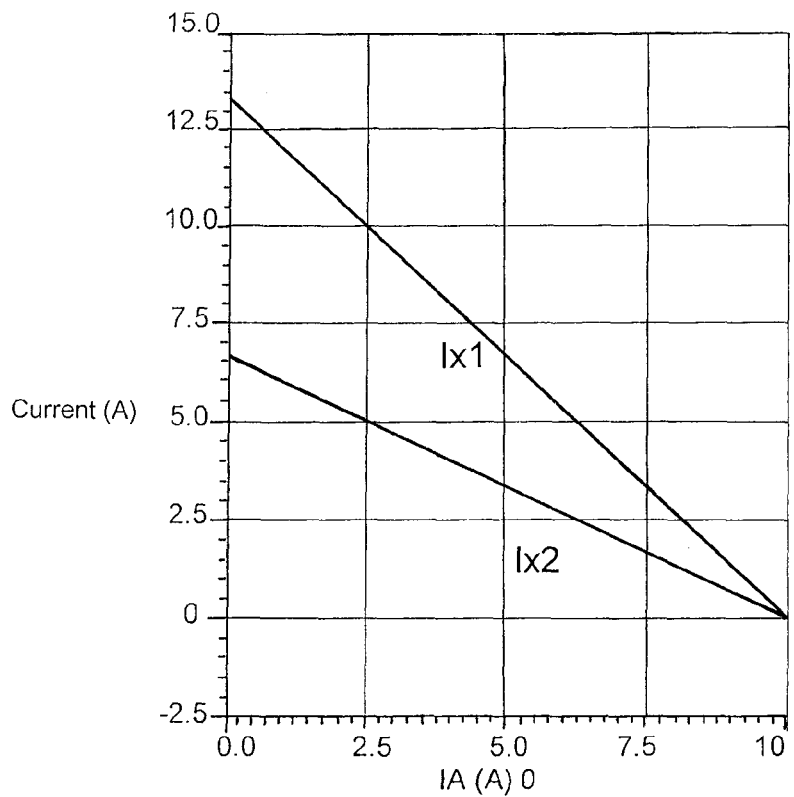
FIG. 39B shows simulated waveforms for the currents through the inductors shown in FIG. 36 when string 1 is shaded and strings 2 and string 3 are unshaded.

FIGS. 39A and 39B plot the results of simulating the circuit shown in FIG. 36 while varying the amount of shading of String 1 relative to String 2 and String 3. In the previous example, String 1 had 5 A available at 10V, while Strings 2 and 3 had 10 A available at 10V. In FIGS. 39A and 39B, the x-axis is the amount of current IA available from String 1 when the voltage is substantially equal to 10V. FIG. 39B shows the currents Ix1 and Ix2 versus IA. Here, only the DC components are shown so FIGS. 39A and 39B do not include ripple current. This is consistent with the above expressions for the currents Ix1 and Ix2. FIG. 39B shows the string voltages VS1-VS3. The string voltages VS1-VS3 are forced substantially equal to 10V, with deviations due to parasitic resistance in the inductors and their respective switches. When IA is smaller, indicating more shading of String 1, the string voltages VS1-VS3 show more deviation from being equal. This is because more current must flow in the inductors and switches, resulting in a higher voltage drop among the string voltages VS1-VS3.

As discussed above, FIGS. 38A-38F show time-domain current waveforms in the inductors Lx1 and Lx2. Here, the peak-to-peak ripple current is 500 mA, resulting from Tsw=2 μS, D=0.5, and Lx1=Lx2=10 μH. Inductor ripple current Irip is important in considering power loss. Ripple current Irip flows through the inductor and its respective switch, resulting in power loss due to series resistance. However, only the DC current is useful to balance the DC voltages. Therefore, it is desirable to minimize ripple current Irip to reduce power loss in the circuit. The mean-squared current for the waveform in FIG. 35C is $$\text{average } (I_L^2) = \frac{Irip^2}{12} + Idc^2,$$

where the power loss is proportional to this quantity. It is desirable to have low ripple current Irip relative to the DC current. For the case where strings of cells are not shaded or mismatched, it is even more important to have low ripple current Irip. In this case the DC current through the inductors may be near zero, and losses are mostly due to the ripple current Irip. With a total series resistance of 10 mΩ, the power loss due to the ripple current Irip in the previous example is 0.83 mW. With a lower switching frequency and a smaller inductance, the ripple current Irip can increase, leading to higher power losses.

AC current or ripple current Irip in energy storage devices Zx1 and Zx2 shown in FIG. 33 can result in undesired power loss in the voltage equalization circuit 700. Ripple current Irip is also associated with high frequency content in interconnect in the voltage equalization circuit 700, and can lead to higher spectral emissions and coupling high frequency noise into sensitive analog signals. An exemplary embodiment of the invention proposes to reduce the ripple current Irip in the energy storage devices Zx1 and Zx2 through special magnetic coupling of the energy storage devices Zx1 and Zx2.

Figure 40:
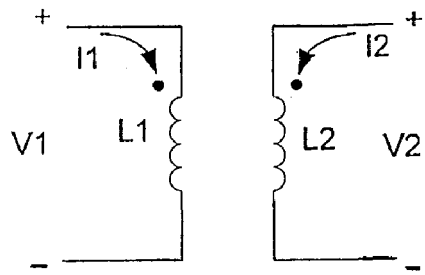
FIG. 40 shows inductors that are magnetically coupled.

FIG. 40 shows inductors L1 and L2 that are magnetically coupled together. In this case the magnetic coupling is like that of a transformer circuit element. In FIG. 40, L1 and L2 are inductors; V1 and V2 are the voltages across the inductors L1 and L2, respectively; and I1 and I2 are the currents flowing into the polarity dot of inductors L1 and L2, respectively. With perfect coupling and the inductance of L1 being equal to the inductance of L2, the circuit of FIG. 40 is an ideal transformer with a one-to-one turns ratio. Equations governing the performance of the circuit are V1=V2 and I1=−I2.

Figure 41:
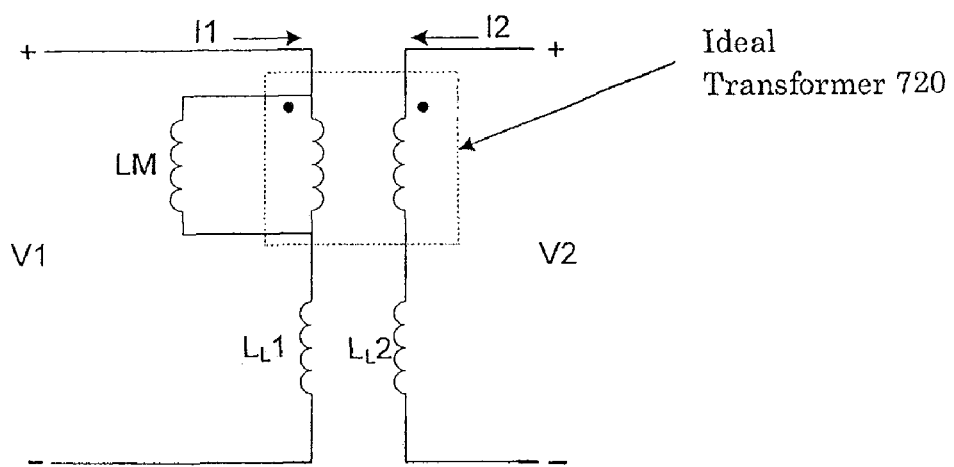
FIG. 41 shows an ideal model for inductors that are magnetically coupled that captures the effects of leakage inductance and finite magnetizing inductance.

FIG. 41 shows a realistic model of the coupled inductors L1 and L2 shown in FIG. 40. The realistic model captures the effects of the finite inductance of the inductors L1 and L2, and imperfect coupling between the inductors L1 and L2. The realistic model consists of an ideal transformer 720 in parallel with magnetizing inductance LM. LM represents the inductance seen from V1 if V2 is open-circuited. The model also includes leakage inductance, which occurs due to magnetic flux from the primary winding that does not link with the secondary winding and vice versa. The effect of this leakage flux is modeled as inductors $L_L1$ and $L_L2$ in series with the primary and secondary terminals. In this embodiment, the leakage inductors $L_L1$ and $L_L2$ are used as the energy storage devices Zx1 and Zx2 as in FIG. 33. The ideal transformer 720 is used to couple the AC signal between Vx1 and Vx2 to reduce the AC ripple current hip in the branches containing the inductors $L_L1$ and $L_L2$.

Figure 42:
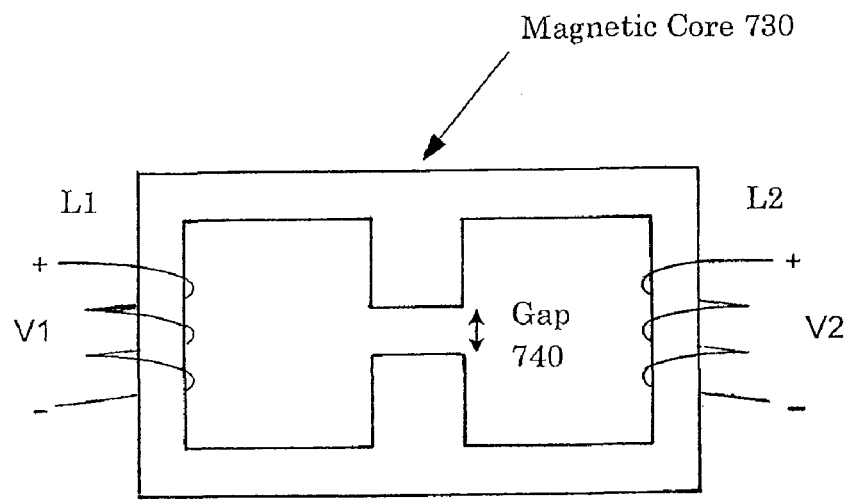
FIG. 42 shows a physical representation of a structure that operates like the circuit in FIG. 41, and includes a magnetic core with multiple sets of windings and a gap to control the leakage inductance.

FIG. 42 shows an example of a physical structure that provides coupling between the inductors L1 and L2. Here primary and secondary windings are wound on a magnetic core 730. The magnetic core 730 may be made of various materials with ferromagnetic properties, such as iron, ferrite, and other magnetic materials. Here, the primary and secondary windings have the same number of turns and are linked with the magnetic core 730. A gap 740 is indicated in FIG. 42 to provide a well-controlled path for leakage flux. As discussed above, leakage flux is magnetic flux that does not link the primary and secondary windings. The leakage inductors $L_L1$ and $L_L2$ that model the effects of the leakage flux can be well specified by controlling the size of the gap 740 in the magnetic core 730.

Figure 43:
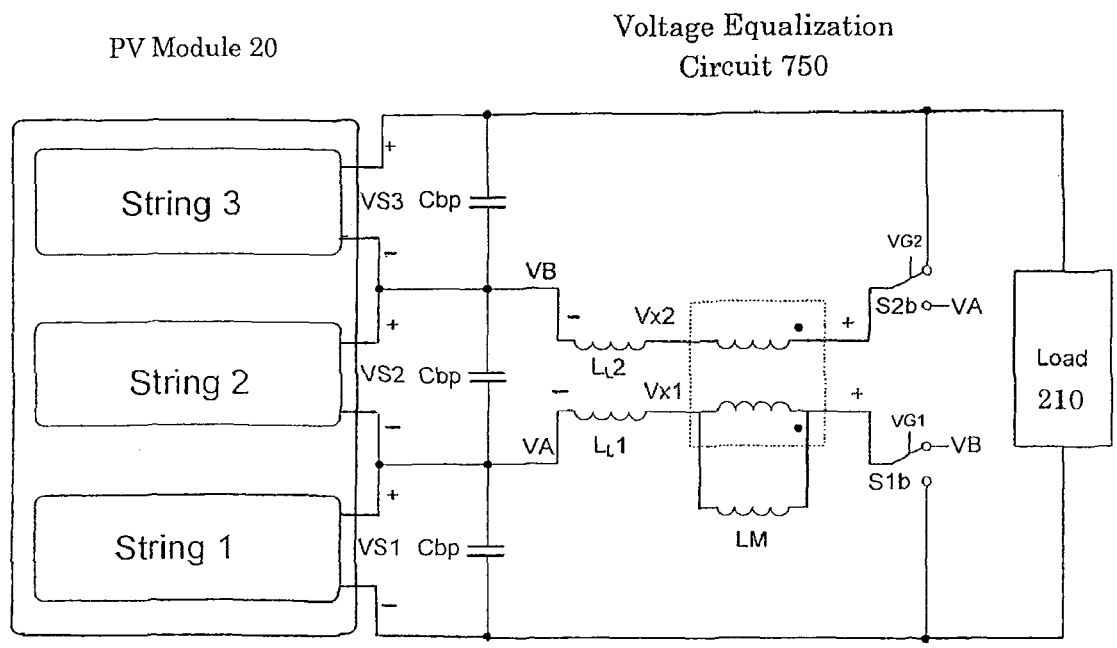
FIG. 43 shows a detailed schematic diagram of a voltage equalization circuit used in conjunction with a PV module according to another exemplary embodiment of the invention.

In this exemplary embodiment, the inductors Lx1 and Lx2 are magnetically coupled as indicated by the polarity dot in FIG. 36. A model for the resulting circuit is shown in FIG. 43. Here Lx1 and Lx2 are modeled as inductors $L_L1$ and $L_L2$ and an ideal transformer with parallel magnetizing inductance LM, similar to the configuration shown in FIG. 41. Switches S1b and S2b operate to configure the parallel arrangement of the inductors Lx1 and Lx2. Nodes VA and VB are labeled for convenience in drawing the schematic. As before, the DC component of voltages Vx1 and Vx2 must be zero to prevent the DC current from increasing without limit in $L_L1$ and $L_L2$. With a duty cycle D=0.5 of the switching waveforms of the control signals VG1 and VG2, this enforces the string voltages VS1-VS3 to be substantially equal.

With control signals VG1 and VG2 operating with substantially the same timing and the string voltages VS1-VS3 being substantially equal, Vx1 and Vx2 will be substantially the same. In this case, the AC current waveforms are 180° out of phase due to the polarity of the magnetic coupling. Since the ripple current Irip is of the opposite phase, the net ripple current hip in each of $L_L1$ and $L_L2$ will be cancelled. Full ripple current cancellation will occur for a 50% duty cycle assuming that the magnetizing inductance LM is infinite. In practice, LM is finite and may be in the range of several hundred micro-henries to several milli-henries. With a finite LM, the ripple current Irip is not completely cancelled, but is still reduced substantially.

Figure 44:
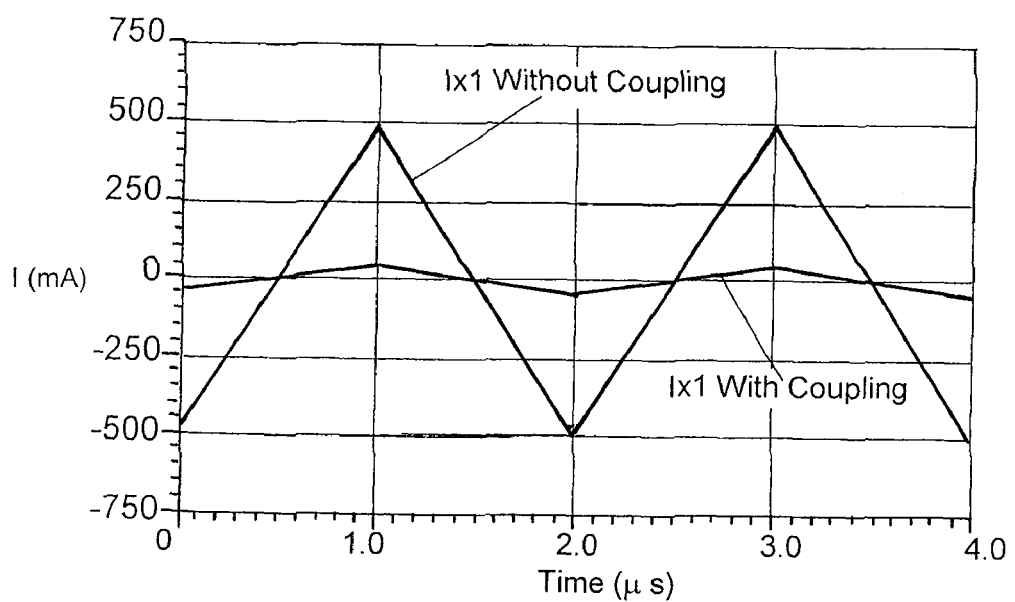
FIG. 44 shows the current through the energy storage devices in the circuit shown in FIG. 43.

FIG. 44 shows a time domain plot of a simulation of the voltage equalization circuit 750 shown in FIG. 43 with LM=100 µH, $L_L1=L_L2=10$ µH, Tsw=2 µs, VS1=VS2=VS3=10V, and all strings operating with 10 A of current available at 10V. FIG. 44 shows examples with magnetic coupling and without magnetic coupling. Without magnetic coupling, the ripple current hip is 1 A peak-to-peak. With magnetic coupling the ripple current hip is 100 mA peak-to-peak, showing a tenfold reduction.

Figure 45:
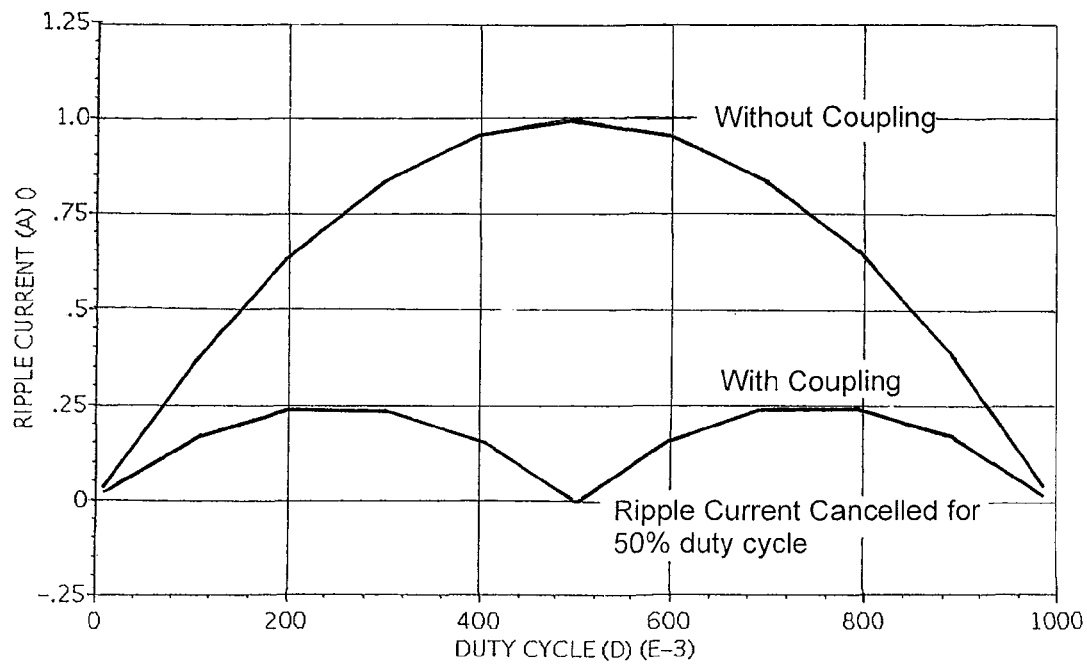
FIG. 45 shows the current through the energy storage devices in the circuit shown in FIG. 43 with an infinite magnetic inductance.

FIG. 45 shows examples of the peak-to-peak ripple current hip with coupling and without coupling for the same conditions as FIG. 44, except that LM is infinite. Also, in FIG. 45, the x-axis is the duty cycle D. It is seen that for a 50% duty cycle (D=0.5), the ripple current hip is effectively cancelled compared to a 1 A peak-to-peak ripple current hip for the case without coupling. At other duty cycles, the ripple current hip is not fully cancelled but is substantially reduced.

Figure 46:
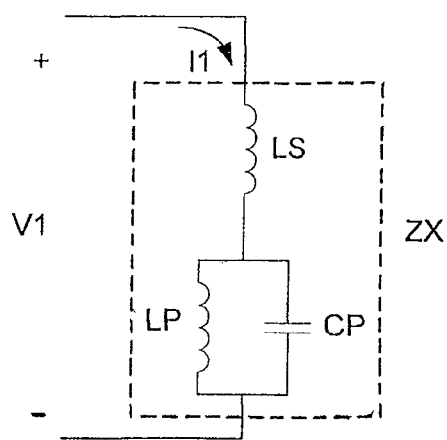
FIG. 46 shows an energy storage device that includes a parallel resonant mode of operation according to an exemplary embodiment of the invention.

In an exemplary embodiment of the invention, the energy storage devices Zx1 and Zx2 include networks of energy storage elements that may operate with resonant modes. FIG. 46 shows a network consisting of inductors LS and LP, and capacitor CP. The configuration shown in FIG. 46 provides an impedance ZX such that $$ZX = \frac{V1}{I1},$$

where V1 is the voltage across the network and I1 is the current through the network. In terms of LS, LP, and CP, the magnitude of the impedance ZX is written as:

$$|ZX| = \left| jwLS + \frac{jwLP}{1 - w^2 LP \cdot CP} \right|, \quad (25)$$

where w is the frequency and $j=\sqrt{-1}$.

Figure 47A:
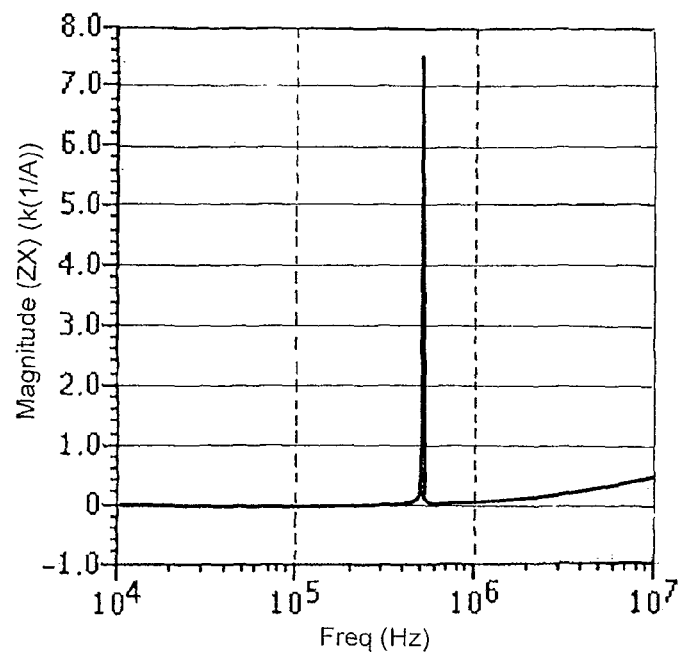
FIG. 47A shows the magnitude of the impedance through the energy storage device in FIG. 46.
Figure 47B:
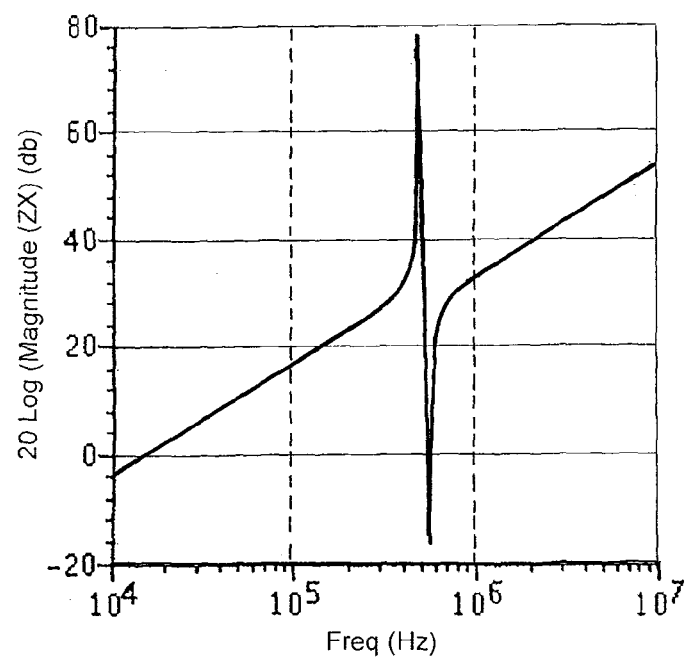
FIG. 47B shows the magnitude of the impedance through the energy storage device in FIG. 46 plotted in decibels.

It is seen in the above equation that the network in FIG. 46 includes a parallel resonant mode. When $$w = \frac{1}{\sqrt{LP \cdot CP}},$$

the resonant frequency of the network, the impedance ZX approaches infinity. In practice, the maximum impedance at resonance is limited by parasitic loss elements that limit the quality factor Q of the network. If LS, LP, and CP are chosen to achieve a high quality factor Q, then the impedance at resonance can be significantly less than the impedance without resonance. FIGS. 47A and 47B show plots of the magnitude of the impedance ZX versus frequency for LS=7.5 µH, LP=2.5 µH, and CP=40 nF. To model realistic loss elements, 5 mΩ resistors are placed in series with LS and LP. FIG. 47A shows the quantity |ZX| and FIG. 47B shows the quantity 20 Log|ZX|, which is the same quantity plotted in decibels. The circuit has a parallel resonant frequency at 500 MHz and provides an impedance over 7 kΩ at this frequency. The DC impedance is 10 mΩ, which is just the total resistance modeled in series with LS and LP. Outside of the frequency range where the circuit is resonant, the impedance appears inductive.

In an exemplary embodiment of the invention, the energy storage devices Zx1 and Zx2 are resonant networks, as shown in FIG. 46. The time-domain voltage waveforms are the same as in FIG. 33, but the switching frequency $$fsw = \frac{1}{Tsw}$$

occurs at a parallel resonant frequency of the impedance of the energy storage device Zx1 or Zx2. As shown in FIGS. 47A and 47B, the impedance is high at the resonance frequency, such that less AC current flows through the energy storage devices Zx1 and Zx2 at the switching frequency fsw. If the energy storage devices Zx1 and Zx2 have only a single parallel resonant frequency as in FIG. 46, then only current at the switching frequency fsw is reduced. Harmonics of the switching frequency fsw may still flow through the energy storage devices Zx1 and Zx2. However, the energy storage devices Zx1 and Zx2 can have multiple parallel resonant frequencies by adding parallel resonant components. If more than one resonant mode is included, it can be used to block current at harmonic frequencies of the switching frequency fsw.

Figure 48:
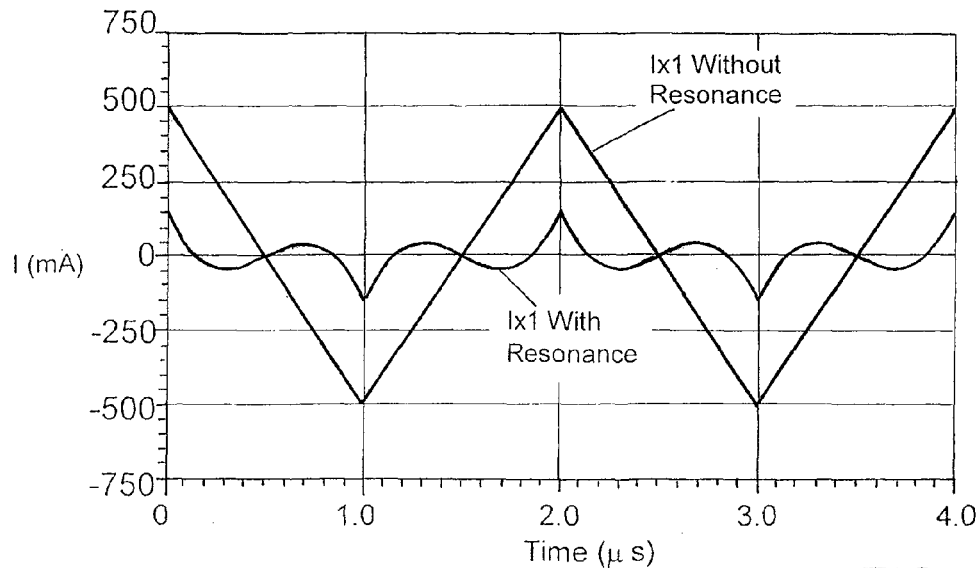
FIG. 48 shows a time domain simulation of the current through the energy storage device shown in FIG. 33, comparing the case with a parallel resonant mode to the case without a parallel resonant mode.

FIG. 48 shows time domain waveforms of the current IX1 through the energy storage device Zx1. The waveform with resonance shows the results when the energy storage device Zx1 is replaced with the network in FIG. 46. Here, LS=7.5 µH, LP=2.5 µH, and CP=40 nF. This is compared to the case where LS=7.5 µH, LP=2.5 µH, and CP=0, which provides a total series inductance of 10 µH, but without resonance. In the plot of IX1 without resonance, the peak-to-peak ripple current is substantially 1 A. In the plot of IX1 with resonance, the peak-to-peak ripple current is substantially 300 mA. In this example, the peak to peak ripple current is reduced by a factor of approximately 3.3.

Figure 49:
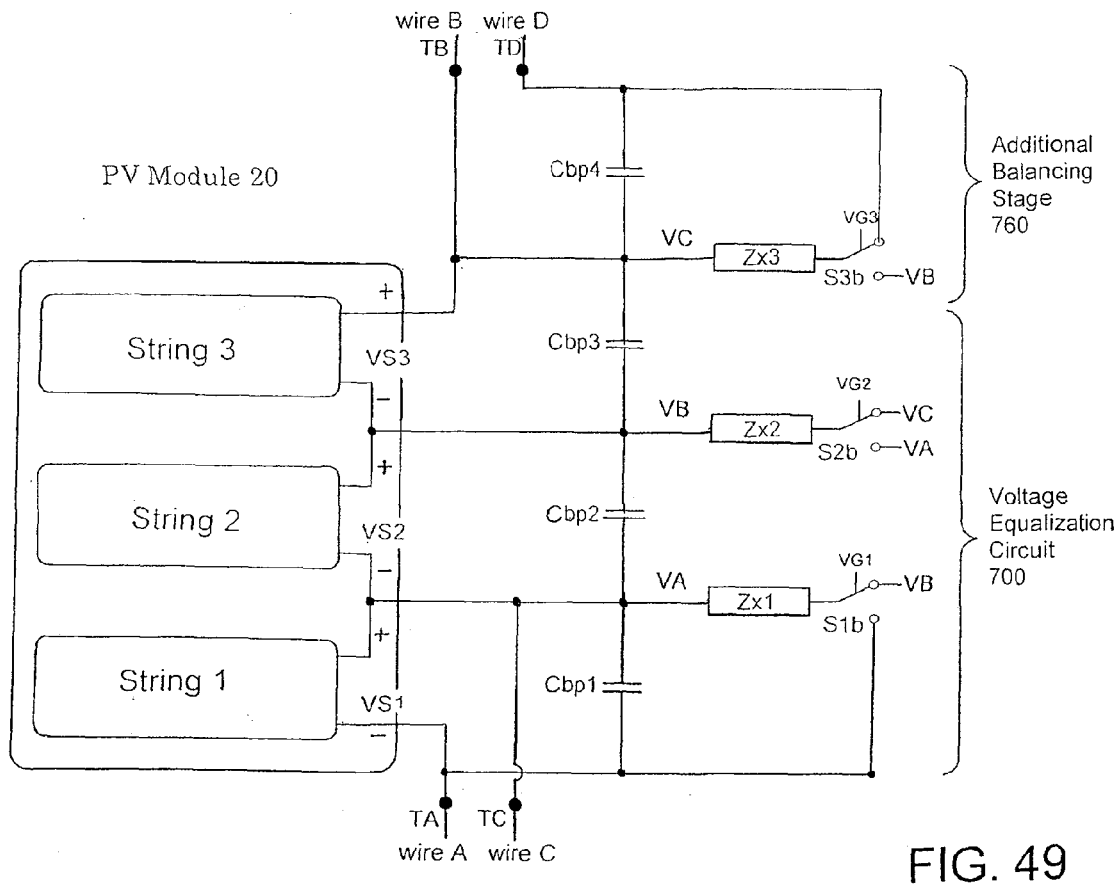
FIG. 49 shows a schematic diagram in which the voltage equalization circuit shown in FIG. 33 is extended by adding an additional balancing stage.

In order to extend the voltage equalization circuit 700 to additional PV modules 20, one or more strings of a PV module 20 may be balanced with one or more strings of an adjacent PV module 20. This extension of the voltage equalization circuit 700 may be achieved by adding the additional balancing stage 760 shown FIG. 49. This additional balancing stage includes an additional bypass capacitor Cbp4, an additional switch S3b, and an additional balancing or flying impedance Zx3. In FIG. 49, voltage nodes VA, VB, and VC are labeled for convenience in drawing the schematic. Voltage nodes having the same reference number, such as VA, are connected to each other via a wire that is omitted from the drawing for clarity.

As shown in FIG. 49, two additional terminals are used to provide positive and negative voltages of string 1 to the adjacent PV module 20. The terminals out of the package or junction box are the typical positive terminal TB and negative terminal TA of the PV module 20, along with a positive terminal TC of string 1 of the PV module 20, and a terminal TD to accept the positive voltage of string 1 of the adjacent PV module 20. Terminals TA and TC can be housed in the same connector out of the package or junction box. Similarly, terminals TB and TD can be housed in the same connector out of the package or junction box. Wires A-D pass through terminals TA-TD to connect to adjacent PV modules 20 or DC bus connectors. Wires B and D can be housed in the same insulator or sheath and can use a single connector at each package or junction box interface terminal. This helps to minimize the cost of wiring material and total number of connectors. Wires A and C can similarly be housed in the same sheath and use single connectors at each terminal. Alternatively, wires A and C can be mechanically connected in parallel to minimize the number of free wires in the system. Similarly, wires B and D can be mechanically connected in parallel to minimize the number of free wires in the system.

Figure 50:
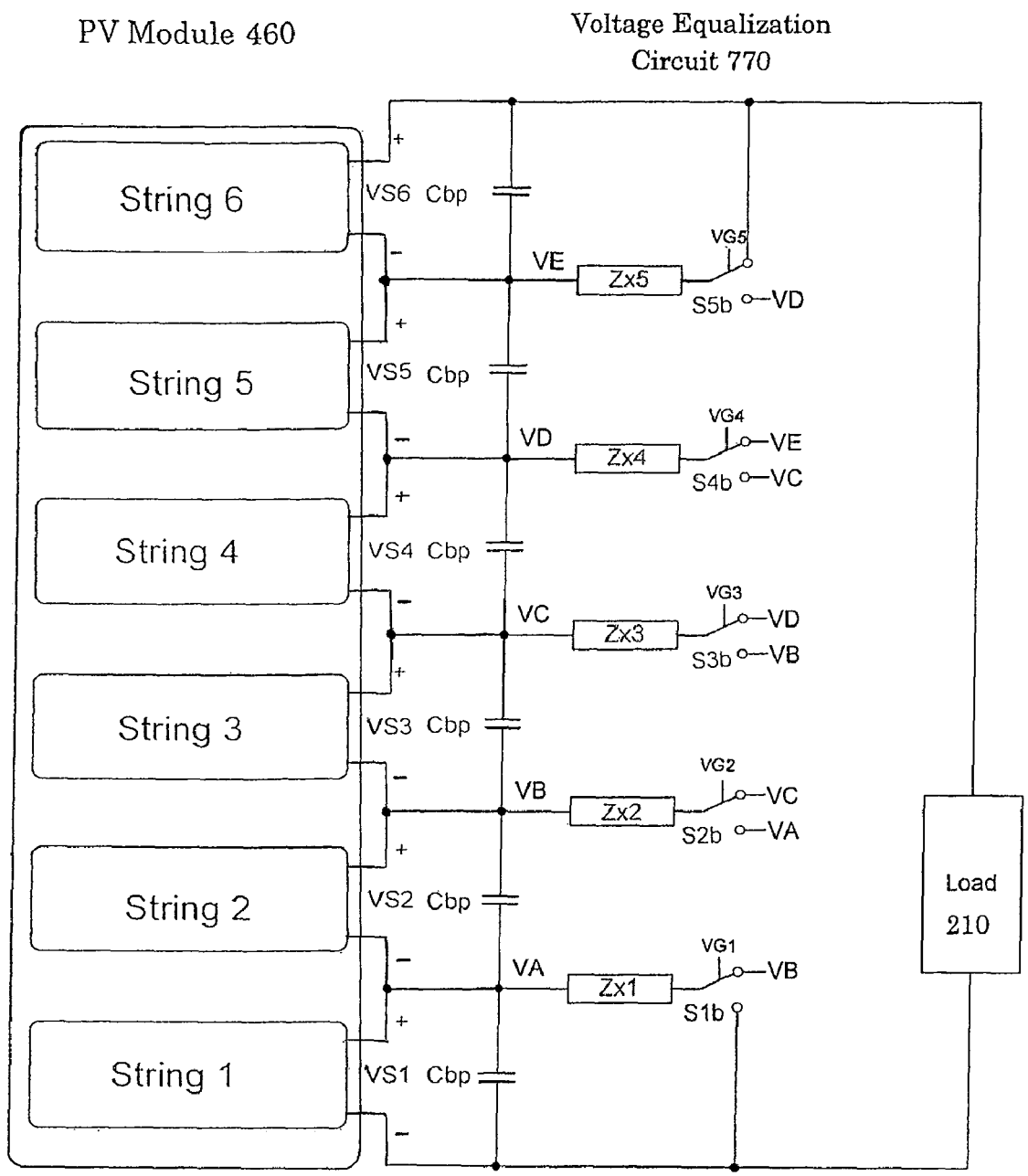
FIG. 50 shows a schematic diagram of a voltage equalization circuit used in conjunction with a PV module having six strings of PV cells according to an exemplary embodiment of the invention.

In other exemplary embodiments of the invention, voltages may be equalized for more or less than 3 strings in a PV module. The voltage equalization concept may extend to any number of strings having any number of PV cells. For example, FIG. 50 shows a voltage equalization circuit 770 in conjunction with a PV module 780 having 6 strings 1-6. For N strings there will be N+1 terminals accessible from the PV module (typically in the junction box connector). The circuit will require N−1 switches S1$b$-S(N−1)$b$ and N−1 energy storage devices Zx1-Zx(N−1). Similar to the embodiment shown in FIG. 33, the embodiment shown in FIG. 50 operates by forcing the string voltages VS1-VS6 to be substantially equal.

In the configuration shown in FIGS. 33, 36, and 43, the voltage equalization circuit can also operate the strings of PV cells at different voltages. With the criterion that the average voltage across the energy storage elements must be substantially zero, expressions relating duty cycle and string voltages are derived:

$$\text{average}(Vx1) = D1 \cdot VS2 - (1-D1) \cdot VS1 \quad (26)$$

$$\text{average}(Vx2) = D2 \cdot VS3 - (1-D2) \cdot VS2. \quad (27)$$

Here Vx1 and Vx2 are the average voltages across energy storage devices Zx1 and Zx2, respectively; D1 and D2 are the duty cycles of the switching waveforms controlling S1$b$ and S2$b$, respectively; and VS1, VS2, and VS3 are the voltages of String 1, String 2, and String 3, respectively. Assuming that average(Vx1)=0, and average(Vx2)=0, there is a relationship between the string voltages VS1-VS3 and the duty cycles D1 and D2:

$$\frac{VS1}{VS2} = \frac{D1}{1-D1} \quad (28)$$

$$\frac{VS2}{VS3} = \frac{D2}{1-D2}. \quad (29)$$

The above expressions indicate that the duty cycles D1 and D2 can modify the ratio of the voltages VS1-VS3 of the strings of cells. This may be useful if the optimum voltages VS1-VS3 for the strings of cells are different. The above expressions can also be solved for D1 and D2 to set the string voltages VS1-VS3 at desired levels:

$$D1 = \frac{VS1}{VS1 + VS2} \quad (30)$$

$$D2 = \frac{VS2}{VS2 + VS3}. \quad (31)$$

An example scenario in which the string voltages VS1-VS3 are different is if the strings have different numbers of PV cells, such as if String 1 has 15 series-connected PV cells and String 2 has 10 series connected PV cells. In this case, the MPV for String 1 may be 1.5 times higher than the MPV for String 2. The correct duty cycle in this case may be:

$$D1 = \frac{15}{15+10} = 0.6. \quad (32)$$

If the MPVs of all of the strings are known, it is possible to set the duty cycle in advance to force all strings to the appropriate voltages. For example if the MPVs for String 1, String 2, and String 3 are VMPV1, VMPV2, and VMPV3, the duty cycles can be set such that $$D1 = \frac{VMPV1}{VMPV1 + VMPV2} \quad (33)$$

$$D2 = \frac{VMPV2}{VMPV2 + VMPV3}. \quad (34)$$

As discussed previously, when strings of cells are mismatched due to shading, dust, debris, or other phenomena, the MPV can change slightly. While the change in VMPV is not as severe as the change in MPC, it may be effective to adjust the voltage across a mismatched string of cells. The voltage equalization circuits in FIGS. 33, 36, 43, 49, and 50 provide a mechanism to modulate the voltage by adjusting the duty cycle.

Figure 51:
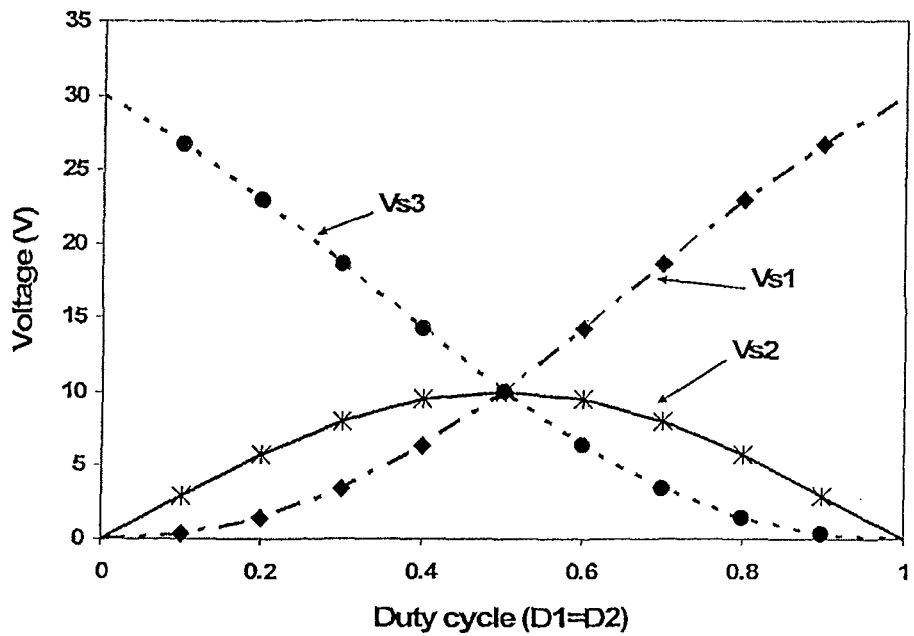
FIG. 51 shows simulated and calculated results for the string voltages of a representative PV module as functions of the duty cycle.

FIG. 51 shows simulated and theoretical results for the effect of changing D1 and D2 on string voltages VS1, VS2, and VS3. The cross-hatch datapoints are simulated results and the lines are theoretical results based on calculations. The x-axis plots the duty cycle. For simplicity and to show the full range of operation, D1 and D2 were set equal. In practice D1 and D2 can be adjusted independently to achieve any value for any of the string voltages VS1-VS3. Here, the total series connection of strings was constrained equal to 30V, such that when D1=D2=0.5, the string voltages VS1, VS2, and VS3 are each substantially equal to 10V. This is the same as the case presented in FIGS. 38 and 39. Across the range of duty cycle, the string voltages VS1-VS3 follow the relationships:

$$VS1 = \frac{D1 \cdot D2}{1 - D1 + D1 \cdot D2} VPV, \quad (35)$$

$$VS2 = \frac{(1-D1) \cdot D2}{1 - D1 + D1 \cdot D2} VPV, \text{ and} \quad (36)$$

-continued $$VS3 = \frac{(1-D1)\cdot(1-D2)}{1-D1+D1\cdot D2} VPV, \text{ where} \quad (37)$$

$$VPV = VS1 + VS2 + VS3. \quad (38)$$

The voltage VPV is the total voltage of the series configuration of strings, as could be controlled by a MPP tracking load.

Figure 52:
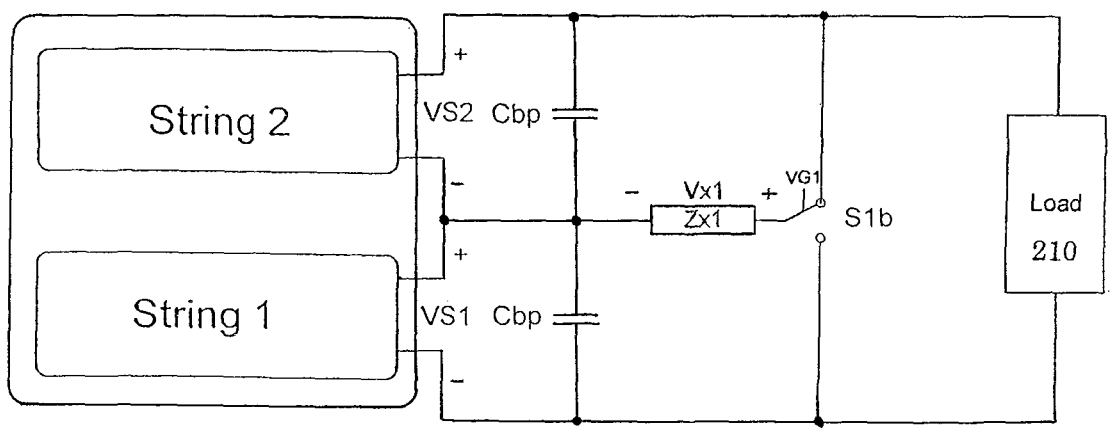
FIG. 52 shows a schematic diagram of a voltage equalization circuit used in conjunction with a PV module having two strings of PV cells according to an exemplary embodiment of the invention.

FIG. 52 shows a voltage equalization circuit 810 in conjunction with a PV module 800 having two strings 1 and 2 and a single energy storage element Zx1, according to an exemplary embodiment of the invention. Similar to the embodiment shown in FIG. 33, the embodiment shown in FIG. 52 operates by forcing the string voltages VS1 and VS2 to be substantially equal. In Phase 1, the energy storage element Zx1 is configured in parallel with string 1, and a voltage across the energy storage element Zx1 has a first polarity. In Phase 2, the energy storage element Zx1 is configured in parallel with string 2, and the voltage across the energy storage element Zx1 has a second polarity that is different from the first polarity. The switch S1b switches between Phase 1 and Phase 2 to equalize the string voltages VS1 and VS2.

Although not separately illustrated, the components of the voltage equalization circuits 700 and 750 can be configured in a similar manner as shown in FIGS. 17-19 and 27-29. Further, the above exemplary embodiments have been described as applying to PV power sources. However, other power sources within the scope of the invention may include fuel cells, batteries, and thermoelectric energy conversion devices, including thermoelectric diodes.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An apparatus for equalizing voltages across a plurality of photovoltaic units connected in series, the apparatus comprising:
a plurality of energy storage devices, wherein:
in a first configuration, each of the energy storage devices is configured to be connected in parallel with one of a first set of the photovoltaic units, and a voltage across a first one of the energy storage devices has a first polarity; and
in a second configuration, each of the energy storage devices is configured to be connected in parallel with one of a second set of the photovoltaic units, and the voltage across the first one of the energy storage devices has a second polarity that is different from the first polarity; and
a plurality of switches configured to switch between the first configuration and the second configuration, to equalize the voltages across the photovoltaic units.

2. The apparatus of claim 1, wherein:
in the first configuration, a voltage across a second one of the energy storage devices has a third polarity; and
in the second configuration, the voltage across the second one of the energy storage devices has a fourth polarity that is different from the third polarity.

3. The apparatus of claim 2, wherein the first polarity is the same as the third polarity.

4. The apparatus of claim 2, wherein the first polarity is different from the third polarity.

5. The apparatus of claim 1, further comprising a controller configured to output a drive signal to the switches at a switching frequency to control switching of the switches.

6. The apparatus of claim 5, wherein the controller controls a first percentage of time during which the energy storage devices are in the first configuration and a second percentage of time during which the energy storage devices are in the second configuration.

7. The apparatus of claim 6, wherein each of the first percentage of time and the second percentage of time is substantially 50% to force the voltages across the strings of photovoltaic cells substantially equal.

8. The apparatus of claim 6, wherein each of the first percentage of time and the second percentage of time is different from 50%.

9. The apparatus of claim 5, wherein each of the energy storage devices has an impedance that is relatively low at a low frequency and is relatively high at the switching frequency and harmonics of the switching frequency.

10. The apparatus of claim 1, wherein each of the energy storage devices comprises an inductor.

11. The apparatus of claim 1, wherein each of the energy storage devices comprises an inductor that is coupled electromagnetically to another inductor to reduce AC current in the inductors.

12. The apparatus of claim 1, wherein each of the energy storage devices has an impedance that is resonant at one or more frequencies.

13. The apparatus of claim 1, wherein each of the energy storage devices comprises an inductor and a capacitor that are connected in parallel.

14. The apparatus of claim 5, wherein the switching frequency or a harmonic of the switching frequency equals a resonant frequency of at least one of the energy storage devices.

15. The apparatus of claim 1, wherein each of the photovoltaic units comprises a photovoltaic cell.

16. The apparatus of claim 1, wherein each of the photovoltaic units comprises a string of photovoltaic cells that are connected in series.

17. The apparatus of claim 1, wherein each of the photovoltaic units comprises a module that includes at least one string of photovoltaic cells that are connected in series.

18. The apparatus of claim 1, further comprising:
a plurality of bypass energy storage devices, each of which is configured in parallel with one of the photovoltaic units.

19. The apparatus of claim 18, wherein the bypass energy storage devices are capacitors.

20. The apparatus of claim 1, wherein each of the switches comprises a single-pole, double-throw switch that includes at least one MOSFET.

21. The apparatus of claim 1, further comprising:
a power point tracking converter that identifies an aggregate maximum power point for the plurality of photovoltaic units;
wherein the voltages across the photovoltaic units are determined based on the aggregate maximum power point.

22. The apparatus of claim 21, wherein:
the power point tracking converter identifies an individual maximum power point for each of the plurality of photovoltaic units; and
the voltages across the photovoltaic units are determined based on the aggregate maximum power point and the individual maximum power points.

23. The apparatus of claim 21, wherein:
the power point tracking converter identifies the aggregate maximum power point for the plurality of photovoltaic units and another set of photovoltaic units that is connected in parallel with the plurality of photovoltaic units.

24. The apparatus of claim 1, further comprising:
a connecting circuit configured to provide a connection to an external apparatus, the connecting circuit comprising:
a connecting energy storage device; and
a connecting switch connected to the connecting energy storage device; wherein:
in the first configuration, the connecting energy storage device is configured to be connected in parallel with a photovoltaic unit of the external apparatus via the connecting switch, and
in the second configuration, the connecting energy storage device is configured to be connected in parallel with one of the photovoltaic units of the apparatus via the connecting switch.

25. The apparatus of claim 24, wherein the connecting circuit further comprises:
a connecting bypass energy storage device, which is configured to filter the voltage across the photovoltaic unit of the apparatus that is connected in parallel with the connecting energy storage device in the second configuration.

26. A multi-stage apparatus for equalizing voltages across a plurality of photovoltaic modules connected in series, wherein each of the photovoltaic modules comprises a plurality of photovoltaic units connected in series, the multi-stage apparatus comprising:
a plurality of apparatuses, each of which comprises:
a plurality of energy storage devices, wherein:
in a first configuration, each of the energy storage devices is configured to be connected in parallel with one of a first set of the photovoltaic units within one of the modules, and a voltage across a first one of the energy storage devices has a first polarity; and
in a second configuration, each of the energy storage devices is configured to be connected in parallel with one of a second set of the photovoltaic units within the one of the modules, and the voltage across the first one of the energy storage devices has a second polarity that is different from the first polarity;
a plurality of switches configured to switch between the first configuration and the second configuration; and
a connecting circuit configured to provide a connection between the apparatus and an adjacent apparatus among the plurality of apparatuses, the connecting circuit comprising:
a connecting energy storage device; and
a connecting switch connected to the connecting energy storage device; wherein:
in the first configuration, the connecting energy storage device is configured to be connected in parallel with a photovoltaic unit of the adjacent apparatus via the connecting switch, and
in the second configuration, the connecting energy storage device is configured to be connected in parallel with one of the photovoltaic units of the apparatus via the connecting switch; and
a plurality of connectors configured to connect each of the apparatuses to an adjacent one of the apparatuses;
wherein switching between the first configuration and the second configuration equalizes the voltages across the photovoltaic units of all of the photovoltaic modules.

27. A method of equalizing voltages across photovoltaic units connected in series, the method comprising:
in a first configuration, storing a first energy from the photovoltaic units in a plurality of energy storage devices, wherein each of the energy storage devices is connected in parallel with one of a first set of the photovoltaic units, and a voltage across a first one of the energy storage devices has a first polarity;
in a second configuration, storing a second energy from the photovoltaic units in the plurality of energy storage devices, wherein each of the energy storage devices is connected in parallel with one of a second set of the photovoltaic units, and the voltage across the first one of the energy storage devices has a second polarity that is different from the first polarity; and
switching between the first configuration and the second configuration until the voltages across the photovoltaic units are substantially equal.

28. The method of claim 27, wherein a frequency of the switching between the first configuration and the second configuration equals a resonant frequency of the energy storage devices.

29. The method of claim 27, further comprising:
after the switching between the first configuration and the second configuration, sending an energy equal to a difference between the first energy and the second energy to a plurality of bypass energy storage devices.

30. The method of claim 27, further comprising:
identifying an aggregate maximum power point for the plurality of photovoltaic units; and
determining the voltages across the photovoltaic units based on the aggregate maximum power point.

31. The method of claim 30, further comprising:
identifying an individual maximum power point for each of the plurality of photovoltaic units;
wherein the voltages across the photovoltaic units are determined based on the aggregate maximum power point and the individual maximum power points.

32. The method of claim 30, wherein the aggregate maximum power point is identified for the plurality of photovoltaic units and another set of photovoltaic units that is connected in parallel with the plurality of photovoltaic units.

33. An apparatus for equalizing voltages across a plurality of photovoltaic units connected in series, the apparatus comprising:
a plurality of energy storage devices, wherein:
in a first configuration, a first energy storage device is configured to be connected in parallel with a first photovoltaic unit, a second energy storage device is configured to be connected in parallel with a second photovoltaic unit, a voltage across the first energy storage device has a first polarity, and a voltage across the second energy storage device has a second polarity; and
in a second configuration, the first energy storage device is configured to be connected in parallel with the second photovoltaic unit, the second energy storage device is configured to be connected in parallel with a third photovoltaic unit, the voltage across the first energy storage device has a third polarity that is different from the first polarity, and the voltage across the second energy storage device has a fourth polarity that is different from the second polarity; and a plurality of switches configured to switch between the first configuration and the second configuration, to equalize the voltages across the photovoltaic units.

34. An apparatus for equalizing voltages across a plurality of photovoltaic units connected in series, the apparatus comprising:
a plurality of energy storage devices, wherein:
in a first configuration, each of the energy storage devices is configured to be connected in parallel with one of a first set of the photovoltaic units; and
in a second configuration, each of the energy storage devices is configured to be connected in parallel with one of a second set of the photovoltaic units; and
a plurality of switches configured to switch between the first configuration and the second configuration, to equalize the voltages across the photovoltaic units;
wherein a respective current flowing through each respective energy storage device in the first configuration flows in an opposite direction from a respective current flowing through the respective energy storage device in the second configuration.

35. An apparatus for equalizing voltages across a plurality of photovoltaic units connected in series, the apparatus comprising:
a plurality of energy storage devices, wherein:
in a first configuration, each of the energy storage devices is configured to be connected in parallel with one of a first set of the photovoltaic units, and a respective current flows through each of the respective energy storage devices; and
in a second configuration, each of the energy storage devices is configured to be connected in parallel with one of a second set of the photovoltaic units, and a respective current flows through each of the respective energy storage devices in a direction opposite to a direction of the respective current in the first configuration; and
a plurality of switches configured to switch between the first configuration and the second configuration, to equalize the voltages across the photovoltaic units.

36. An apparatus for equalizing voltages across a plurality of photovoltaic units connected in series, the apparatus comprising:
an energy storage device, wherein:
in a first configuration, the energy storage device is configured to be connected in parallel with one of the photovoltaic units, and a voltage across the energy storage device has a first polarity; and
in a second configuration, the energy storage device is configured to be connected in parallel with another one of the photovoltaic units, and the voltage across the energy storage device has a second polarity that is different from the first polarity; and
a switch configured to switch between the first configuration and the second configuration, to equalize the voltages across the photovoltaic units.

* * * * *